United States Patent [19]
Fukiage et al.

[11] Patent Number: 5,764,584
[45] Date of Patent: Jun. 9, 1998

[54] MULTI-BANK SYNCHRONOUS SEMICONDUCTOR MEMORY DEVICE

[75] Inventors: Takahiko Fukiage; Mikio Sakurai; Yasuhiro Konishi, all of Hyogo, Japan

[73] Assignee: Mitsubishi Denki Kabushiki Kaisha, Tokyo, Japan

[21] Appl. No.: 900,650

[22] Filed: Jul. 25, 1997

[30]    Foreign Application Priority Data

Dec. 26, 1996   [JP]   Japan ..................... 8-347663

[51] Int. Cl.$^6$ ................... G11C 8/00; G11C 7/00
[52] U.S. Cl. ............... 365/230.03; 365/230.06; 365/230.08; 365/233; 365/189.08
[58] Field of Search ............ 365/230.03, 230.06, 365/230.08, 233, 189.05, 189.08

[56]    References Cited

U.S. PATENT DOCUMENTS 5,471,430  11/1995  Sawada et al. ............. 365/230.03
5,592,434  1/1997   Iwamoto et al. ............. 365/233

FOREIGN PATENT DOCUMENTS 4-221495   8/1992   Japan.
7-307090   11/1995  Japan.

*Primary Examiner*—David C. Nelms
*Assistant Examiner*—Trong Phan
*Attorney, Agent, or Firm*—McDermott, Will & Emery

[57]    ABSTRACT

A read register and a data transfer circuit are provided to implement two separate data transfer paths with respect to a preamplifier, for alternately transferring data through these two paths. Thus, the data can be transferred with no data collision in each clock cycle. The data are transferred at a high speed every clock cycle regardless of the bank number and the CAS latency in a multi-bank synchronous memory device.

17 Claims, 29 Drawing Sheets

FIG. 10
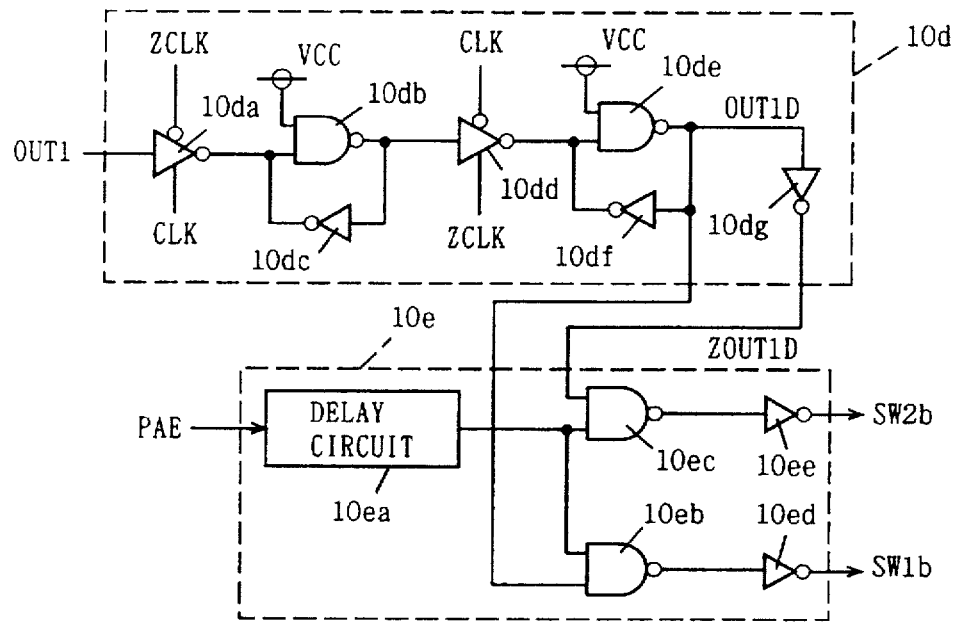
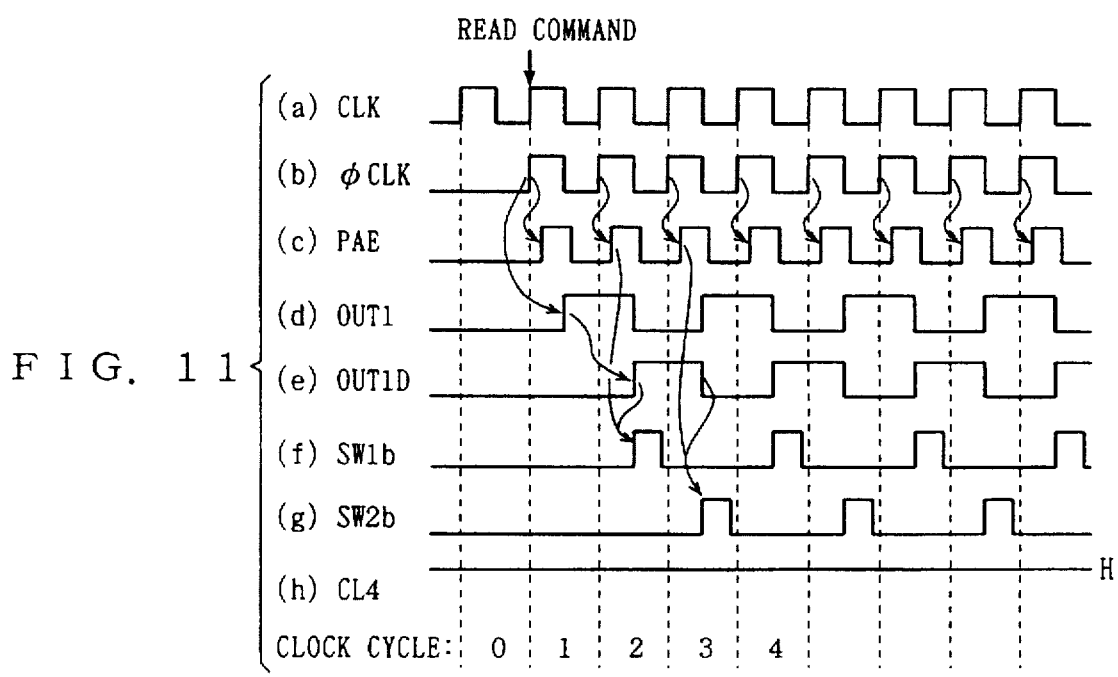
FIG. 11

MULTI-BANK SYNCHRONOUS SEMICONDUCTOR MEMORY DEVICE

BACKGROUND OF THE INVENTION

1. Field of the Invention

The present invention relates to a semiconductor memory device, and more particularly, it relates to a semiconductor memory device transferring and outputting internal read data in synchronization with a clock signal. More specifically, the present invention relates to a multi-bank synchronous semiconductor memory device having a plurality of banks and incorporating external signals and inputting/outputting data in synchronization with a clock signal.

2. Description of the Background Art

In order to transfer data in accordance with the operating speed of a processor such as a high-speed microprocessor, a clock synchronous semiconductor memory device is employed for incorporating external signals including control and address signals and inputting/outputting data in synchronization with a clock signal which is a system clock, for example.

FIG. 47 is a timing chart representing data read and write operations of a conventional clock synchronous semiconductor memory device (hereinafter referred to as an SDRAM). With reference to FIG. 47, the data read/write operation of the SDRAM is now described.

An operation mode of the SDRAM is specified by a combination (command) of states of a plurality of external control signals.

When a row address strobe signal /RAS is at a low level and a column address strobe signal /CAS and a write enable signal /WE are at high levels on the leading edge of a clock signal CLK in a clock cycle 1, an active command is supplied to start a memory cell selecting operation (row selecting operation). When this active command is supplied, an address signal ADD supplied at the same time is incorporated as a row address signal Xa, and a row is selected in the interior in accordance with this row address signal Xa.

When the row address strobe signal /RAS and the write enable signal /WE are set at high levels and the column address strobe signal /CAS is set at a low level on the leading edge of the clock signal CLK in a clock cycle 3, a read command is supplied to instruct data reading. When this read command is supplied, an address signal ADD supplied at the same time is incorporated as a column address signal Yb, and a column is selected in accordance with this column signal Yb for reading data of the selected column.

Read data Q of this memory cell is outputted at an intermediate point of time of a clock cycle 5, and first read data b0 is brought into a definite state on the leading edge of the clock signal CLK in a clock cycle 6, and sampled by an external device. Thereafter data b1 to b7 are successively brought into definite states on respective leading edges of the clock signal CLK up to the leading edge in a clock cycle 13. The number of data, a (b0 to b7), continuously read by a single access instruction (read command) is referred to as a burst length. FIG. 47 shows a data read operation for a burst length of 8. The number of clock cycles between supply of a read command and output of valid data is referred to as a CAS latency. This CAS latency is a time necessary for selecting a memory cell column in the interior and outputting the data of the selected memory cell through an output buffer. Referring to FIG. 47, the CAS latency is 3.

In the timing chart shown in FIG. 47, a chip select signal /CS for bringing the SDRAM into a selected state is maintained in an active state of a low level.

The data write operation is now described. When an active command is supplied on the leading edge of the clock signal CLK in a clock cycle 16, a currently supplied address signal Xc is regarded as a row address signal for selecting a row. When the row address strobe signal /RAS is set at a high level and the column address strobe signal /CAS and the write enable signal /WE are set at low levels on the leading edge of the clock signal CLK in a clock cycle 18, a write command is supplied and data writing is instructed.

When this write command is supplied, a column selecting operation is performed in accordance with a currently supplied address signal Yd. Data d0 supplied on the leading edge of the clock signal CLK in this clock cycle 18 is incorporated into the SDRAM. Thereafter data d1 to d7 are incorporated into the SDRAM in synchronization with respective leading edges of the clock signal CLK in clock cycles 19 to 25. The data d0 to d7 incorporated into the SDRAM are written in the internal selected columns (memory cells) in a prescribed sequence.

Also in the data write operation, eight data d0 to d7 can be continuously written as write data D by supplying a single write command. Referring to FIG. 47, data, c, are written by a single write command.

In the write operation waveforms shown in FIG. 47, the write enable signal /WE may not be kept at a low level during the write period for the data d0 to d7, but may be supplied as a one-shot pulse which is maintained at a low level on the leading edge of the clock signal CLK in the clock cycle 18, similarly to the column address strobe signal /CAS.

Address and control signals are incorporated into the SDRAM in synchronization with the clock signal CLK, whereby the internal operation timing needs not be decided in consideration of margins for skews of these signals. Therefore, the internal operation can be started in response to a command at a faster timing, thereby allowing high-speed access. Further, data can be outputted in synchronization with the clock signal CLK after a lapse of clock cycles defined by the CAS latency from supply of a read command, and data can be written in synchronization with the clock signal CLK in data writing. Thus, the data input/output speed is decided by the clock signal CLK, whereby the data can be inputted/outputted at a high speed.

FIG. 48 schematically illustrates the structure of a data read part of the SDRAM. This figure representatively shows an even numbered bit line pair BLPe and an odd numbered bit line pair BLPo. A sense amplifier SAe is provided to the bit line pair BLPe for differentially amplifying and latching the potential difference of the bit line pair BLPe in activation thereof, while a sense amplifier SAo is provided to the bit line pair BLPo for differentially amplifying and latching the potential difference (memory cell data) of the bit line pair BLPo in activation thereof. Further, column selector gates IGe and IGo which conduct in response to a column selection signal CSL from a column decoder CD for connecting the sense amplifiers SAe and SAo to an internal data bus (not clearly shown) are provided for the sense amplifiers SAe and SAo respectively. Latch data of the sense amplifier SAe selected by the column select gate IGe is supplied to a preamplifier PAe. Latch data of the sense amplifier SAo selected by the column select gate IGo is supplied to a preamplifier PAo.

The data read part of the SDRAM includes a selector SEL for latching and selectively, successively transmitting the data of the preamplifiers PAe and PAo, a latch L2 for latching the data transferred from the selector SEL, and a transfer gate XF for transmitting the latch data of the latch L2 to an output circuit ODC in response to a clock signal φa.

The selector SEL includes two stages of latches Lf and Lb for transmitting the latch data in accordance with clock signals φa and /φb, a transfer gate TG1 which conducts in response to activation of a selection signal /φe for storing the output data of the preamplifier PAe in the latch Lf, a transfer gate TG2 which conducts in response to activation (high level) of a selection signal /φe for storing the output data of the preamplifier PAe in the latch Lb, a transfer gate TG3 which conducts in activation of the selection signal /φe for storing the output data of the preamplifier PAo in the latch Lf, a transfer gate TG4 which conducts in activation of the selection signal φe for storing the output data of the preamplifier PAo in the latch Lb, a transfer gate TG5 for transmitting the latch data of the latch Lf to the latch L2 in response to the clock signal φb, and a transfer gate TG6 for transmitting the latch data of the latch Lb to the latch Lf in response to the clock signal /φb.

The selection signal φe is activated when data outputted first is memory cell data of the even bit line pair BLPe in the simultaneously selected bit line pairs BLPe and BLPo. If the odd bit line pair BLPo is first designated the selection signal /φe is brought into a high level of an active state.

The output circuit ODC includes a latch LO for latching the data supplied through the transfer gate XF, and an output buffer OB for buffering the data supplied from the latch LO for outputting as output data DQ. The data read operation of the SDRAM shown in FIG. 48 is now described with reference to a timing chart shown in FIG. 49.

A read command is supplied in a clock cycle 0 of the clock signal CLK shown at (a) in FIG. 49. In a cycle preceding this clock cycle 0, an active command is already supplied and the sense amplifiers SAe and SAo are in active states, for detecting, amplifying and latching memory cell data (not shown). In accordance with the read command, the column decoder CD is activated for performing a column selecting operation, the column selection signal CSL is activated, the column select gates IGe and IGo conduct, and the latch data of the sense amplifiers SAe and SAo are supplied to the preamplifiers PAe and PAo respectively. Then, the preamplifiers PAe and PAo are activated in accordance with the read command, and the output data thereof are brought into definite states of D0 and D1 respectively as shown at (b) and (c) in FIG. 49 respectively. The preamplifiers PAe and PAo are provided therein with latch circuits, and latch the amplified data D0 and D1 respectively.

Then, the state of the selection signal φe is ascertained in a clock cycle 1, and the output data of the preamplifiers PAe and PAo are latched by the latches Lf and Lb of the selector SEL respectively. FIG. 49 shows such an operation sequence that the selection signal φe is activated and the latches Lf and Lb latch the output data of the preamplifiers PAe and PAo respectively (see (d) and (e) in FIG. 49).

In a clock cycle 2, a read command is supplied again, a column selecting operation is performed, and then the preamplifiers PAe and PAo each are activated to amplify memory cell data on another column (see (b) and (c) in FIG. 49). In this clock cycle 2, the clock signal φb goes high, and the data stored in the latches Lf and Lb are transferred to the latches L2 and Lf respectively. As shown at (d) in FIG. 49, the latch data of the latch Lf is changed to the data D1, and the latch L2 stores the data D0.

In a clock cycle 3, the clock signal φa goes high, the transfer gate XF conducts, and the data latched by the latch L2 is supplied to the output circuit ODC, to be latched by the latch LO. The data latched by the latch LO of the output circuit ODC is outputted as the output data DQ through the output buffer OB (see (h) in FIG. 49).

In a clock cycle 4, output data D2 and D3 of the preamplifiers PAe and PAo are stored in the latches Lf and Lb respectively. In the clock cycle 3, the data D1 stored in the latch Lf in accordance with the clock signal φb is stored in the latch L2. Therefore, the untransferred data D1 is prevented from being destructed by the data D2 newly stored in the latch Lf.

In the clock cycle 4, the data D2 latched by the latch Lf is transferred to and latched by the latch L2 again. This operation is thereafter so repeated that the data D2 and D3 are successively supplied to the latch L2 every clock cycle and the latch data of the latch 2 are then supplied to the output circuit ODC through the transfer gate XF. Thus, the data D1, D2 and D3 which are brought into definite states on the leading edge of the clock signal CLK are successively outputted.

As shown in the timing chart of FIG. 49, the data read part of the SDRAM can be divided into three pipeline stages I to III. Referring to FIG. 48, the pipeline stage I is between output nodes of the sense amplifiers SAe and SAo and the selector SEL (excluding the transfer gate TG5). The pipeline stage II is formed by the transfer gate TG5 and the latch L2. The pipeline stage III is formed by the transfer gate XF and the output circuit ODC. In data reading, an operation of amplifying data latched by either sense amplifier by either preamplifier for transference to an internal read data bus takes time most. When the selector SEL is employed for simultaneously latching two bits and the latched 2-bit data are successively transferred in accordance with the clock signal CLK, two clock cycles can be allocated to the operation up to the latching of the output data of the preamplifier. Therefore, the data can be transferred with sufficient time margin even if the clock signal CLK is at a high speed. In other words, the data can be outputted at a high speed.

FIG. 50 schematically illustrates the structure of the data read part of the SDRAM. The even bit line pair BLPe is arranged on an even memory array EMA, while the odd bit line pair BLPo is arranged on an odd memory array OMA. Row and column decoders are arranged for the even and odd memory arrays EMA and OMA respectively. In the structure of the SDRAM shown in FIG. 50, memory cell data of two bits in total, one from each of the even and odd memory arrays EMA and OMA, are read and amplified by the preamplifiers PAe and PAo, and thereafter successively transferred bit by bit by the selector SEL, and then the data are outputted through the latch L2 and the output circuit ODC.

The even and odd memory arrays EMA and OMA are different memory arrays, and hence peripheral circuits (including the row and column decoders) are provided for the even and odd memory arrays EMA and OMA independently of each other. Consider a case where the even and odd memory arrays EMA and OMA are utilized as banks. In other words, consider a case where the even and odd memory arrays EMA and OMA are driven into active/inactive states independently of each other. When the even and odd memory arrays EMA and OMA are employed as banks, the odd memory array OMA can be selected to maintain a word line in a selected state while a memory cell of the even memory array EMA is accessed. Therefore, high-speed access can be made by alternately accessing the even and odd memory arrays EMA and OMA due to no requirement for the so-called RAS precharge time. When the even and odd memory arrays EMA and OMA are employed as banks, however, the following problem arises.

FIG. 51 is a timing chart showing a data read operation sequence in a case of utilizing the even and odd memory arrays EMA and OMA shown in FIG. 50 as banks. This figure shows an operation sequence in access to the even memory array EMA, as an example.

The even and odd memory arrays EMA and OMA are banks respectively. Therefore, a memory cell must be selected from the even memory array EMA and its data is amplified by the preamplifier PAe every clock cycle. Referring to FIG. 51, a read command is supplied in a clock cycle 0, the bank of the even memory array EMA is specified, and the preamplifier PAe is activated. Data (see (b) in FIG. 51) of the preamplifier PAe is latched by the preamplifier PAe. In a clock cycle 1, the latch data of the preamplifier PAe is supplied to the latch Lf included in the selector SEL ((c) in FIG. 51). Only a single array is employed at this time, and hence the state of the selection signal φe is decided in accordance with a bank specifying signal in the selector SEL. Namely, the latch Lf latches memory cell data in accordance with the selection signal φe shown at (f) in FIG. 51 in the cLock cycle 1. The data latched by the latch Lf in the selector SEL is transferred to the latch L2.

In the clock cycle 1, the preamplifier PAe performs a data amplifying operation, so that the output data of the preamplifier PAe is changed to the data D1, as shown at (b) in FIG. 51. This data D1 is transferred to the latch Lf included in the selector SEL in a clock cycle 2. The data D1 is transferred to the latch Lf in synchronization with the data D0 transferred from the latch Lf to the latch L2. Thus, there is a possibility that the data D0 is replaced with the data D1 before transfer thereof and the data D1 is transferred to the latch L2. In order to prevent such collision of the data, it can be considered that the transfer clock signal φb may be advanced by half the clock cycle of the clock signal CLK so that the transfer clock signal φb is out of phase by 180° with the selection signal φe. Also in this case, however, the following problem arises.

FIG. 52 is a timing chart representing operations in case of driving the transfer clock signal φb 180° out of phase with the selection signal φe. In the timing chart shown in FIG. 52, the clock signal φb is brought into a high level earlier than that shown in FIG. 51 by half the clock cycle. Therefore, the latch L2 latches the data D0 in a clock cycle 2, and the latch L2 latches the data D1 in a clock cycle 3. Thus, no collision of the data is caused in the latch L2. If the CAS latency is 4, however, the latch L2 transfers the data to the output circuit ODC in the clock cycle 3. Therefore, the data D0 stored in the latch L2 is replaced with the data D1 before data D0 is transferred to the output circuit ODC, and cannot be outputted.

Namely, the data cannot be correctly read in the CAS latency is 4.

SUMMARY OF THE INVENTION

An object of the present invention is to provide a semiconductor memory device which can correctly transfer data at a high speed even in a bank structure having an arbitrary number of banks.

Another object of the present invention is to provide a synchronous semiconductor memory device including an internal read circuit which correctly transfers data in a pipelining manner at a high speed even in a bank structure including one or more banks.

The semiconductor memory device according to the present invention includes a plurality of banks, each having a plurality of memory cells and being driven to active/inactive states independently of others, a plurality of preamplifiers provided in correspondence to the plurality of banks respectively each for amplifying data of a selected memory cell of a corresponding bank when activated, a plurality of read registers provided in correspondence to the plurality of preamplifiers respectively, each having a plurality of latches provided in parallel for successively latching output data of the corresponding preamplifier in response to activation of the corresponding preamplifier for holding the data outputted from the corresponding preamplifier, a plurality of transfer circuits provided in correspondence to the plurality of read registers respectively for successively selecting and transferring the data latched by the corresponding read registers in response to activation of the corresponding preamplifiers respectively, and output circuitry for selecting data transferred by a transfer circuit provided in correspondence to a bank specified by a bank specifying signal among the plurality of transfer circuitry in response to the bank specifying signal for outputting to an exterior of the device.

The plurality of latches are provided in correspondence to the preamplifier of each bank so that the output data of the corresponding preamplifier are successively transferred to and latched by the plurality of latches and then successively transferred, whereby no data collision is caused even if the preamplifier is activated in respective clock cycles and the data are outputted from the preamplifier, and the data can be correctly transferred in a pipelining manner.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 10 illustrates exemplary structures of a one-clock shift circuit and the control signal generator circuit shown in FIG. 3;

FIG. 11 is a timing chart representing operations of the circuits shown in FIG. 10;

DESCRIPTION OF THE PREFERRED EMBODIMENTS

[Embodiment 1]

Figure 1:
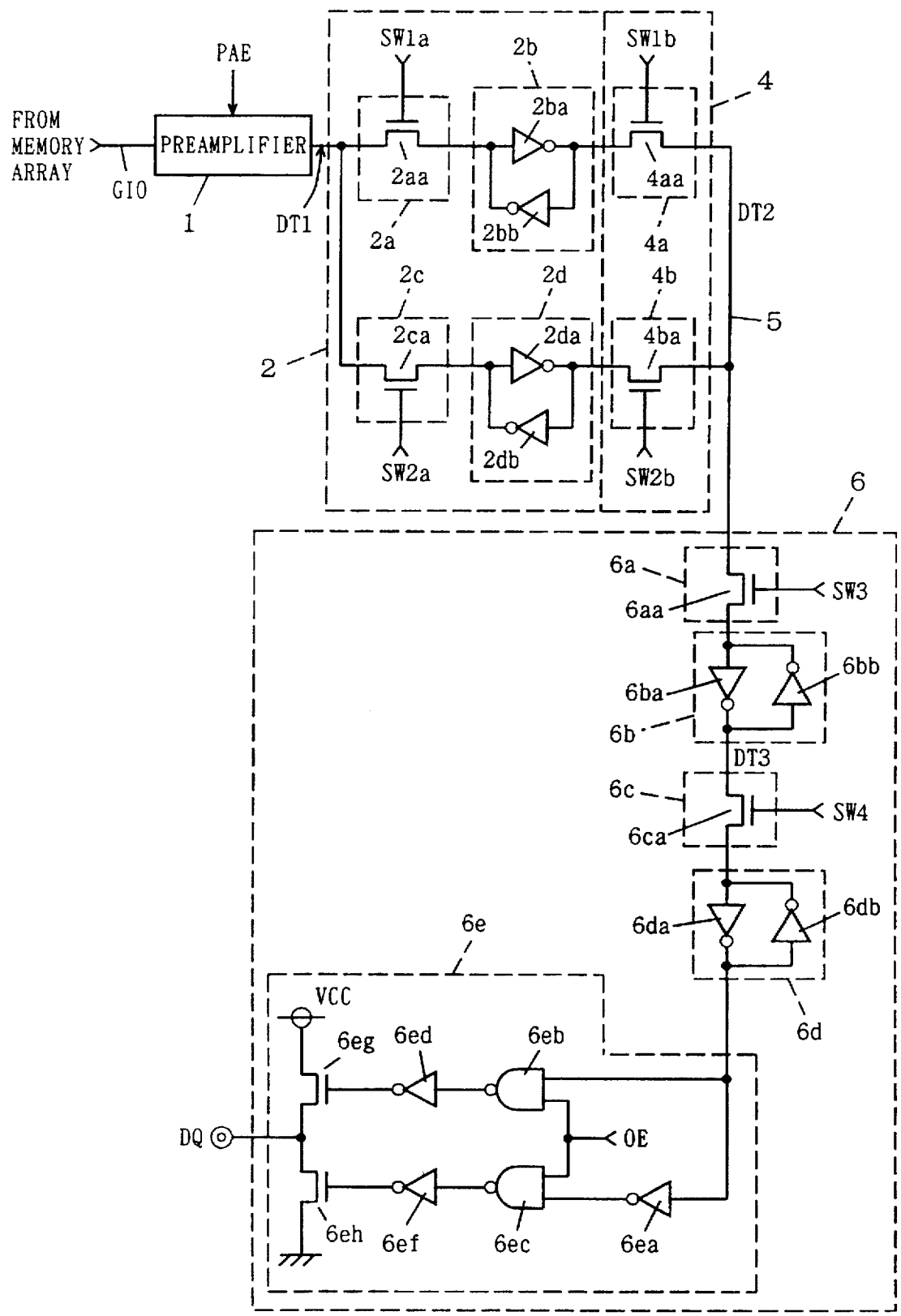
FIG. 1 illustrates the structure of a principal part of an SDRAM according to an embodiment 1 of the present invention.

FIG. 1 schematically illustrates the structure of a principal part of an SDRAM according to an embodiment 1 of the present invention. This FIG. 1 representatively shows a data read path with respect to a single memory array (bank). Referring to FIG. 1, the SDRAM includes a preamplifier 1 for amplifying selected memory cell data supplied from the memory array through an internal data bus GIO in response to activation of a preamplifier enable signal PAE, a read register part 2 for successively storing data DT1 supplied from the preamplifier 1 in a plurality of latches included therein, a data transfer part 4 for successively selecting and transferring the data stored in the read register part 2, and a data output part 6 for successively incorporating data DT2 transferred from the data transfer part 4 in accordance with an array (bank) specifying signal for outputting as external read data DQ.

The read register part 2 includes a transfer gate 2a for transferring the data DT1 from the preamplifier 1 in response to a transfer control signal SW1a, a latch circuit 2b for latching the data supplied from the transfer gate 2a, a transfer gate 2c provided in parallel with the transfer gate 2a for transferring the data DT1 from the preamplifier 1 in response to a transfer control signal SW2a, and a latch circuit 2d for latching the data transferred from the transfer gate 2c. The transfer gate 2a is formed, for example, by an n-channel MOS transistor 2aa receiving the transfer control signal SW1a at its, gate.

The latch circuit 2b includes a CMOS inverter 2ba for inverting the data supplied from the transfer gate 2a, and a CMOS inverter 2bb for inverting an output of the invertor 2ba for transmission to an input part of the inverter 2ba. The transfer gate 2c is formed, for example, by an n-channel MOS transistor 2ca receiving the transfer control signal SW2a at its gate. The latch circuit 2d includes a CMOS inverter 2da for inverting the data transferred from the transfer gate 2c, and a CMOS inverter 2db for inverting output data of the inverter 2da for transmission to an input of the inverter 2da.

The data transfer part 4 includes a transfer gate 4a for transmitting the latch data of the latch circuit 2b onto an internal data bus 5 in response to a transfer control signal SW1b, and a transfer gate 4b for transferring the latch data of the latch circuit 2d onto the internal data bus 5 in response to a transfer control signal SW2b. The transfer gate 4a includes an n-channel MOS transistor 4aa receiving the transfer control signal SW1b at its gate, and the transfer gate 4b includes an n-channel MOS transistor 4bb receiving the transfer control signal SW2b at its gate, as an example.

The data output part 6 includes a transfer gate 6a for transferring the data DT2 on the internal data bus 5 transferred from the data transfer part 4 to an internal read data bus in accordance with a transfer control signal SW3 including array specifying information, a latch circuit 6b for latching the data transferred from the transfer gate 6a, a transfer gate 6c for transferring the data latched by the latch circuit 6b in response to a transfer control signal SW4, a latch circuit 6d for latching the data transferred from the transfer gate 6c, and an output buffer 6e for buffering the data latched by the latch circuit 6d for outputting as the output data DQ in response to activation of an output enable signal OE.

The transfer gate 6a includes an n-channel MOS transistor 6aa receiving the transfer control signal SW3 at its gate, as an example. The latch circuit 6b includes a CMOS inverter 6ba for inverting the data transferred from the transfer gate 6a, and a CMOS inverter 6bb for inverting output data of the CMOS inverter 6ba for transmission to an input part of the inverter 6ba. The transfer gate 6c includes an n-channel MOS transistor 6ca receiving the transfer control signal SW4 at its gate, as an example. The latch circuit 6d includes a CMOS inverter 6da for inverting the transfer gate from the transfer gate 6c, and a CMOS inverter 6db for inverting output data of the inverter 6da for transmission to an input part of the inverter 6da.

The output buffer 6e includes a CMOS inverter 6ea for inverting the data from the latch circuit 6d, a NAND circuit 6eb receiving the data from the latch circuit 6d and the output enable signal OE, a NAND circuit 6ec for receiving output data of the inverter 6ea and the output enable signal OE, a CMOS inverter 6ed for inverting an output signal of the NAND circuit 6eb, a CMOS inverter 6ef for inverting an output signal of the NAND circuit 6ec, an n-channel MOS transistor 6eg which conducts, when an output signal of the inverter 6ed is at a high level, for transmitting a signal of a power source voltage VCC Level to an output node (data DQ output terminal), and an n-channel MOS transistor 6eh which conducts, when an output signal of the inverter 6ef is at a high level, for discharging the data output node to the ground voltage level.

Figure 2:
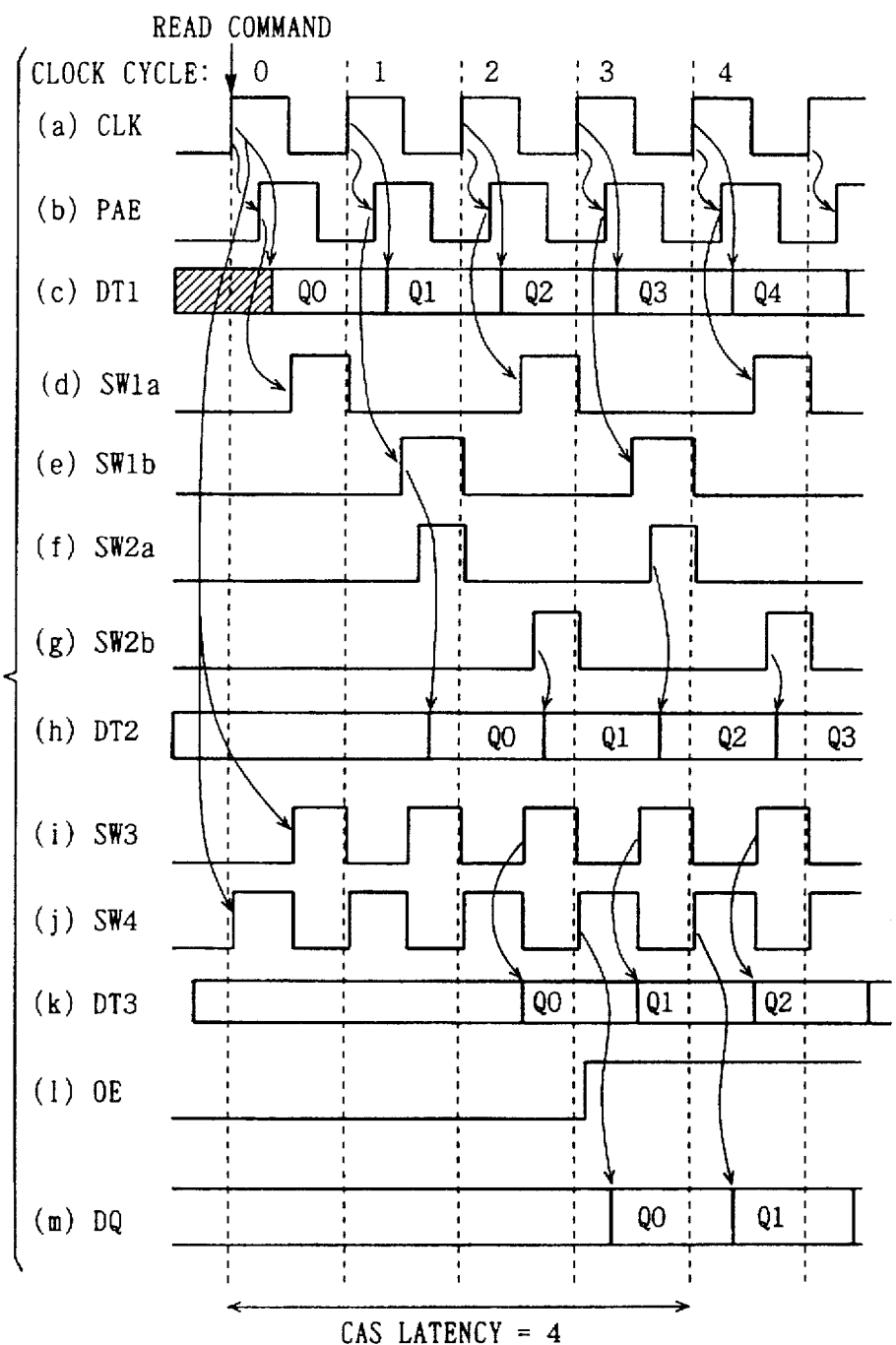
FIG. 2 is a timing chart representing operations of a data read part shown in FIG. 1.

The inverter 6ed has a level conversion function (not clearly shown in FIG. 1) so that a signal of a higher voltage level than the power source voltage VCC is supplied to a gate of the MOS transistor 6eg, whereby the MOS transistor 6eg can transmit the signal of the power source voltage VCC level to the output node. The transfer control signals SW3 and SW4 are two phase non-overlapping signals. The transfer control signals SW1a and SW1b are also tow phase non-overlapping signals. Further, the transfer control signals SW2a and SW2b are also two phase non-overlapping signals. The transfer control signals SW1a and SW2a are alternately activated, while the transfer control signals SW1b and SW2b are alternately activated. Operations of a data read part of the SDRAM shown in FIG. 1 are now described with reference to an operation timing chart shown in FIG. 2.

In advance of a clock cycle 0, an active command is supplied, the array is in a selected state, and memory cell data is latched by a sense amplifier.

A read command instructing data reading is supplied in the clock cycle 0. In accordance with this read command, the preamplifier enable signal PAE is brought into an active state of a high level in response to a clock signal CLK for a prescribed period, as shown at (b) in FIG. 2. In response to this activation of the preamplifier enable signal PAE, the preamplifier 1 amplifies the memory cell data read on the internal data bus line GIO. In response to this amplifying operation of the preamplifier 1 (in response to the activation of the preamplifier enable signal PAE), the transfer control signal SW1a shown at (d) in FIG. 2 goes high, the transfer gate 2a transfers the data DT1 (QO) from the preamplifier 1, and the latch circuit 2b latches this data DT1 (Q0).

In a clock cycle 1, the preamplifier enable signal PAE is activated again in response to the clock signal CLK. The preamplifier 1 performs an amplifying operation and provides data Q1 as the output data DT1. In this clock cycle 1, the transfer control signal SW2a is activated in response to the activation of the preamplifier enable signal PAE, the transfer gate 2c conducts, and the latch circuit 2d latches the data Q1 from the preamplifier 1. At this time, the transfer control signal SW1b goes high, the transfer gate 4a conducts, and the data Q0 latched by the latch circuit 2b is transmitted onto the internal data bus 5, as shown at (b) in FIG. 2. In this activation (high level) of the transfer control signal SW1b, the transfer control signal SW2b is in an inactive state (low level). Therefore, no collision is caused between the latch data of the latch circuit 2b and the newly incorporated latch data of the latch circuit 2d on the internal data bus 5.

Also in the clock cycles 0 and 1, the transfer control signals SW3 and SW4 are brought into active states, and the transfer gates 6a and 6c perform transfer operations. However, the output enable signal OE is at a low level of an inactive state, and the output buffer 6e is in an output high impedance state since both of the MOS transistors 6eg and 6eh are in nonconducting states.

In a clock cycle 2, the preamplifier enable signal PAE is activated again, so that the preamplifier 1 outputs data Q2 as the data DT1. In this clock cycle 2, the transfer control signal SW1a is in an active state of a high level, while the transfer control signal SW2a is at a low level of an inactive state. Therefore, the data Q2 is transferred to and latched by the latch circuit 2b through the transfer gate 2a. In this clock cycle 2, on the other hand, the transfer control signal SW2b is activated, and the data Q1 latched by the latch circuit 2d is transferred onto the internal data bus 5 through the transfer gate 4b. In this clock cycle 2, the transfer gate 6a conducts in response to activation of the transfer control signal SW3, so that the data Q0 is stored in the latch circuit 6b.

This clock cycle 2 includes a period when the transfer control signals SW2b and SW3 simultaneously go high and the transfer gates 4b and 6a simultaneously enter conducting states. Due to a delay in data transfer on the internal data bus 5, however, the latch data of the latch circuit 6b is prevented from being replaced with the data Q1 newly transferred from the transfer gate 4b. In the data transfer to the latch circuit 6b, the transfer control signal SW4 is at a low level of an inactive state.

In a clock cycle 3, the transfer control signal SW4 goes to a high level of an active state, the transfer gate 6c conducts, and the latch data of the latch circuit 6b is transferred to the latch circuit 6d. In this clock cycle 3, the output enable signal OE goes to a high level of an active state, and the output buffer 6e is activated for outputting the read data DQ in accordance with the data Q0 transferred from the latch circuit 6d. In this clock cycle 3, a column selecting operation is performed in the interior in accordance with a burst address, a new memory cell is selected, then the preamplifier enable signal PAE is activated, and the preamplifier 1 performs an amplifying operation for producing newly selected memory cell data Q3 as the data DT1. In this clock cycle 3, the transfer control signal SW2a goes to a high level of an active state, and the latch circuit 2d latches the data Q3 through the transfer gate 2c.

In this clock cycle 3, on the other hand, the transfer control signal SW1b is activated, the transfer gate 4a conducts, the data latched by the latch circuit 2b is transferred to the internal data bus 5, and the data DT2 on the internal data bus 5 is changed to the data Q2. In this clock cycle 3, further, the transfer control signal SW3 enters an active state, the transfer gate 6a conducts, and the data Q1 which has theretofore been supplied onto the internal data bus 5 is transferred to and latched by the latch circuit 6b through the transfer gate 6a.

In a clock cycle 4, the transfer control signal SW4 enters an active state, the transfer gate 6c conducts, and the latch data Q1 of the latch circuit 6b is transferred to the latch circuit 6d and outputted to the exterior of the device through the active output buffer 6e. In the clock cycle 4, a column selecting operation is performed in accordance with a burst address, the preamplifier enable signal PAE is activated, and the preamplifier 1 amplifies data of a new memory cell and produces data Q4. In this clock cycle 4, the transfer control signal SW1a is brought into an active state, and the data Q4 is latched by the latch circuit 2b through the transfer gate 2a. In parallel with this latch operation, the transfer control signal SW2b enters an active state, and the data Q3 latched by the latch circuit 2d through the transfer gate 4b is transferred onto the internal data bus 5. The transfer control signal SW3 is activated, and the transfer gate 6a incorporates data already read on the internal data bus 5 and transfers the same to the latch circuit 6b, whereby the data Q2 is latched by the latch circuit 6b. This operation is repeated therefrom on. The burst address is internally generated changing in a prescribed sequence every clock cycle, starting from a head address upon application of the read command.

The external read data DQ is sampled by an external device on the leading edge of the clock signal CLK. Therefore, the preamplifier 1 can be activated in each clock cycle for performing a data transfer operation by alternately latching data in the two latch circuits 2b and 2d in the read register part 2. Particularly in a data latch operation of one of the latch circuits 2b and 2d, the other latch transfers its latch data to the internal data bus 5, whereby data of a memory cell can be reliably transferred in each clock cycle with no data collision on the internal data bus 5 by alternately latching and transferring data by the latch circuits 2b and 2d.

Figure 3:
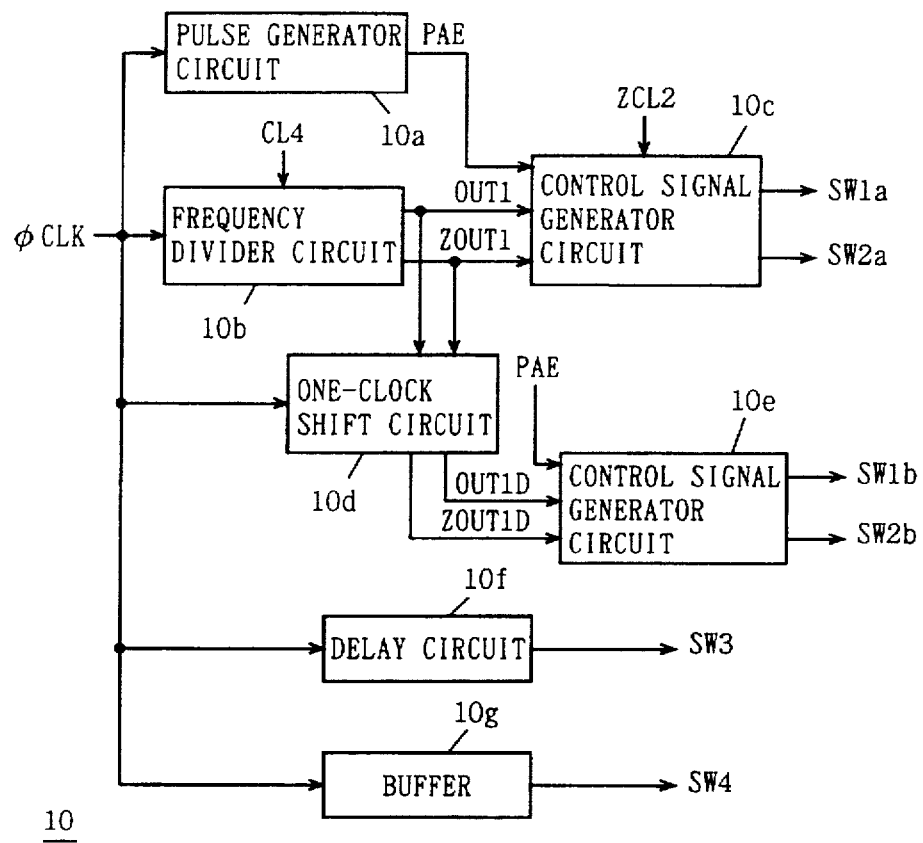
FIG. 3 schematically illustrates the structure of a transfer control signal generator part shown in FIG. 1.

FIG. 3 schematically illustrates the structure of a transfer control signal generator part 10. The transfer control signal generator part 10 shown in FIG. 3 is provided in common to a plurality of banks. The transfer control signals SW1a, SW2a, SW1b and SW2b from this transfer control signal generator part 10 are supplied to each bank to be ANDed with a bank enable (specifying) signal, for reading data from a selected memory cell of the corresponding bank.

Referring to FIG. 3, the transfer control signal generator part 10 includes a pulse generator circuit 10a for outputting the preamplifier enable signal PAE having a prescribed pulse width in response to a clock signal $\phi$CLK, a frequency divider circuit 10b which is activated in activation of CAS latency data CL4 for frequency dividing the clock signal $\phi$CLK and outputting complementary output signals OUT1 and ZOUT2 having a cycle twice that of the clock signal $\phi$CLK, and a control signal generator circuit 10c for receiving the preamplifier enable signal PAE and the output signals OUT1 and ZOUT1 of the frequency divider circuit 10b and alternately activating the transfer control signals SW1a and SW2a in inactivation (high level) of CAS latency data ZCL2.

The CAS latency data CL4 is set at a high level of an active state when the CAS latency is 4. The CAS latency data ZCL2 is brought into a low level of an active state when the CAS latency is 2. When the CAS latency data CL4 is in an inactive state of a low level, the frequency divider circuit 10b performs no frequency dividing operation but keeps the output signal OUT1 and the complementary output signal ZOUT1 at high and low levels respectively, as the structure thereof is described in detail later. The control signal generator circuit 10c changes only the transfer control signal SW1a every clock cycle and fixes the transfer control signal SW2a in an inactive state of a low level when the CAS latency data ZCL2 is in an active state of a low level. In this state, therefore, data are transferred through the transfer gate 2a, the latch circuit 2b and the transfer gate 4a in the read register part 2 shown in FIG. 1.

The transfer control signal generator part 10 further includes a one-clock shift circuit 10d for transmitting the output signals OUT1 and ZOUT1 of the divider circuit 10b while delaying the same by one cycle of the clock signal $\phi$CLK, a control signal generator circuit 10e receiving output signals OUT1D and ZOUT1D of the one-clock shift circuit 10d and the preamplifier enable signal PAE for outputting the transfer control signals SW1b and SW2b, a delay circuit 10f for delaying the clock signal $\phi$CLK by a prescribed time to form the transfer control signal SW3, and a buffer 10g for buffering the clock signal $\phi$CLK to output the transfer control signal SW4 which is synchronous with the clock signal $\phi$CLK. The clock signal $\phi$CLK is brought into a high level in synchronization with the external clock signal CLK for a clock cycle period which is equal to the sum of the burst length and the CAS latency when a read command is supplied.

Figure 4:
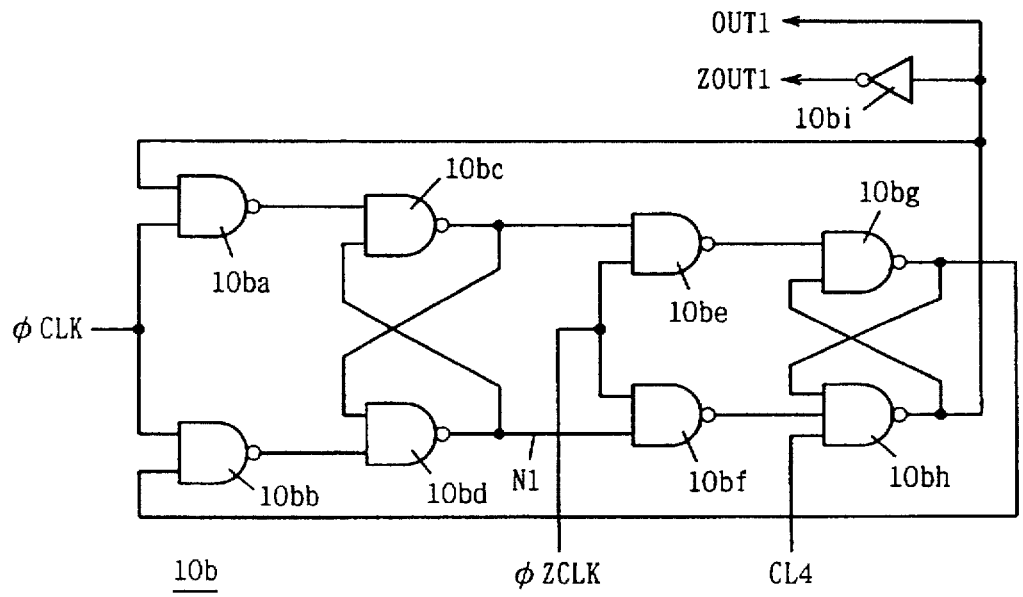
FIG. 4 illustrates an exemplary structure of a divider circuit shown in FIG. 3.

FIG. 4 illustrates an exemplary structure of the frequency divider circuit 10b shown in FIG. 3. Referring to FIG. 4, the divider circuit 10b includes a NAND circuit 10ba receiving the transfer clock signal $\phi$CLK and the divided signal OUT1, a NAND circuit 10bb receiving the transfer clock signal $\phi$CLK in its one input, a NAND circuit 10bc receiving an output signal of the NAND circuit 10ba at its one input, and a NAND circuit 10bd receiving an output signal of the NAND circuit 10bb at its one input. An output signal of the NAND circuit 10bd is supplied to another input of the NAND circuit 10bc, and an output signal of the NAND circuit 10bc is supplied to another input of the NAND circuit 10bd. The NAND circuits 10bc and 10bd form a flip-flop.

The frequency divider circuit 10b further includes a NAND circuit 10be receiving the output signal of the NAND circuit 10bc and a complemental transfer clock signal φZCLK, a NAND circuit 10bf receiving the complemental transfer clock signal φZCLK and the output signal of the NAND circuit 10bd, a NAND circuit 10bg receiving an output signal of the NAND circuit 10be at its one input, a NAND circuit 10bh receiving output signals of the NAND circuits 10bf and 10bg and the CAS latency data CL4, and an inverter 10bi receiving an output signal of the NAND circuit 10bh. The inverter 10bi outputs the complemental output signal ZOUT1, and the NAND circuit 10bh outputs the output signal OUT1. Operations of the divider circuit 10b shown in FIG. 4 are now described with reference to timing charts shown in FIGS. 5A and 5B.

Figure 5A:
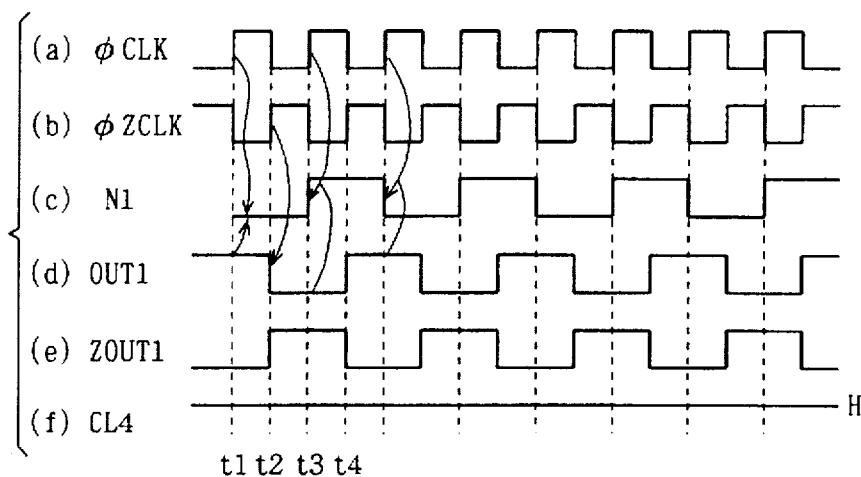
FIGS. 5A and 5B are timing charts representing operations of the divider circuit shown in FIG. 4.

With reference to FIG. 5A, operations in a case of setting the CAS latency at 4 are now described. If the transfer clock signal φCLK rises at a time t1 when the output signal OUT1 is at a high level as shown at (a) to (d) in FIG. 5A, the output signals of the NAND circuits 10ba and 10bc go low and high respectively. The complemental output signal ZOUT1 is at a low level, and the output signal of the NAND circuit 10bb is at a high level. Therefore, a signal outputted from the NAND circuit 10bd to a node N1 is at a low level.

The transfer clock signal φCLK falls to a low level and the complemental transfer clock signal φZCLK rises to a high level at a time t2, whereby the output signals of the NAND circuits 10ba and 10bb go high and the flip-flop formed by the NAND circuits 10bc and 10bd enters a latch state. In response to the rise of the transfer clock signal φZCLK, on the other hand, the NAND circuits 10be and 10bf act as inverters, so that the output signals of the NAND circuits 10bf and 10be go high and low respectively. Thus, the output signal of the NAND circuit 10bg goes high, and that of the NAND circuit 10bh goes low responsively. Namely, the output signal OUT1 falls to a low Level and the complemental output signal ZOUT1 rises to a high level at the time t2.

The transfer clock signal φCLK rises to a high level at a time t3, whereby the output signal of the NAND circuit 10bb goes low and the signal at the node N1 goes high. The complemental clock signal φZCLK is at a low level, the output signals of the NAND circuits 10be and 10bf are at high levels, and the states of the signals OUT1 and ZOUT1 remain unchanged.

The transfer clock signal φCLK falls to a low level at a time t4, whereby the signal at the node N1 is high, the output signal of the NAND circuit 10bf goes low, and that of the NAND circuit 10bh goes high. Namely, the output signal OUT1 goes high, and the complemental output signal ZOUT1 goes low. Therefrom on, these operations are repeated, and the output signals OUT1 and ZOUT1 are changed at period twice that of the transfer clock signal φCLK.

Operations in a case of setting the CAS latency at a value other than 4 are now described with reference to FIG. 5B. In this state, the CAS latency data CL4 is fixed at a low level. Therefore, the output signal of the NAND circuit 10bh is fixed at a high level, while the output signal OUT1 and the complemental output signal ZOUT1 are fixed at high and low levels respectively. Thus, the potential level of the node N1 is fixed at a low level.

Figure 6:
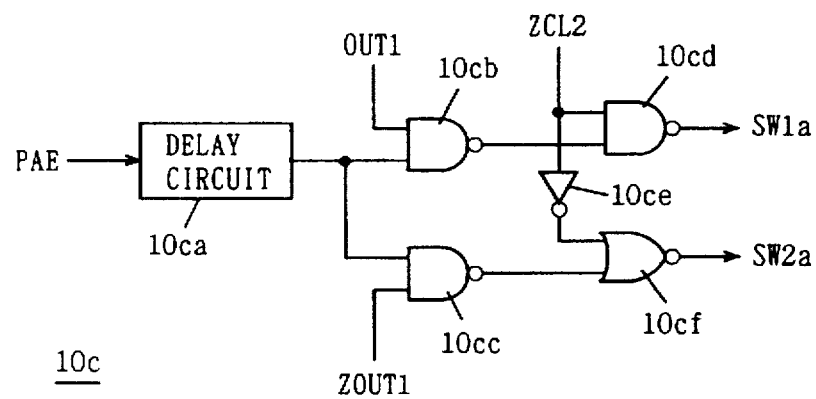
FIG. 6 illustrates an exemplary structure of a control signal generator circuit shown in FIG. 3.

FIG. 6 illustrates an exemplary structure of the control signal generator circuit 10c shown in FIG. 3. Referring to FIG. 6, the control signal generator circuit 10c includes a delay circuit 10ca for delaying the preamplifier enable signal PAE by a prescribed time, a NAND circuit 10cb receiving an output signal of the delay circuit 10ca and the output signal OUT1 of the frequency divider circuit 10b shown in FIG. 4, a NAND circuit 10cc receiving the output signal of the delay circuit 10ca and the complemental output signal ZOUT1 of the frequency divider circuit 10b shown in FIG. 4, a NAND circuit 10cd receiving the CAS latency data ZCL2 and an output signal of the NAND circuit 10cb, an inverter 10ce receiving the CAS latency data ZCL2, and a NOR circuit 10cf for receiving output signals of the inverter 10ce and the NAND circuit 10cc. The NAND circuit 10cd outputs the transfer control signal SW1a, and the NOR circuit 10cf outputs the transfer control signal SW2a. Operations of the control signal generator circuit 10c shown in FIG. 6 are now described with reference to timing charts shown in FIGS. 7A to 7C.

Figure 7A:
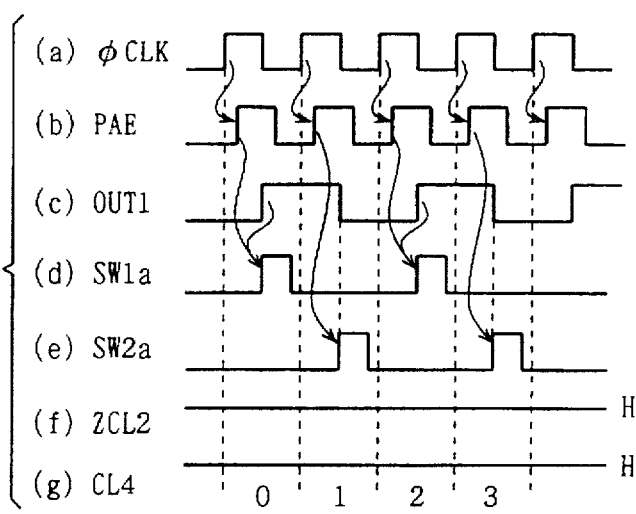
FIGS. 7A to 7C are timing charts representing operations of the control signal generator circuit shown in FIG. 6.

With reference to FIG. 7A, operations in a case of the CAS latency set at 4 are now described. When the CAS latency is 4, the CAS latency data CL4 and ZCL2 are set at high levels respectively. In this state, the NAND circuit 10cd and the NOR circuit 10cf act as inverters. When a read command is supplied, the transfer clock signal φCLK is generated and the preamplifier enable signal PAE is activated, the delay circuit 10ca delays this preamplifier enable signal PAE for the prescribed time. The signal OUT1 rises to a high level in response to the transfer clock signal φCLK. When the prescribed time elapses after the activation of the preamplifier enable signal PAE, the output signal of the NAND circuit 10cb goes low while the delayed preamplifier enable signal PAE and the output signal OUT1 are at high levels, and the transfer control signal SW1a outputted from the NAND circuit 10cd goes high in response. The activation period (high level) of the transfer control signal SW1a is decided by the delay amount of the preamplifier enable signal PAE. The preamplifier enable signal PAE is brought into an active state for a prescribed period in response to the transfer clock signal φCLK. Therefore, the delay time of the delay circuit 10ca may be appropriately adjusted to set the pulse width of the transfer control signal SW1a at an appropriate.

The preamplifier signal PAE is activated again in a next cycle 1. In this cycle 1, the output signal OUT1 falls to a low level in synchronization with fall of the transfer clock signal φCLK, while the complemental output signal ZOUT1 (not shown) rises to a high level. In this state, therefore, the output signal of the NAND circuit 10cb is at a high level, and the transfer control signal SW1a maintains a low level. On the other hand, the output signal of the NAND circuit 10cc goes low for a prescribed period in response to the output signal of the delay circuit 10ca, and the transfer control signal SW2a from the NOR circuit 10cf goes high in response.

When the preamplifier enable signal PAE is activated again in a clock cycle 2, the output signal OUT1 goes high and the complemental output signal ZOUT1 goes low in synchronization with the fall of the transfer clock signal φCLK this time. In this state, therefore, the transfer control signal SW1a goes high, while the transfer control signal SW2a maintains a low level. In a clock cycle 3, the transfer control signal SW2a goes high for a prescribed period while the transfer control signal SW1a maintains a low level, similarly to the clock cycle 1.

As described above, the transfer control signals SW1a and SW2a can be alternately activated every clock cycle by ANDing the output signals of the frequency divider circuit 10b with the preamplifier enable signal PAE.

Figure 7B:
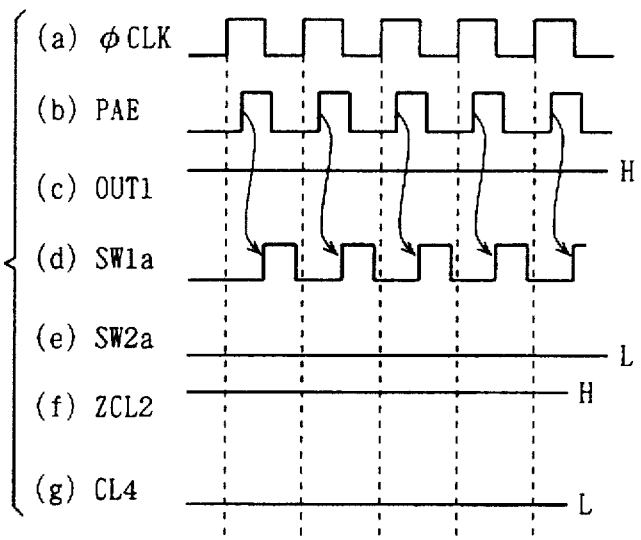

With reference to FIG. 7B, operations in case of setting the CAS latency at a value other than 2 or 4 and fixing the CAS latency data ZCL2 and CL4 at high and low levels respectively are now described.

Figure 5B:
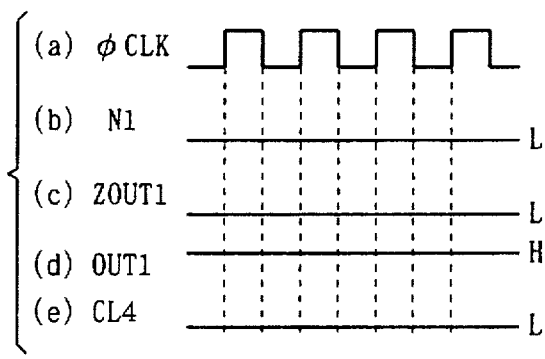

When the CAS latency data CL4 is fixed at a low level, the output signal OUT1 is fixed at a high level (refer to FIG. 5B). Therefore, the output signal of the NAND circuit 10cc is fixed at a high level, and the transfer control signal SW2a maintains a low level. On the other hand, the CAS latency data ZCL2 is at a high level, and the NAND circuit 10cb acts as an inverter. Therefore, only the transfer control signal SW1a is activated in accordance with the preamplifier enable signal PAE after a lapse of delay times provided by the delay circuit 10ca and the NAND circuits 10cb and 10cd. Namely, data are transferred in a pipeline manner through only one of the two latch circuits 2b and 2d in the read register part 2 in this state.

Figure 7C:
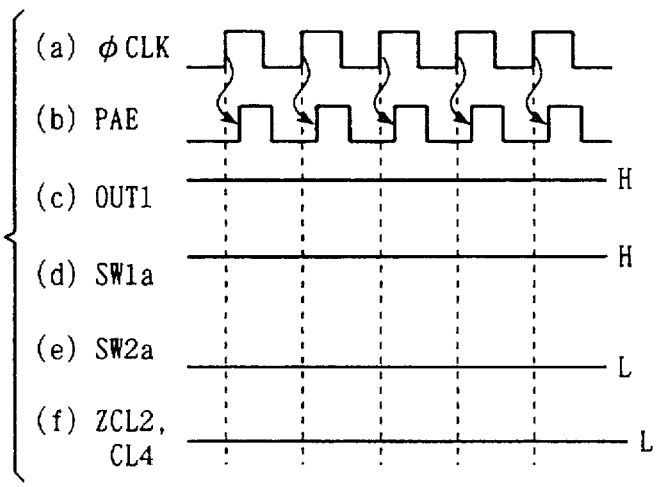

With reference to FIG. 7C, operations in case of setting the CAS latency at 2 and bringing the CAS latency data ZCL2 and CL4 into low levels are now described. In this state, the output signal OUT1 and the transfer control signal SW1a outputted from the NAND circuit 10cd are fixed at high levels respectively. On the other hand, the NOR circuit 10cf receives the CAS latency data ZCL2 through the inverter 10ce, whereby the transfer control signal SW2a is fixed at a low level. When the CAS latency is set at 2, therefore, the read register part 2 performs no latching/transfer clocking operation, but only one transfer gate is set in a through state and memory cell data amplified by the preamplifier 1 is immediately transferred (the latch circuits 2b and 2d have latch functions at this time). In this state, therefore, the memory cell data amplified by the preamplifier 1 is immediately passed through the read register part 2.

Figure 8:
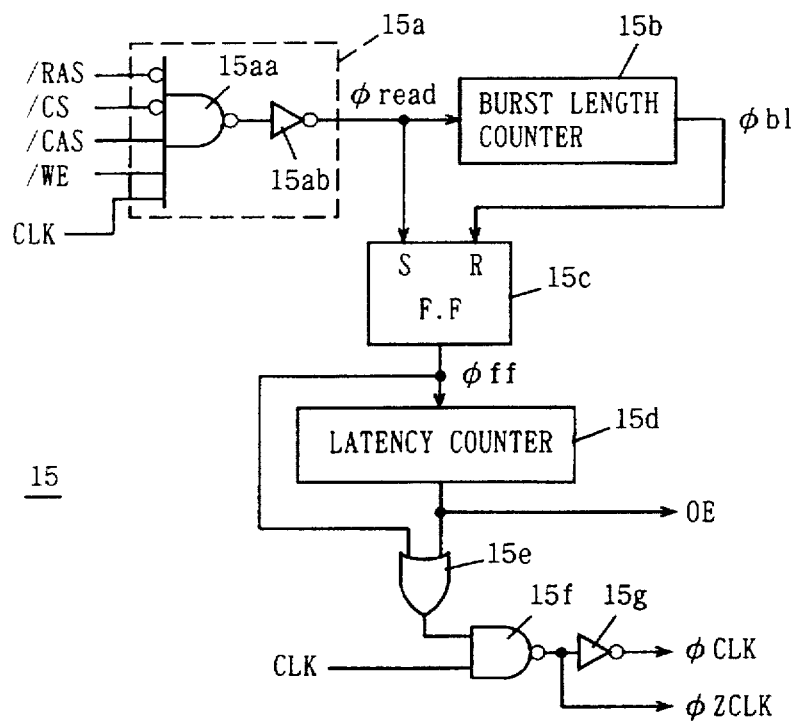
FIG. 8 illustrates an exemplary structure of a circuit generating a transfer clock signal shown in FIG. 3.

FIG. 8 illustrates the structure of a transfer clock signal φCLK generator part 15. Referring to FIG. 8, the transfer clock signal generator part 15 includes a command decoder circuit 15a for determining the states of external control signals /RAS, /CS, /CAS and /WE in synchronization with rise of the external clock signal CLK, which may be a buffered clock signal, and outputting a read operation mode instruction signal φread in response to the results of the determination, a burst length counter 15b which is activated in response to the read operation mode instruction signal φread for outputting a count-up signal φb1 after counting a burst length period, a flip-flop 15c which is set in response to activation of the read operation mode instruction signal φread and reset in response to activation of the output signal φb1 from the burst length counter 15b, a latency counter 15d for delaying an output signal φff of the flip-flop 15c by the CAS Latency period, an OR circuit 15e receiving the output signal φff of the flip-flop 15c and an output signal (the output enable signal) OE of the latency counter 15d, a NAND circuit 15f for receiving an output signal of the OR circuit 15e and the clock signal CLK, and an inverter circuit 15g for inverting an output signal of the NAND circuit 15f. The inverter circuit 15g outputs the transfer clock signal φCLK, and the NAND circuit 15f outputs the complemental transfer signal φZCLK.

The burst length counter 15b and the latency counter 15d have structures of shift registers for successively shifting supplied signals in synchronization with the clock signal CLK, as described later. Therefore, the output signal φb1 of the burst length counter 15b is activated after a lapse of the burst length period from activation of the read operation mode instruction signal φread. The output enable signal OE outputted from the latency counter 15d is activated after the flip-flop 15c is set, i.e., in a cycle preceding the CAS latency by one clock cycle after a read command is supplied and the read operation mode instruction signal φread is activated. The output enable signal OE is activated for the burst length period.

The command decoder circuit 15a includes a gate circuit 15aa receiving a row address strobe signal /RAS, a chip select signal /CS, a column address strobe signal /CAS, a write enable signal /WE and the clock signal CLK, and an inverter circuit 15ab inverting an output signal of the gate circuit 15aa. The gate circuit 15aa outputs a high-level signal when both of the row address strobe signal /RAS and the chip select signal /CS are at low levels and the column address strobe signal /CAS, the write enable signal /WE and the clock signal CLK are at high levels.

The gate circuit 15aa is enabled when the clock signal CLK is at a high level, for determining the current states of the signals /RAS, /CS, /CAS and /WE. The gate circuit 15aa and the inverter 15ab of the command decoder circuit 15a form a read command decoder. Command decoder circuits are provided for other commands respectively. Operations of the transfer clock signal generator part 15 shown in FIG. 8 are now described with reference to a timing chart shown in FIG. 9.

Figure 9:
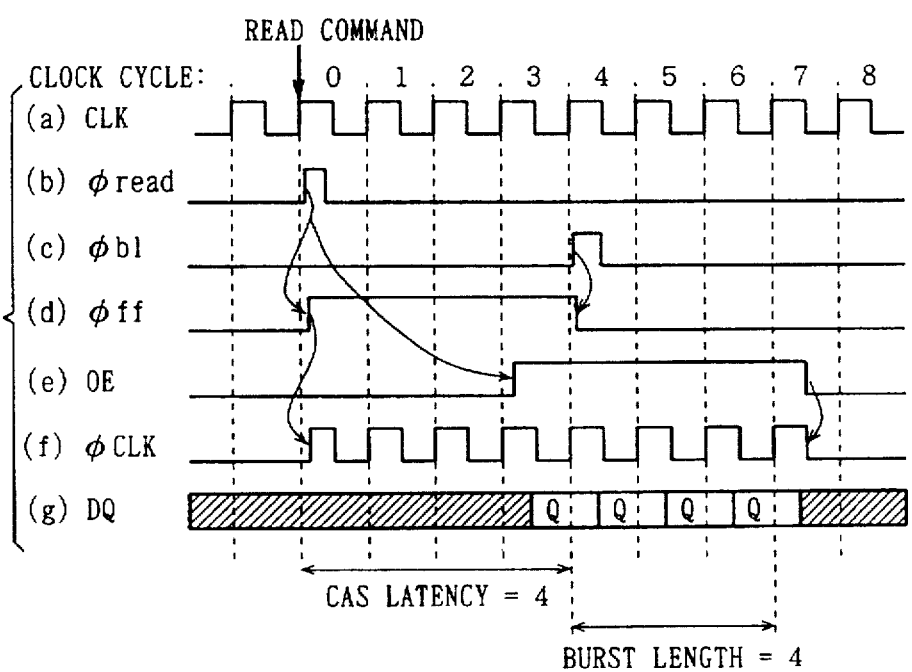
FIG. 9 is a timing chart representing operations of a transfer clock signal generator part shown in FIG. 8.

Before the read command is supplied, the read operation mode instruction signal φread is at a low level (see (b) in FIG. 9), and the signals φb1, φff, OE and φCLK are in inactive states.

When the read command is supplied in a clock cycle 0, the read operation mode instruction signal φread from the command decoder circuit 15a goes high for a prescribed time. The command decoder circuit 15a includes a one-shot pulse generator circuit (not clearly shown), and the read operation mode instruction signal φread is generated as a pulse signal which goes high for a prescribed period in response to rise of an output signal from the gate circuit 15aa.

In response to the rise of the read operation mode instruction signal φread, the flip-flop 15c is set and the signal φff shown at (d) in FIG. 9 rises to a high level. The output signal of the OR circuit 15e goes high in response to the rise of the signal φff, and the NAND circuit 15f and the inverter circuit 15g generate the transfer clock signals φCLK and φZCLK in response to the clock signal CLK respectively. The read operation mode instruction signal φread is supplied to the burst length counter 15b, and the output signal φff of the flip-flop 15c is supplied to the latency counter 15d. In a clock cycle 3 preceding the CAS latency cycle by one clock cycle, the output enable signal OE from the CAS latency counter 15d enters an active state of a high level. Data Q is outputted in accordance with the output enable signal OE, to enter a definite state on the leading edges of the clock signal CLK in respective clock cycles 4, 5, 6 and 7.

The latency counter 15d transmits the output signal φff of the flip-flop 15c while delaying the same for a period shorter than the CAS latency by one clock cycle. The burst length is set at 4, and when clock cycles (four clock cycles) equal to the burst length elapse from supply of the read command, the output signal φb1 of the burst length counter 15b goes high, the flip-flop 15c is reset, and the signal φff falls to a low level. Also in this state, the output enable signal OE from the latency counter 15a is at a high level, the output signal of the OR circuit 15e is at a high level, and the transfer clock signals φCLK and φZCLK are outputted in synchronization with the clock signal CLK.

In the clock cycle 7 after a lapse of three clocks from the fall of the output signal φff of the flip-flop 15c, the output signal OE of the latency counter 15d and the output signal of the OR circuit 15e fall to low levels respectively. Thus, the transfer clock signal φCLK and the complementary transfer clock signal φZCLK are fixed at low and high levels respectively.

Due to the structure of the transfer clock signal generator part 15 shown in FIG. 8, the transfer clock signals φCLK and φZCLK can be outputted only when a read command is supplied. The transfer clock signal generator part 15 is provided in common to a plurality of banks, and the respective signals are ANDed with a bank enable signal, and supplied to read data transfer parts of the respective banks.

FIG. 10 illustrates exemplary structures of the one-clock shift circuit 10d and the control signal generator circuit 10e shown in FIG. 3. Referring to FIG. 10, the one-clock shift circuit 10d includes a clocked inverter 10da which is activated when the clock signal CLK is at a high level for passing the output signal OUT1 of the frequency divider circuit 10b shown in FIG. 3, a NAND circuit 10db receiving the power source voltage VCC at its one input for acting as an inverter, an inverter circuit 10dc for inverting an output signal of the NAND circuit 10db for supplying to another input of the NAND circuit 10db, a clocked inverter 10dd which is activated when the clock signal CLK is at a low level for passing the output signal of the NAND circuit 10db, a NAND circuit 10de receiving the power source voltage VCC at its one input and operating as an inverter, an inverter circuit 10df for inverting an output signal of the NAND circuit 10de for supplying to another input of the NAND circuit 10de, and an inverter circuit 10dg for inverting the output signal of the NAND circuit 10de. The NAND circuit 10de outputs an output signal OUT1D, and the inverter circuit 10dg outputs a complementary output signal ZOUT1D.

The control signal generator circuit 10e includes a delay circuit 10ea for delaying the preamplifier enable signal PAE for a prescribed time, a NAND circuit 10eb receiving an output signal of the delay circuit 10ea and the signal OUT1D, a NAND circuit 10ec receiving the output signal of the delay circuit 10ea and the signal ZOUT1D, an inverter circuit 10ed for inverting an output signal of the NAND circuit 10eb to output the transfer control signal SW1b, and an inverter circuit 10ee for inverting the output signal of the NAND circuit 10ec to output the transfer control signal SW2b. Operations of the one-clock shift circuit 10d and the control signal generator circuit 10e shown in FIG. 10 are now described with reference to timing charts shown in FIGS. 11 and 12.

With reference to FIG. 11, operations in a case of the CAS latency set at 4 are described. When the CAS latency is 4, the CAS latency data CL4 is set at a high level (see (h) in FIG. 11).

In a clock cycle 0, both of the preamplifier enable signal PAE and the transfer clock signal φCLK as well as both of the transfer control signals SW1b and SW2b are at low levels.

When a read command is supplied in a clock cycle 1, the frequency divider circuit 10b is activated in accordance with the read operation mode instruction signal φread, and the transfer clock signal φCLK is generated. In accordance with this read command, the preamplifier enable signal PAE is brought into a high level for a prescribed period. In accordance with the transfer clock signal φCLK, the output signal OUT1 from the frequency divider circuit 10b shown in FIG. 4 is generated at period twice that of the transfer clock signal φCLK. When the transfer clock signal φCLK goes high in a clock cycle 1, the clock signal CLK is at a low level and the clocked inverter 10da is in an output high impedance state. In this state, the output signal OUT1D of the one-clock shift circuit 10d maintains a low level. In this clock cycle 1, therefore, the transfer control signals SW1b and SW2b are still at low levels.

In a clock cycle 2, the preamplifier enable signal PAE is brought into a high level for a prescribed period again. In this clock cycle 2, the clocked inverter 10da inverts and passes the signal OUT1 in response to rise of the clock signal CLK. The clocked inverter 10dd is in an output high impedance state, since the clock signal CLK is at a high level. Then, the clock signal CLK falls to a low level in this clock cycle 2, whereby the clocked inverter 10dd operates to invert and pass the signal OUT1 latched by the NAND circuit 10ab and the inverter circuit 10dc. The signal OUT1D rises to a high level responsively. At this time, the clocked inverter 10da is in an output high impedance state.

When the signal OUT1D rises to a high level in this clock cycle 2, the output signal of the NAND circuit 10eb goes low and the transfer control signal SW1b goes high after a lapse of the delay time provided by the delay circuit 10ea, in response to the activation of the preamplifier enable signal PAE. On the other hand, the signal ZOUT1D, which is an inverted signal of the signal OUT1D, is at a low level, whereby the output signal of the NAND circuit 10ec is at a high level, and the transfer control signal SW2b is at a low level.

In a clock cycle 3, the clocked inverter 10da operates in synchronization with rise of the clock signal CLK, to incorporate the low-level signal OUT1. Since the clock signal CLK is at a high level, the clocked inverter 10dd is brought into an output high impedance state, and the state of the signal OUT1D remains unchanged (maintains the high level). Then, the clock signal CLK falls to a low level, whereby the clocked inverter 10da enters an output high impedance state, while the clocked inverter 10dd operates and the output signal OUT1D falls to a low level. In accordance with this fall of the signal OUT1D and activation (high level) of the delayed preamplifier enable signal PAE outputted from the delay circuit 10ea, the output signal of the NAND circuit 10ec goes low, and the transfer control signal SW2b goes high for a prescribed period. Since the signal OUT1D is at a low level, the NAND circuit 10eb outputs a high-level signal, and the transfer control signal SW1b maintains a low level.

In a clock cycle 4, the clock signal CLK rises and the preamplifier enable signal PAE is activated again. In synchronization with the rise of the clock signal CLK, the clocked inverter 10da operates to invert and pass the high-level output signal OUT1. In synchronization with fall of the clock signal CLK, the clocked inverter 10dd operates to make the signal OUT1D rise to a high level. In this clock cycle 4, therefore, the output signal of the NAND circuit 10ed goes low and the transfer control signal SW1b goes high when the output signal of the delay circuit 10ea goes high. On the other hand, the transfer control signal SW2b maintains a low level since the output signal of the NAND circuit 10ec is at a high level.

Thereafter the transfer control signals SW1b and SW2b are alternately activated for prescribed periods every time the preamplifier enable signal pAE is activated.

The signal OUT1 is delayed by the one-clock shift circuit 10d by one clock cycle of the clock signal CLK, whereby latch data can be transferred to the internal data bus 5 in a next clock cycle after the data is latched by the latch circuit 2b shown in FIG. 1.

Figure 12:
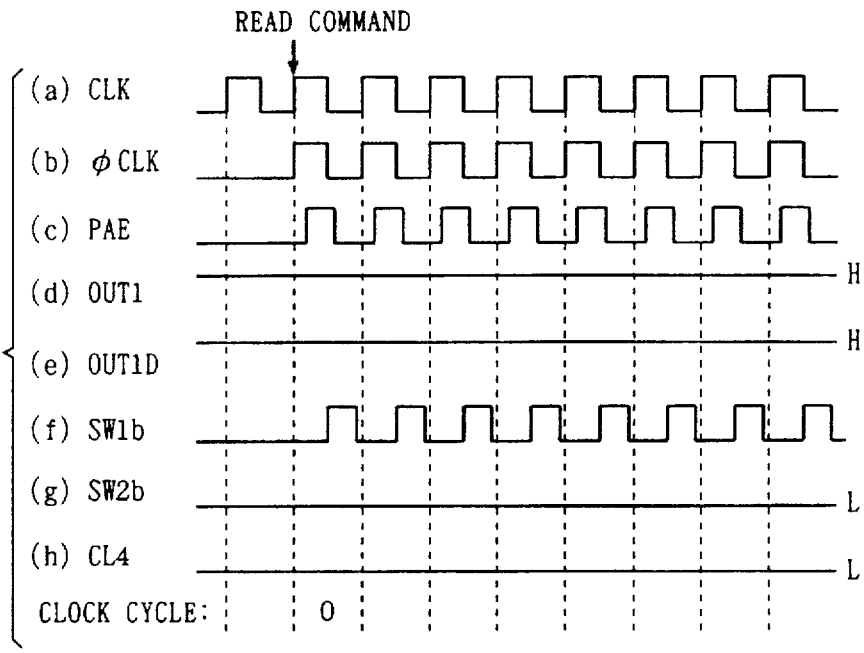
FIG. 12 is a timing chart representing operations of the circuits shown in FIG. 10.

FIG. 12 is a timing chart representing operations of the one-clock shift circuit 10d and the control signal generator circuit 10e in a case of the CAS latency set at a value other than 4.

As shown at (h) in FIG. 12, the CAS latency data CL4 is fixed at a low level when the CAS latency is not 4. When the CAS latency data CL4 is at a low level, the signal OUT1 is fixed at a high level and the signal OUT1D is also fixed at a high level, regardless of presence/absence of the transfer clock signal φCLK, as shown at (d) and (e) in FIG. 12. In this state, the NAND circuit 10eb acts as an inverter, the output signal of the NAND circuit 10ec is fixed at a high level, and the transfer control signal SW2b is fixed at a low level.

When a read command is supplied in a clock cycle 0 and the preamplifier enable signal PAE is activated and the output signal of the delay circuit 10ea is activated in each clock cycle, therefore, the transfer control signal SW1b goes high for a prescribed period and data transferred to either latch circuit 2b or 2d is read on the internal data bus 5. When the preamplifier enable signal PAE is activated in each clock cycle thereafter, the transfer control signal SW1b is activated in response. Thus, data amplified by the preamplifier 1 is transferred to the internal data bus 5 through only one latch and only one transfer gate at a high speed when the CAS latency is shorter than 4.

The one-clock shift circuit 10d may perform a transfer operation in accordance with the clock signal φCLK.

Figure 13:
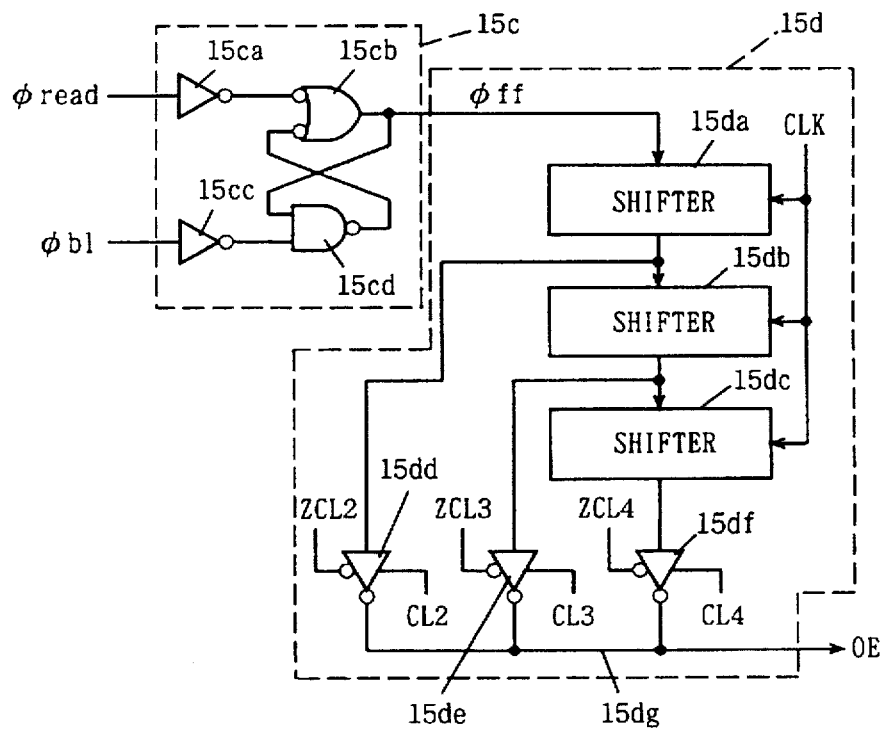
FIG. 13 illustrates the structures of a flip-flop and a latency counter shown in FIG. 8.

FIG. 13 illustrates exemplary structures of the flip-flop 15c and the latency counter 15d shown in FIG. 8. Referring to FIG. 13, the flip-flop 15c includes an inverter 15ca receiving the read operation mode instruction signal φread, a NAND circuit 15cb receiving an output signal of the inverter 15ca at its one input node, an inverter 15cc receiving the output signal φb1 of the burst length counter 15b shown in FIG. 8, and a NAND circuit 15cd receiving an output signal of the inverter 15cc. An output signal of the NAND circuit 15cd is supplied to another input of the NAND circuit 15cb.

The latency counter 15d includes a shifter 15da for shifting the output signal φff of the flip-flop 15c in synchronization with the clock signal CLK, a shifter 15db for transferring an output signal of the shifter 15da in synchronization with the clock signal CLK, a shifter 15dc for transferring an output signal of the shifter 15db in synchronization with the clock signal CLK, a tri-state inverter 15dd for selecting and passing the output signal of the shifter 15da when CAS latency data CL2 is in an active state of a high level, a tri-state inverter 15de for selecting and passing the output signal of the shifter 15db when CAS latency data CL3 is in an active state (high level), and a tri-state inverter 15df for selecting and passing the output signal of the shifter 15dc when the CAS latency data CL4 is in an active state.

Outputs of the tri-state inverters 15dd, 15de and 15df are coupled to a signal line 15dg in common. The output enable signal OE is generated on the signal line 15dg. The shifters 15da, 15db and 15dc are similar in structure to the one-clock shift circuit 10d shown in FIG. 10. Operations of the flip-flop 15c and the latency counter 15d shown in FIG. 13 are now described.

When the CAS latency is set at 2, the CAS latency data CL2 is set in an active state. When the CAS latency is 3, the CAS latency data CL3 is set in an active state. When the CAS latency is 4, the CAS latency data CL4 is set in an active state. These CAS latency data CL2 to CL4 are stored in a command register (not shown) together with preceding burst length data. The user sets either CAS latency data CL2 to CL4 and the burst length data in the command register by writing necessary data in the command register through a command register set mode.

Figure 14:
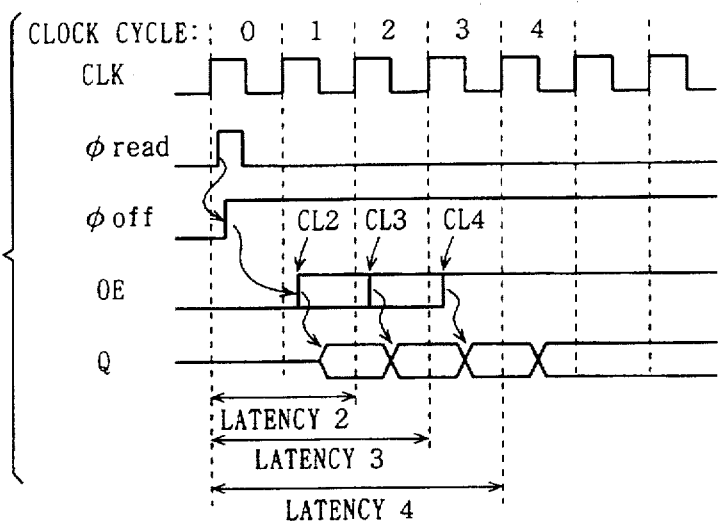
FIG. 14 is a timing chart representing operations of the circuits shown in FIG. 13.

Referring to FIG. 14, a read command is supplied in a clock cycle 0, and the read operation mode instruction signal φread is generated in the form of a one-shot pulse. Thus, the output signal to the inverter 15ca goes low in the flip-flop 15c, and the signal φff from the NAND circuit 15cd rises to a high level. The output signal φb1 of the burst length counter 15b is at a low level, and the output signal of the NAND circuit 15cd is at a high level.

The shifter 15da outputs the signal φff with a delay of one clock cycle, the shifter 15db delays the output signal of the shifter 15da by one clock cycle, and the shifter 15dc delays the output signal of the shifter 15db by one clock cycle. When the CAS latency data CL2 is in an active state, therefore, the output signal of the shifter 15da goes high and the output enable signal OE is brought into a high level in response thereto in a clock cycle 1.

When the CAS latency is set at 3, the output signal of the shifter 15bb enters an active state. The output enable signal OE is activated in a clock cycle 2. When the CAS Latency is set at 4, the output signal of the shifter 15dc enters an active state in a clock cycle 3, and the output enable signal OE enters an active state of a high level in the clock cycle 3.

The read data Q enters a definite state on the leading edge of the clock signal CLK in the clock cycle 2 when the CAS latency is 2, and the data Q enters a definite state on the leading edge of the clock signal CLK in the clock cycle 3 when the CAS latency is 3, while the data Q enters a definite state on the leading edge of the clock signal CLK in a clock cycle 4 when the CAS latency is 4.

In the structure shown in FIG. 13, the output enable signal OE falls to a low level when activated. However, the operation waveform diagram shown in FIG. 14 can be obtained by inserting an inverter circuit in the signal line 15dg.

Alternatively, the output signals of the NAND circuits 15cb and 15cd of the flip-flop 15c may be employed, and the shifters 15da, 15db and 15dc are formed by NAND shift registers for transferring true and complementary data while selecting complementary output signals by the tri-state inverters 15dd, 15de and 15df.

When the output signal φb1 of the burst length counter 15b rises to a high level, the output signal of the inverter 15cc goes low, the output signal of the NAND circuit 15cd goes high, and the signal φff from the NAND circuit 15cb goes low in response. Therefore, the output enable signal OE is brought into an active state of a high level for a clock cycle period of the burst length.

Figure 15:
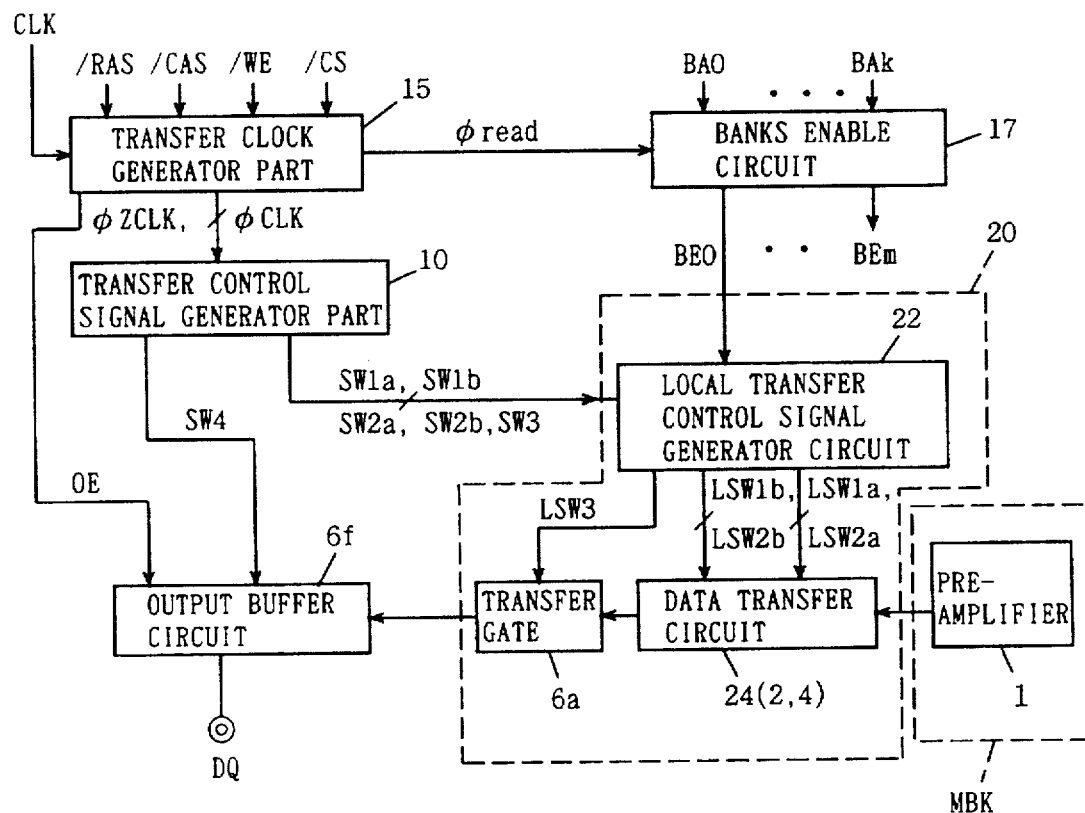
FIG. 15 schematically illustrates the structure of the control signal generator part of the SDRAM according to the embodiment 1 of the present invention.

FIG. 15 schematically illustrates a structure for control signal generation. This FIG. 15 shows a structure with respect to a single memory bank MBK. The transfer control signal generator part 10 and the transfer clock generator part 15 shown in FIGS. 3 and 8 respectively are provided in common to a plurality of memory banks. With respect to the memory bank MBK, a local data transfer circuit 20 is provided for transferring data read from a corresponding memory array in accordance with the transfer control signals SW1a, SW1b, SW2a, SW2b and SW3 and a bank enable signal BEi (i=0 to m) from a bank enable circuit 17.

The enable circuit 17 is activated in response to the read operation mode instruction signal φread from a command decoder included in the transfer clock generator part 15, for decoding bank address signals BA0 to BAk and activating the bank enable signal BEi for a memory bank specified by any bank address signal. Referring to FIG. 15, a bank enable signal BE0 from the bank enable circuit 17 is supplied to the local data transfer circuit 20.

The local data transfer circuit 20 includes a local transfer control signal generator circuit 22 which is activated in activation of the bank enable signal BE0 from the bank enable circuit 17 for generating local transfer control signals in accordance with the transfer control signals SW1a, SW1b, SW2a, SW2b and SW3 from the transfer control signal generator part 10, a data transfer circuit 24 for transferring data read from the preamplifier 1 in accordance with transfer control signals LSW1a, LSW2a, LSW1b and LSW2b from the local transfer control signal generator circuit 22, and a transfer gate 6a for transmitting the data transferred from the data transfer circuit 24 in accordance with a local transfer control signal LSW3 from the local transfer control signal generator circuit 22.

The data transfer circuit 24 includes the read register part 2 and the data transfer part 4 shown in FIG. 1. The transfer gate 6a is identical to that shown in FIG. 1. An output signal of this transfer gate 6a is supplied to an output buffer circuit 6f.

The output buffer circuit 6f includes the components of the output part 6 excluding the transfer gate 6a. This output buffer circuit 6f successively outputs the data in accordance with the transfer control signal SW4 from the transfer control signal generator part 10 and the output enable signal OE from the transfer clock generator part 15.

Figure 16:
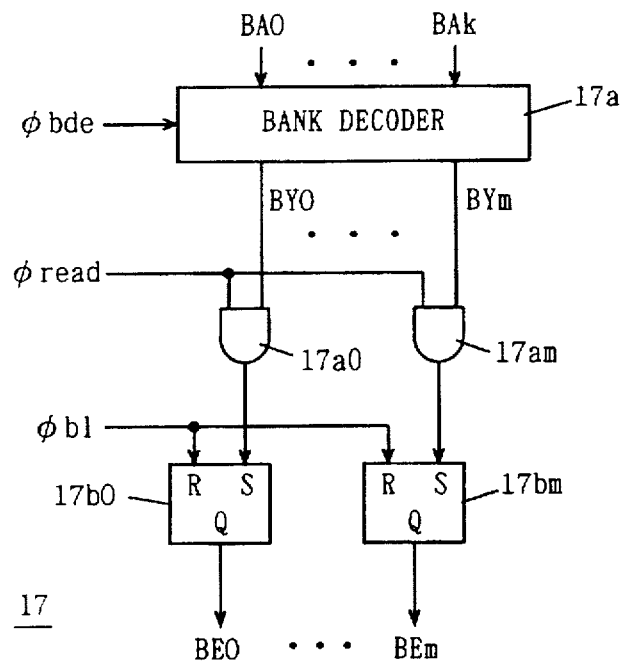
FIG. 16 illustrates an exemplary structure of a bank enable circuit shown in FIG. 15.

FIG. 16 illustrates an exemplary structure of the bank enable circuit 17 shown in FIG. 15. Referring to FIG. 16, the bank enable circuit 17 includes a bank decoder 17a which is activated in response to activation of a bank decoder enable signal φbde outputted from the command decoder for decoding the bank address signals BA0 to BAk and driving one of bank specifying signals BY0 to BYm to an active state, NAND circuits 17a0 to 17am which are provided in correspondence to the bank specifying signals BY0 to BYm respectively for ANDing the corresponding bank specifying signals BY0 to BYm with the data read operation mode instruction signal φread, and flip-flops 17b0 to 17bm which are provided in correspondence to the NAND circuits 17a0 to 17am respectively, set in response to activation of output signals of the corresponding NAND circuits 17a0 to 17am, and reset when the output signal φb1 of the burst length counter 15b is activated.

Figure 17:
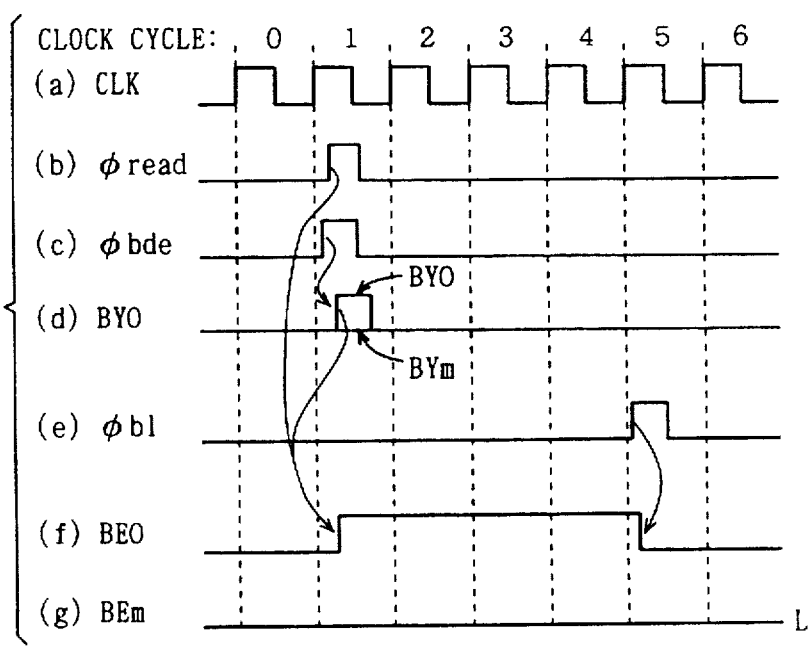
FIG. 17 is a timing chart representing operations of the bank enable circuit shown in FIG. 16.

The flip-flops 17b0 to 17bm output bank enable signals BE0 to BEm respectively. The bank decoder enable signal φbde and the data read operation mode instruction signal φread are outputted from the command decoder. The signal φb1 is outputted from the burst length counter 15b shown in FIG. 8. Operations of the bank enable circuit 17 shown in FIG. 16 are now described with reference to a timing chart shown in FIG. 17. Referring to FIG. 17, the burst length is 4.

In a clock cycle 0, all signals are in inactive states of low levels since no read command is supplied yet.

When a read command is supplied in a clock cycle 1, the read operation mode instruction signal φread from the command decoder is brought into an active state of a high level for a prescribed period. In synchronization with or in advance of this activation of the read operation mode instruction signal φread, the bank decoder enable signal φbde is activated. In response to this activation of the bank decoder enable signal φbde, the bank decoder 17a decodes supplied bank addresses BA0 to BAk, and drives one of the bank specifying signals BY0 to BYm to an active state. Referring to FIG. 17, the bank specifying signal BY0 is driven to an active state.

In response to this activation of the bank specifying signal BY0, the output signal of the NAND circuit 17a0 goes high, the flip-flop 17b0 is set, and the bank enable signal BE0 is driven to an active state. The remaining bank enable signals BEm maintain inactive states since the bank specifying signals BYm are in inactive states of low levels.

When four clock cycles specified by the burst length elapse, the signal φb1 from the burst length counter 15b rises to a high level, the flip-flop 17b0 is reset, and the bank enable signal BE0 is driven to a low level of an inactive state in a clock cycle 5. Thus, a data read operation for the memory bank specified by the bank specifying signal BY0 is completed.

Figure 18:
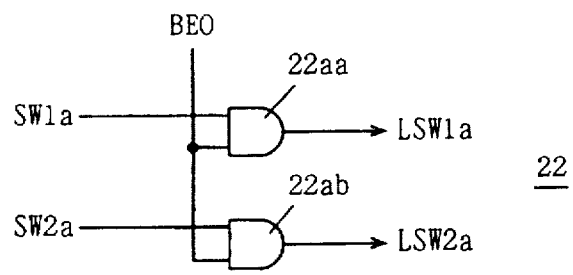
FIG. 18 illustrates the structure of a local transfer control signal generator circuit shown in FIG. 15.
Figure 19:
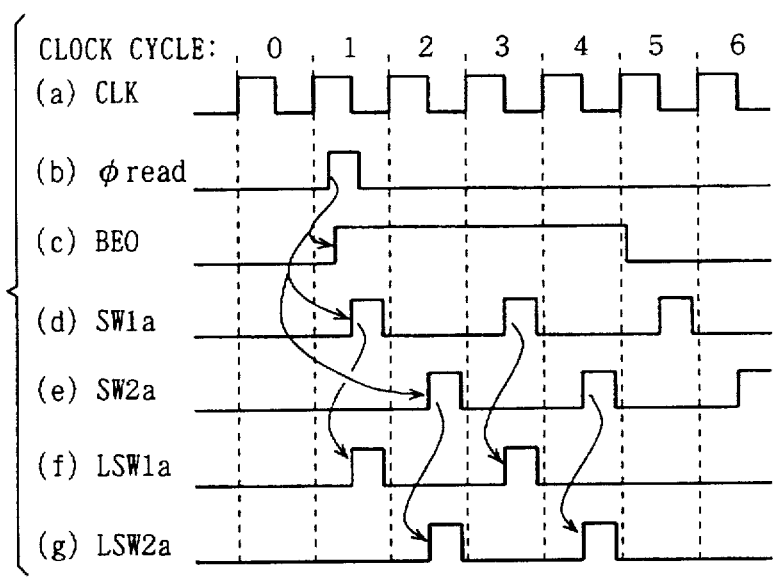
FIG. 19 is a timing chart representing operations of the local transfer control signal generator circuit shown in FIG. 18.

FIG. 18 illustrates the structure of a part for generating the local transfer control signals LSW1a and LSW2a included in the local transfer control signal generator circuit 22 shown in FIG. 15. Referring to FIG. 18, the local transfer control signal generator circuit 22 includes an AND circuit 22aa receiving the bank enable signal BE0 and the transfer control signal SW1a, and an AND circuit 22ab receiving the bank enable signal BE0 and the transfer control signal SW2a. The AND circuit 22aa outputs the local transfer control signal LSW1a, while the AND circuit 22ab outputs the local transfer control signal LSW2a. In accordance with the local transfer control signals LSW1a and LSW2a, data read from the corresponding memory bank MBK (refer to FIG. 15) and amplified by the preamplifier 1 are successively transferred and latched. Operations of the local transfer control signal generator circuit 22 shown in FIG. 18 are now described with reference to an operation timing chart shown in FIG. 19.

In a clock cycle 0, no read command is supplied yet, and all transfer control signals are in inactive states of low levels, while the bank enable signal BE0 is also in an inactive state.

When a read command is supplied in a clock cycle 1 and the memory bank MBK is specified, the bank enable signal BE0 enters an active state of a high level. In response to this activation of the read operation mode instruction signal φread, the transfer control signals SW1a and SW2a are alternately activated every clock cycle in the transfer control signal generator part 10, as described previously. The preamplifier enable signal PAE is activated in response to the clock signal φCLK. The preamplifier enable signal PAE is activated by a number of times equal to the sum of the burst length and the CAS latency. In accordance with the transfer control signals SW1a and SW2a, the local transfer control signals LSW1a and LSW2a are alternately activated in clock cycles 1 to 4 respectively. In a clock cycle 5, the bank enable signal BE0 is brought into an inactive state of a low level due to transfer of data in a number equal to the burst length. Therefore, the local transfer control signals SW1a and SW2a are not activated even if the transfer control signals SW1a and SW2a are thereafter activated.

Due to the aforementioned structure, data specified by the burst length can be reliably alternately transferred from the preamplifier 1 to and latched by the latch circuits 2b and 2d in accordance with the bank enable signal BE0.

Figure 20:
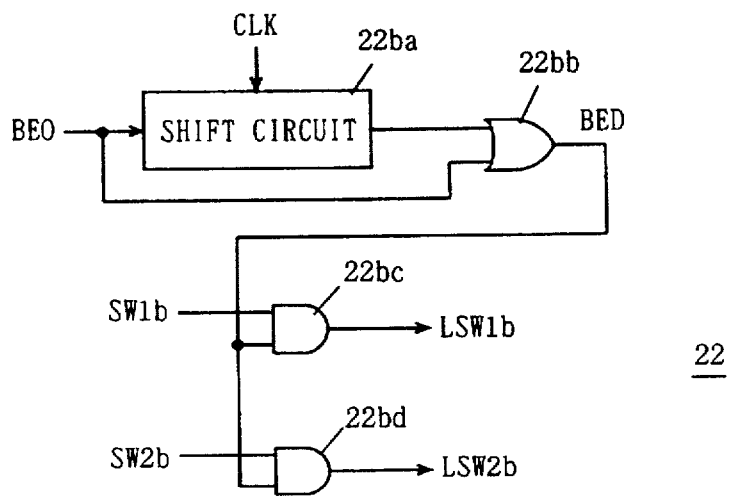
FIG. 20 schematically illustrates another structure of the local transfer control signal generator circuit shown in FIG. 15.

FIG. 20 schematically illustrates the structure of a part for generating the local transfer control signals LSW1b and LSW2b included in the local transfer control signal generator circuit 22 shown in FIG. 15. Referring to FIG. 20, the local transfer control signal generator part includes a shift circuit 22ba for delaying the bank enable signal BE0 by one clock cycle of the clock signal CLK, an OR circuit 22bb receiving an output signal of the shift circuit 22ba and the bank enable signal BE0, an AND circuit 22bc receiving an output signal BED of the OR circuit 22bb and the transfer control signal SW1b, and an AND circuit 22bd for receiving the signal BED and the transfer control signal SW2b. The AND circuit 22bc outputs the local transfer control signal LSW1b, while the AND circuit 22bd outputs the local transfer control signal LSW2b. Operations of the local transfer control signal generator part shown in FIG. 20 are now described with reference to timing charts shown in FIGS. 21 and 22.

Figure 21:
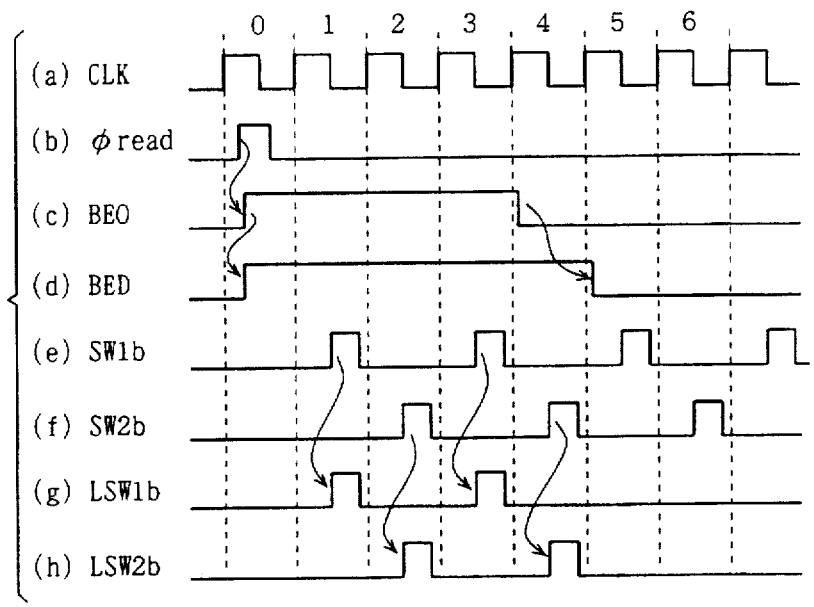
FIG. 21 is a timing chart representing operations of the local transfer control signal generator circuit shown in FIG. 20.

With reference to FIG. 21, operations in a case of the CAS latency set at 4 are described. In a clock cycle 0, a read command is supplied, the read operation mode instruction signal φread is brought into an active state of a high level for a prescribed period, and the bank enable signal BE0 goes high in response. In response to this activation of the bank enable signal BE0, the extended bank enable signal BED from the OR circuit 22b also enters an active state of a high level. The transfer control signals SW1b and SW2b are alternately activated for prescribed periods from a clock cycle 1 delayed by one clock cycle from the supply of the read command. The preamplifier enable signal PAE is brought into an active state for the clock cycle period of the sum of the burst length and the CAS latency, and the transfer control signals SW1b and SW2b are activated for periods longer than the clock cycle of the burst length.

When the transfer control signal SW1b is activated in the clock cycle 1, the local transfer control signal LSW1b from the AND circuit 22bc is activated. When the transfer control signal SW2b is activated in a clock cycle 2, the local transfer control signal LSW2b from the AND circuit 22bd is activated. In a clock cycle 3, the local transfer control signal LSW1b is activated in accordance with activation of the transfer control signal SW1b.

In a clock cycle 4, the bank enable signal BE0 is brought into an inactive state of a low level, while the output signal from the shift circuit 22ba is in an active state of a high level and the extended bank enable signal BED still remains in an active state. In this clock cycle 4, therefore, the local transfer control signal LSW2b is activated in accordance with the transfer control signal SW2b.

In a clock cycle 5, the extended bank enable signal BED from the OR circuit 22bb is brought into an inactive state of a low level. In this state, therefore, the local transfer control signals LSW1b and LSW2b remain at low levels of inactive states even if the transfer control signals SW1b and SW2b are activated. Thus, all data of the burst length are transferred also when the CAS latency is 4.

Figure 22:
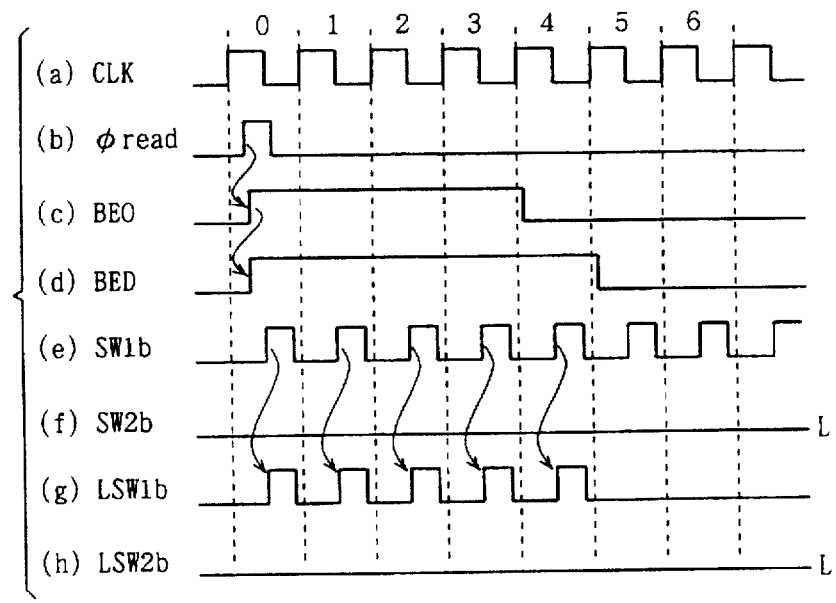
FIG. 22 is a timing chart representing operations of the local transfer control signal generator circuit shown in FIG. 20.

With reference to FIG. 22, operations in a case of the CAS latency set at a value other than 4 are described. When the CAS latency is not 4, the transfer control signal SW2b is fixed at a low level. Therefore, the local transfer control signal LSW2b is also fixed at a low level.

When a read command is supplied in a clock cycle 0, the data read operation mode instruction signal φread is activated, and the bank enable signal BE0 as well as the extended bank enable signal BED are brought into active states of high levels. When the read command is supplied, the transfer control signal SW1b is brought into an active state of a high level for a prescribed period in accordance with the preamplifier enable signal PAE (not shown) from the clock cycle 0 (refer to FIG. 11) unless the CAS latency is 4. Therefore, the local transfer control signal LSW1b is activated in accordance with the activation of the transfer control signal SW1b for a period from the clock cycle 0 to a clock cycle 4. Thus, data are reliably transferred also when the CAS latency is not 4. A data transfer operation is performed five times when the burst length is 4 and the CAS latency is not 4. The fifth local transfer control signal LSW1b transfers invalid data. However, activation timing for the signal LSW3 is adjusted as described later, thereby preventing transfer of unnecessary data to the internal data bus 5.

In the structure shown in FIG. 20, the extended bank enable signal BED is activated for a clock cycle period of the burst length +1, regardless of the value of the CAS latency. Alternatively, the structure may be replaced with that of selecting the extended bank enable signal BED when the CAS latency is 4 while selecting the bank enable signal BE0 when the CAS latency is not 4 for setting the activation periods for the local transfer control signals LSW1b and LSW2b.

Figure 23:
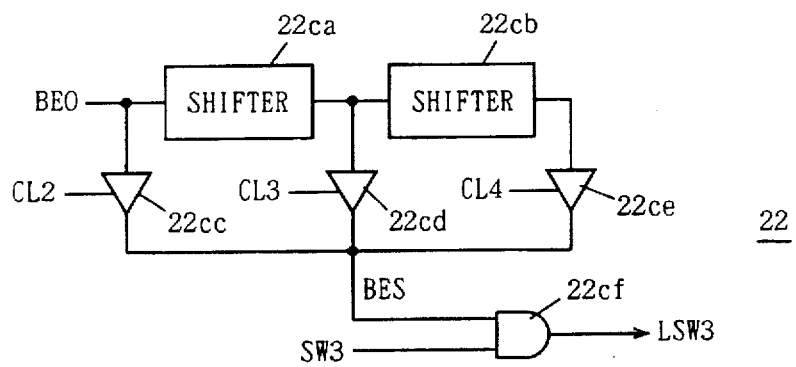
FIG. 23 schematically illustrates a still another structure of the local transfer control signal generator circuit shown in FIG. 15.

FIG. 23 schematically illustrates a part for generating the local transfer control signal LSW3 included in the local transfer control signal generator circuit 22 shown in FIG. 15. Referring to FIG. 23, the local transfer control signal generator circuit 22 includes a shifter 22ca for delaying the bank enable signal BE0 by one clock cycle period of the clock signal CLK, a shifter 22cb for delaying an output signal of the shifter 22ca by one clock cycle period of the clock signal CLK, a tri-state buffer 22cc which is activated in activation of the CAS latency data CL2 for selecting and transmitting the bank enable signal BE0, a tri-state buffer 22cd which is activated in activation of the CAS latency data CL3 for selecting and transmitting the output signal of the shifter 22ca, and a tri-state buffer 22ce which is activated in activation of the CAS latency data CL4 for selecting and transmitting an output signal of the shifter 22cb.

Outputs of the tri-state buffers 22cc, 22cd and 22ce are coupled in common to output a bank data enable signal BES.

The local transfer control signal generator circuit 22 further includes an AND circuit 22f for receiving the signal BES from any of the tri-state buffers 22cc, 22cd and 22ce and the transfer control signal SW3. The AND circuit 22cf outputs the local transfer control signal LSW3. The shifters 22ca and 22cb each are similar in structure to that shown in FIG. 10. Alternatively, a shift circuit employing NAND flip-flops may be utilized. Operations of the local transfer control signal generator circuit 22 shown in FIG. 23 are now described with reference to timing charts shown in FIGS. 24 to 26.

Figure 24:
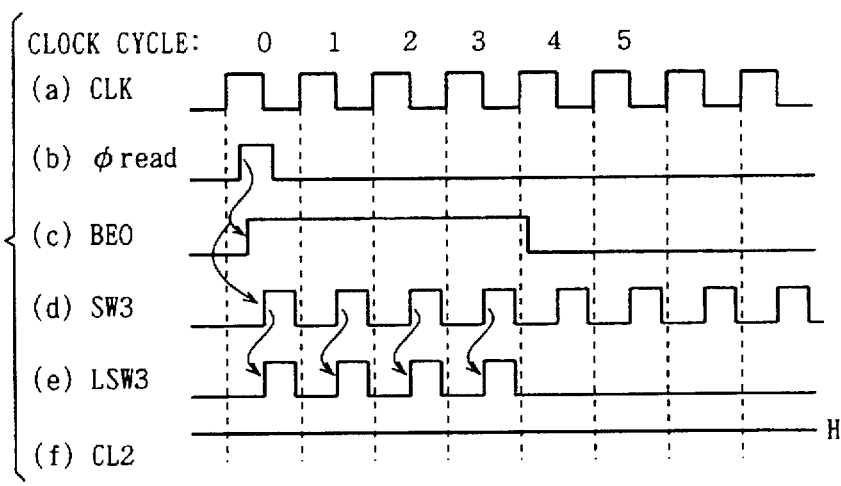
FIG. 24 is a timing chart representing operations of the local transfer control signal generator circuit shown in FIG. 23.

With reference to FIG. 24, operations in a case of CAS latency set at 2 are described. In this case, the CAS latency data CL2 is set at a high level, the tri-state buffer 22cc is activated, and the remaining tri-state buffers 22cd and 22ce are set in output high impedance states.

In a clock cycle 0, a read command is supplied, the data read operation mode instruction signal φread is activated for a prescribed period, and the bank enable signal BE0 is brought into an active state of a high level for a period of four clock cycles. The transfer control signal SW3 is successively generated from the clock cycle 0 in response to this activation of the data read operation mode instruction signal φread (or the preamplifier enable signal PAE). As shown at (e) in FIG. 24, therefore, the local transfer control signal LSW3 is activated for a period of the clock cycles 0 to 3 in synchronization with the transfer control signal SW3. The bank enable signal BE0 is brought into an inactive state of a low level in a clock cycle 4, and the local transfer control signal LSW3 maintains an inactive state of a low level after this clock cycle 4. Thus, four data are successively transmitted from the transfer gate 6a shown in FIG. 15 to the output buffer circuit 6f and successively outputted. When the CAS latency is 2, the output enable signal OE is brought into an active state of a high level and the output buffer circuit 6f is activated in a clock cycle 1.

When the CAS latency is set at 1, on the other hand, the local transfer control signal LSW3 is generated in the same timing as that in the timing chart shown in FIG. 24. In this case, the output enable signal OE is activated from the clock cycle 0.

Figure 25:
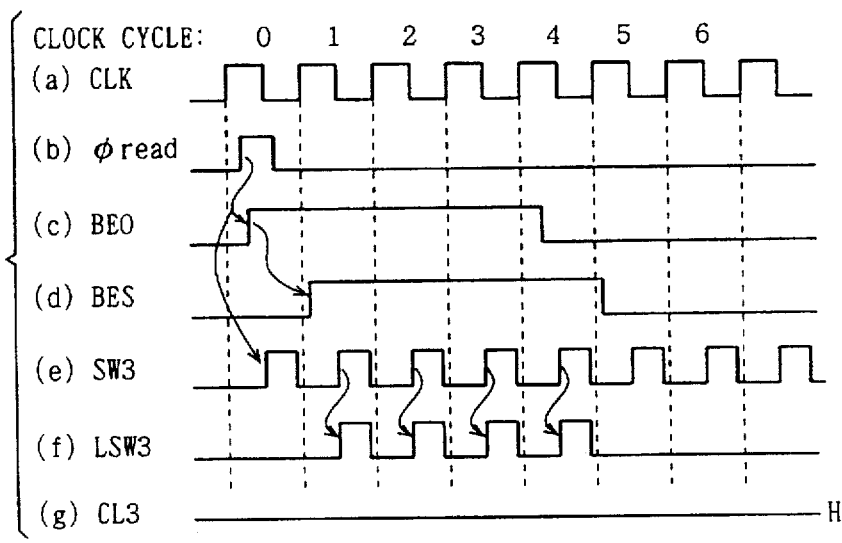
FIG. 25 is a timing chart representing operations of the local transfer control signal generator circuit shown in FIG. 23.

With reference to FIG. 25, operations in a case of he CAS latency set at 3 are now described. When the CAS latency is 3, the CAS latency data CL3 is set at a high level, the tri-state buffer 22cd is activated, and the remaining tri-state buffers 22cc and 22ce are set in output high impedance states. Therefore, the signal BES is changed in accordance with the output signal of the shifter 22ca.

In a clock cycle 0, a read command is supplied, the data read operation mode instruction signal φread is activated, and the bank enable signal BE0 is brought into an active state of a high level for a period of four clock cycles. The shifter 22ca delays the bank enable signal BE0 by one clock cycle, whereby the signal BES is brought into an active state of a high level for a period from the clock cycle 1 to a clock cycle 4. From the clock cycle 0, the transfer control signal SW3 is activated for a prescribed period in response to activation of the preamplifier enable signal PAE. In the period from the clock cycle 1 to the clock cycle 4, therefore, the local transfer control signal LSW3 is activated in accordance with this activation of the transfer control signal SW3. Thus, four data are transmitted to the output buffer circuit 6f through the transfer gate 6a shown in FIG. 15 and outputted. When the CAS latency is 3, the output enable signal OE is activated in the clock cycle 2, and valid data are brought into definite states and successively outputted on the leading edges from the clock cycle 3 on.

Figure 26:
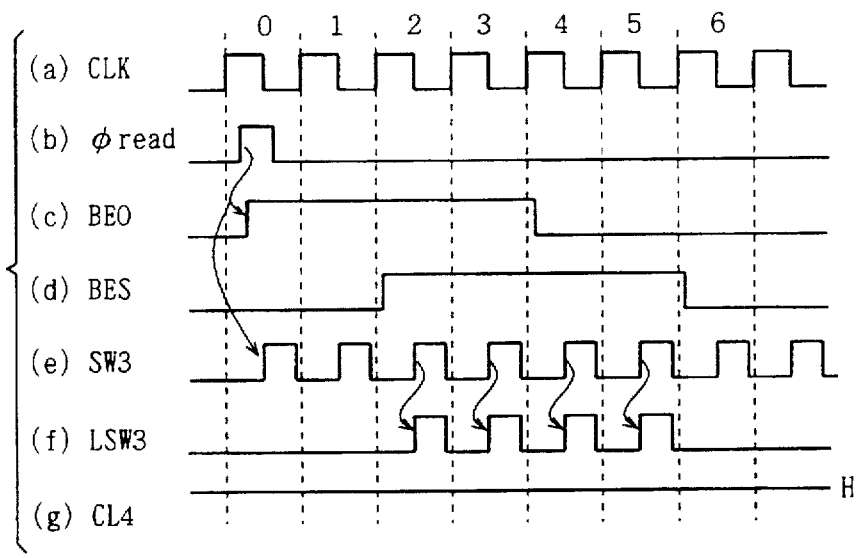
FIG. 26 is a timing chart representing operations of the local transfer control signal generator circuit shown in FIG. 23.

With reference to FIG. 26, operations in case of setting the CAS latency at 4 are described. When the CAS latency is set at 4, the CAS latency data CL4 is set at a high level, the tri-state buffer 22ce is activated, and the remaining tri-state buffers 22cc and 22cd are set in output high impedance states. Therefore, the signal BES is changed in accordance with the output signal of the shifter 22cb.

In a clock cycle 0, a read command is supplied, the data read operation mode instruction signal φread is activated, and the bank enable signal BE0 is activated for a period of four clock cycles from the clock cycle 0 to a clock cycle 3. The shifters 22ca and 22cb delay the bank enable signal BE0 by a period of two clock cycles. Therefore, the signal BES is brought into an active state of a high level from the clock cycle 2 to a clock cycle 5. From the clock cycle 0, the transfer control signal SW3 is activated in accordance with activation of the preamplifier enable signal PAE. When the CAS latency is 4, therefore, the local transfer control signal LSW3 is activated four times from the clock cycle 2. When the CAS latency is 4, the output enable signal OE is activated in the clock cycle 3. Therefore, first data is brought into a definite state on the leading edge of the clock signal CLK in the clock cycle 4.

As hereinabove described, the local transfer control signal LSW3 is activated only for a prescribed period in accordance with the CAS latency data and the burst length data in the local transfer control signal generator circuit 22, whereby only necessary data can be selected and outputted also when banks are continuously switched and accessed, and no data collision is caused on the internal read data bus 5 in the bank in bank switching. Namely, data of another bank can be transmitted to the output buffer circuit 6f in a clock cycle 6 in FIG. 26, for example.

Figure 27:
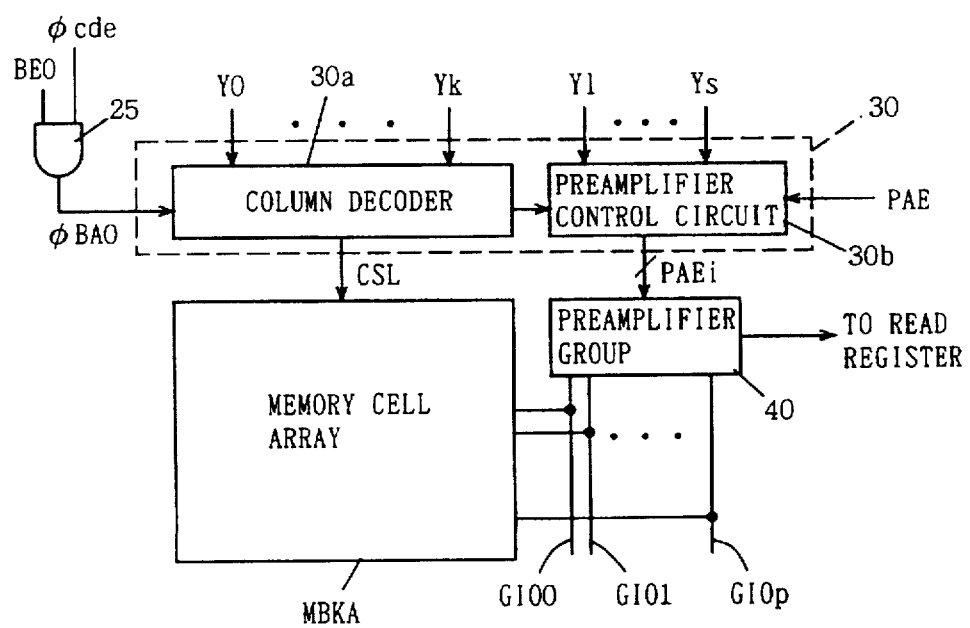
FIG. 27 schematically illustrates the structure of a column selection part of the SDRAM according to the embodiment 1 of the present invention.

FIG. 27 schematically illustrates the structure of a data read part in a single memory bank. Referring to FIG. 27, the data read part includes an AND circuit 25 for receiving a column decoder enable signal φcde from a command decoder (not shown) and the bank enable signal BE0, and a column selection circuit 30 for receiving column address signals Y0 to Yk and Y1 to Ys from a column address buffer (not shown) and outputting a signal for selecting data of a 1-bit memory cell of a memory cell array MBKA. The column selection circuit 30 is activated for decoding the supplied address signals Y0 to Yk and Y1 to Ys and outputting signals indicating the results of the decoding when an output signal of the AND circuit 25 is in an active state of a high level.

A plurality of internal data buses (global I/O buses) GIO0 to GIOp are arranged with respect to the memory cell array MBKA. These global I/O buses GIO0 to GIOp are connected simultaneously with columns of the memory cell array MBKA selected by the column selection circuit 30. A preamplifier group 40 includes preamplifiers provided for the global I/O buses GIO0 to GIOp respectively. In this preamplifier group 40, a preamplifier is selectively activated in accordance with an output signal PAEi of the column selection circuit 30, so that data of the activated preamplifier is supplied to the read register part 2 shown in FIG. 1.

The column selection circuit 30 includes a column decoder 30a which is activated, when the output signal of the AND circuit 25 is activated, for decoding the column address signals Y0 to Yk supplied from the column address buffer (not shown) and outputting a column selection signal CSL in accordance with the results of the decoding, and a preamplifier control circuit 30b which is activated, when the output signal of the AND circuit 25 is activated, for decoding the column address signals Y1 to Ys and outputting a local preamplifier enable signal PAEi for activating a preamplifier included in the preamplifier group 40 in accordance with the results of the decoding and the preamplifier enable signal PAE.

The preamplifier control circuit 30b of the column selection circuit 30 is internally provided with a burst address register (not clearly shown in particular), and the burst addresses are successively changed in a prescribed sequence in accordance with the clock signal CLK. Thus, memory cell data are simultaneously read on the global I/O buses GIO0 to GIOp and successively amplified and outputted by the preamplifier by activation of a single column selection signal CSL.

Figure 28:
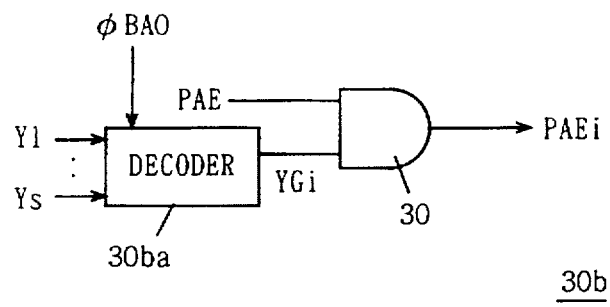
FIG. 28 schematically illustrates an exemplary structure of a preamplifier control circuit shown in FIG. 27.

FIG. 28 illustrates an exemplary structure of the preamplifier control circuit 30b shown in FIG. 27. Referring to FIG. 28, the preamplifier control circuit 30b includes a decoder 30ba which is activated in response to activation of an output signal φBA0 of the AND circuit 25 for decoding the supplied column address signals Y1 to Ys and outputting a global I/O line specifying signal YGi, and an AND circuit 30 for receiving the preamplifier enable signal PAE and the global I/O line specifying signal YGi and outputting the local preamplifier enable signal PAEi.

The decoder 30ba is an AND type decoder circuit, and the global I/O line specifying signal YGi is brought into an active state of a high level when selected.

Figure 29:
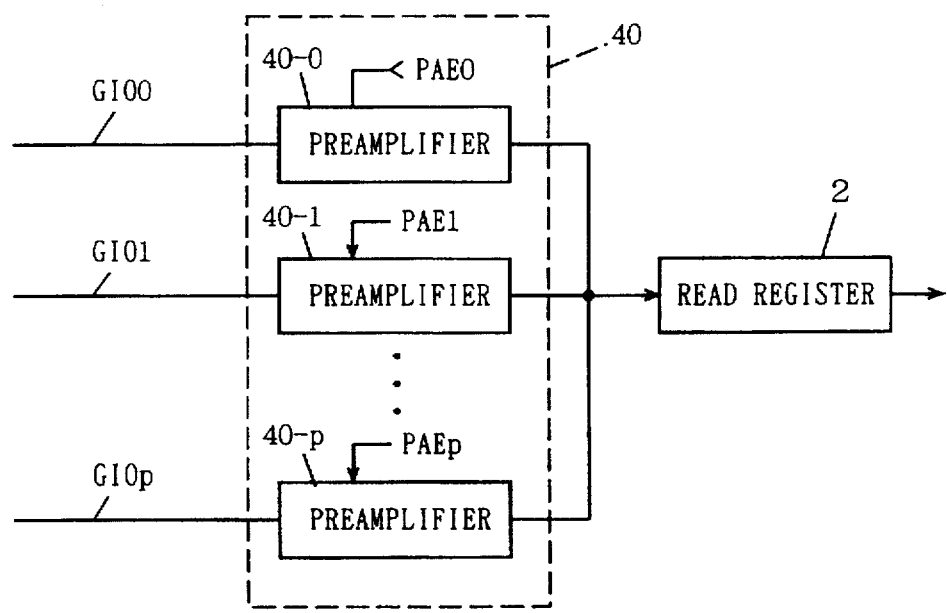
FIG. 29 schematically illustrates the structure of a preamplifier group shown in FIG. 27.

FIG. 29 schematically illustrates the structure of the preamplifier group 40 shown in FIG. 27. Referring to FIG. 29, the preamplifier group 40 includes preamplifiers 40-0 to 40-p which are provided in correspondence to the global I/O buses GIO0 to GIOp respectively and activated in response to local preamplifier enable signals PAE0 to PAEp for amplifying data on the corresponding global I/O buses GIO0 to GIOp respectively. These preamplifiers 40-0 to 40-p are brought into output high impedance states in inactivation thereof. Therefore, only data of an activated preamplifier is transmitted to the read register part 2.

Figure 30:
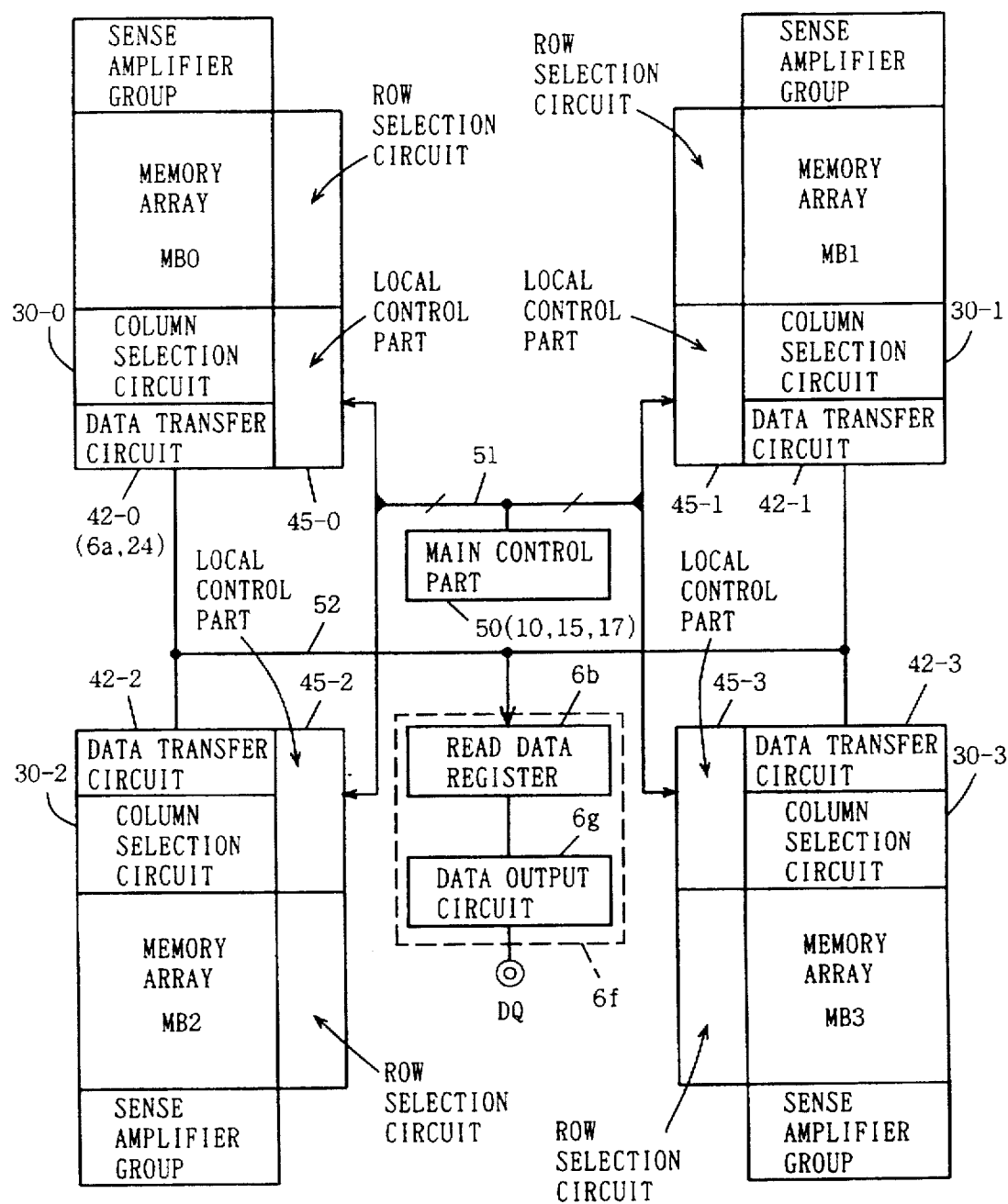
FIG. 30 schematically illustrates the overall structure of the SDRAM according to the embodiment 1 of the present invention.

FIG. 30 schematically illustrates the structure of a principal part of the SDRAM according to the embodiment 1 of the present invention. Referring to FIG. 30, the SDRAM includes four memory arrays MB0, MB1, MB2 and MB3 which are driven to active/inactive states independently of each other. Each of the memory arrays MB0 to MB3 includes a plurality of memory cells which are arranged in the form of a matrix. Column selection circuits 30-0 to 30-3 are provided in correspondence to the memory arrays MB0 to MB3 respectively. Each of the column selection circuits 30-0 to 30-3 includes the column decoder 30a and the preamplifier control circuit 30b shown in FIG. 27.

Further, data transfer circuits 42-0 to 42-3 are provided for the memory arrays MB0 to MB3 respectively for successively transferring data of selected memory cells when activated. Each of the data transfer circuits 42-0 to 42-3 includes the transfer gate 6a and the data transfer circuit 24 shown in FIG. 15. These data transfer circuits 42-0 to 42-3 are coupled in common to the read data register 6b included in the output buffer circuit 6f which is arranged at a portion between the memory arrays MB0 to MB3. The output buffer circuit 6f includes a data output circuit 6g for receiving data from the read data register 6b and successively transferring the same.

This data output circuit 6g includes the transfer gate 6c, the latch circuit 6d and the output buffer 6e shown in FIG. 1.

Further, local control parts 45-0 to 45-3 are arranged in correspondence to the memory arrays MB0 to MB3 respectively. These local control parts 45-0 to 45-3 control operations of the corresponding column selection circuits 30-0 to 30-3 and the corresponding data transfer circuits 42-0 to 42-3 respectively. The local control parts 45-0 to 45-3 are coupled in common to a main control part 50, for controlling the operations of the corresponding column selection circuits 30-0 to 30-3 and the corresponding data transfer circuits 42-0 to 42-3 in accordance with control signals from the main control part 50. The main control part 50 includes the transfer control signal generator part 10, the transfer clock generator part 15 and the bank enable circuit 17 shown in FIG. 15.

With respect to each of the memory arrays MB0 to MB3, a row selection circuit is provided for selecting a row of memory cells of the corresponding memory array when activated and a sense amplifier group is provided for sensing and amplifying memory cell data of each column of the corresponding memory array when activated.

In the structure shown in FIG. 30, the memory arrays MB0 to MB3 function as banks respectively, and this SDRAM includes four banks in total.

Only one of the local control parts 45-0 to 45-3 corresponding to a bank specified by a bank address signal is activated in accordance with a control signal from the main control part 50 arranged at the central portion, whereby the following advantages are attained.

The layout of a control signal line 51 from the main control part 50 to the local control parts 45-0 to 45-3 is symmetrical, and the control signals can be transmitted with the minimum interconnection line length. Thus, the signals can be propagated at a high speed, whereby a high-speed operation is enabled. Further, the bank enable signals based on the bank specifying signals obtained by decoding the bank address signals are utilized, whereby a charge/discharge current of the signal line 51 is reduced as compared with a structure of transmitting the bank address signals to the local control parts 45-0 to 45-3.

When the bank address signals are supplied to the local control parts 45-0 to 45-3, 4-bit complementary address signals BA0, /BA0, BA1 and /BA1 must be transmitted. In this case, therefore, two signal lines are charged in total, while two signal lines are discharged. This is regularly caused regardless of combination o:- the bank address signals, and hence charge/discharge currents of the signal lines are increased. Since the bank address signals are supplied to the local control parts 45-0 to 45-3 in common, loads of bank address signal transmission lines are increased, the bank address signals cannot be transmitted at a high speed, bank address decoding timing is retarded, and internal operation start timing is also retarded.

While four bank enable signal transmission lines are required by utilizing bank enable signals, only one bank enable signal is driven to a selected state, whereby charge/discharge currents of the signal lines are reduced. Further, the bank enable signals are transmitted to only corresponding local control parts respectively, whereby loads of the signal transmission lines are small, the bank enable signals can be transmitted to the local control parts 45-0 to 45-3 at a high speed, and the internal operation start timing is quickened.

Figure 31:
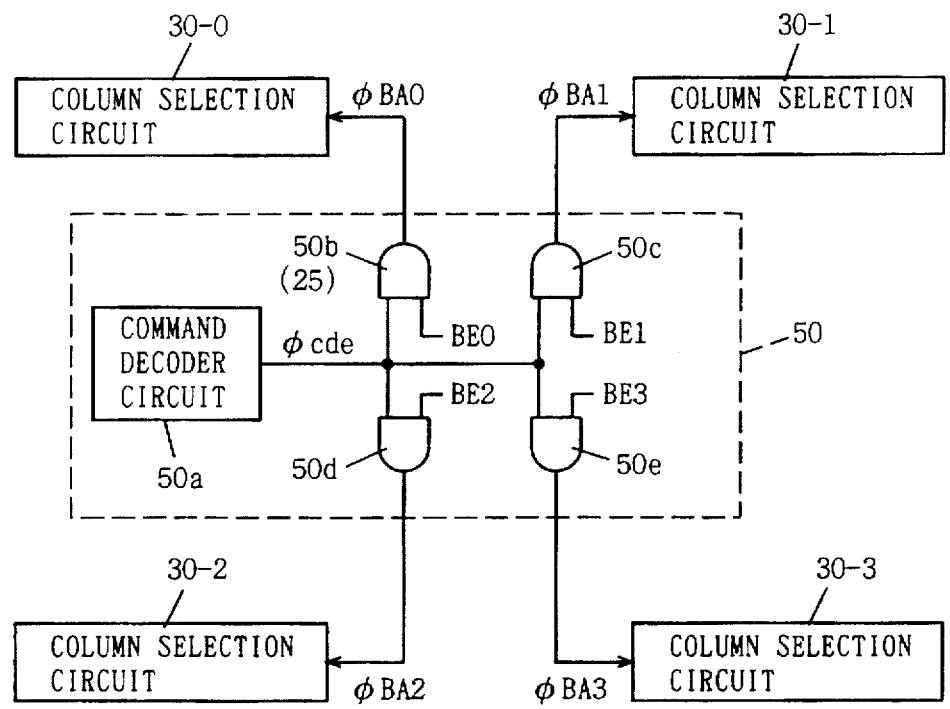
FIG. 31 schematically illustrates the arrangement of parts related to an enable signal in the arrangement shown in FIG. 30.

FIG. 31 schematically illustrates the structure of a part related to column selection included in the main control part 50 shown in FIG. 30. Referring to FIG. 31, the main control part 50 includes a command decoder circuit 50a for outputting the column decoder enable signal φcde in prescribed timing when a read command instructing data reading or a write command instructing data writing is supplied in accordance with a combination of states of supplied external control signals, an AND circuit 50b receiving the column decoder enable signal φcde and the bank enable signal BE0, an AND circuit 50c receiving the column decoder enable signal φcde and a bank enable signal BE1, an AND circuit 50d receiving the column decoder enable signal φcde and a bank enable signal BE2, and an AND circuit 50e receiving the column decoder enable signal φcde and a bank enable signal BE3.

The bank enable signals BE0 to BE3 are outputted from the bank enable circuit 17 shown in FIG. 15. A decoder enable signal φBA0 from the AND circuit 50b is supplied to the column selection circuit 30-0. A decoder enable signal φBA1 from the AND circuit 50c is supplied to the column selection circuit 30-1. A decoder enable signal φBA2 from the AND circuit 50d is supplied to the column selection circuit 30-2. A decoder enable signal φBA3 from the AND circuit 50e is supplied to the column selection circuit 30-3.

As shown in FIG. 31, the column selection circuits 30-0 to 30-3 are activated in accordance with the respective decoder enable signals φBA0 to φBA3. Loads of the outputs of the AND circuits 50b to 50e are only the corresponding column selection circuits 30-0 to 3-3 respectively, and the loads are so reduced that the decoder enable signals φBA0 to φBA3 can be activated in a faster timing in accordance with activation of the bank enable signals BE0 to BE3, and accordingly the column selection circuits 30-0 to 30-3 can be activated in a faster timing. Thus, while the column address signals are supplied to the column selection circuits 30-0 to 30-3, column selecting operations can be performed in a faster timing in respective clock cycles, and column selection can be reliably performed every clock cycle the preamplifiers are activated for amplifying and transferring the corresponding memory cell data even when the clock signal CLK is a high-speed clock signal.

The command decoder circuit 50a may merely drive input parts of the AND circuits 50b to 50e included in the main control part 50, an output load of this command decoder circuit 50a is reduced as compared with a structure of driving the column selection circuits 30-0 to 30-3 respectively, and the column decoder enable signal φcde supplied to the AND circuits 50b to 50e can be brought into a definite state in a faster timing.

In the structure shown in FIG. 31, the AND circuits 50b to 50e are arranged in the main control part 50 for ANDing the bank enable signals BE0 to BE3 with the column decoder enable signal φcde and outputting the decoder enable signals φBA0 to φBA3 respectively. Also when the AND circuits 50b to 50e are arranged in the vicinity of the column selection circuits 30-0 to 30-3 respectively in place of this shown structure, high-speed transmission of the bank enable signals BE0 and BE3 and reduction of consumed currents can be implemented in this case although the load of the command decoder circuit 50a is increased, and the effect of performing column selection in a faster timing is not damaged.

Figure 32:
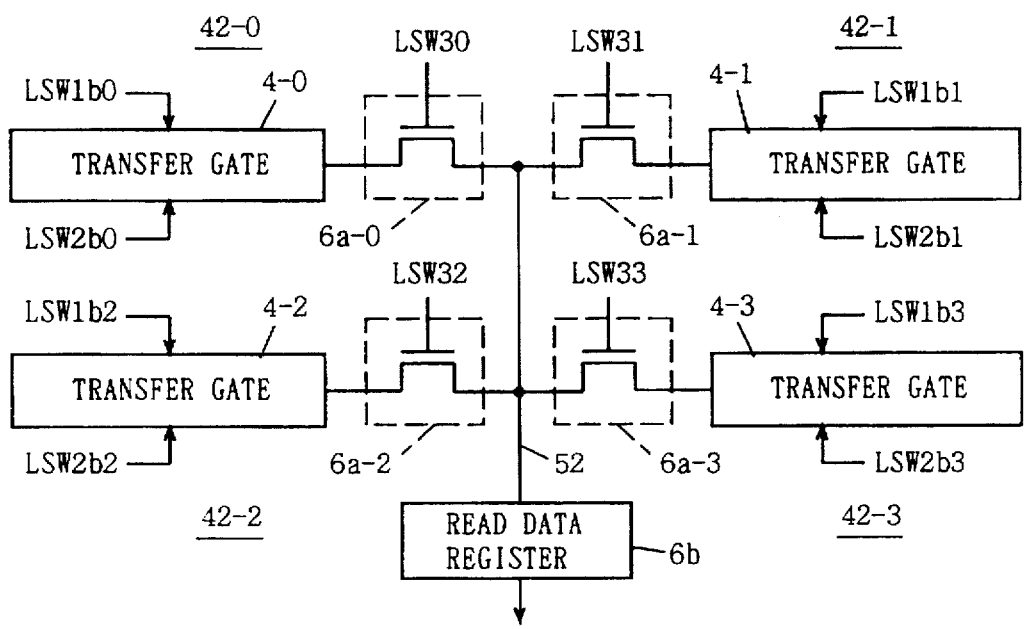
FIG. 32 schematically illustrates the arrangement of respective banks of a data transfer part according to the embodiment 1 of the present invention.

FIG. 32 schematically illustrates the structures of output parts of the data transfer circuits 42-0 to 42-3 shown in FIG. 30. Referring to FIG. 32, the data transfer circuit 42-0 includes a transfer gate 4-0 for successively transferring supplied data in response to local selection control signals LSW1b0 and LSW2b0, and a transfer gate 6a-0 which conducts in response to a local transfer control signal LSW30 for transmitting the data from the transfer gate 4-0 to the read data register 6b through an internal read data bus 52. The data transfer circuit 42-1 includes a transfer gate 4-1 for successively transferring supplied data in response to local transfer control signals LSW1b1 and LSW2b1, and a transfer gate 6a-1 which conducts in response to a local transfer control signal LSW31 for transmitting the data transferred from the transfer gate 4-1 onto the internal read data bus 52.

The data transfer circuit 42-2 includes a transfer gate 4-2 for successively transferring supplied data in response to local transfer control signals LSW1b2 and LSW2b2, and a transfer gate 6a-2 for transmitting the data supplied from the transfer gate 4-2 onto the internal read data bus 52 in response to a local transfer control signal LSW32. The data transfer circuit 42-3 includes a transfer gate 4-3 for successively transferring data of a selected memory cell to the corresponding memory bank in response to local transfer control signals LSW1b3 and LSW2b3, and a transfer gate 6a-3 for transferring the data transferred from the transfer gate 4-3 onto the internal read data bus 52 in response to a local transfer control signal LSW33.

Each of the transfer gates 4-0 to 4-3 has a structure similar to that of the transfer gate 4 shown in FIG. 1.

Conduction/non-conduction of the transfer gates 6a-0 to 6a-3 is controlled in accordance with the local transfer control signals LSW30 to LSW33 generated on the basis of the bank enable signals BE0 to BE3, whereby data can be continuously transferred on the internal read data bus 52 with no collision of the data of the plurality of banks. Particularly in page switching for selecting another word line different from a selected word line in the memory array, a column selecting operation is started in another bank in coincidence with the CAS latency, whereby memory cell data from the other bank can be continuously transmitted onto the internal read data bus 52 after reading final memory cell data of a page of a single bank onto the internal read data bus 52.

According to the embodiment 1 of the present invention, as herein above described, the path for alternately latching the output signals from the preamplifier and transferring the same is provided for each memory array, whereby data can be transferred every clock cycle even when the CAS latency is 4, and the data can be correctly read at a high speed.

[Embodiment 2]

Figure 33:
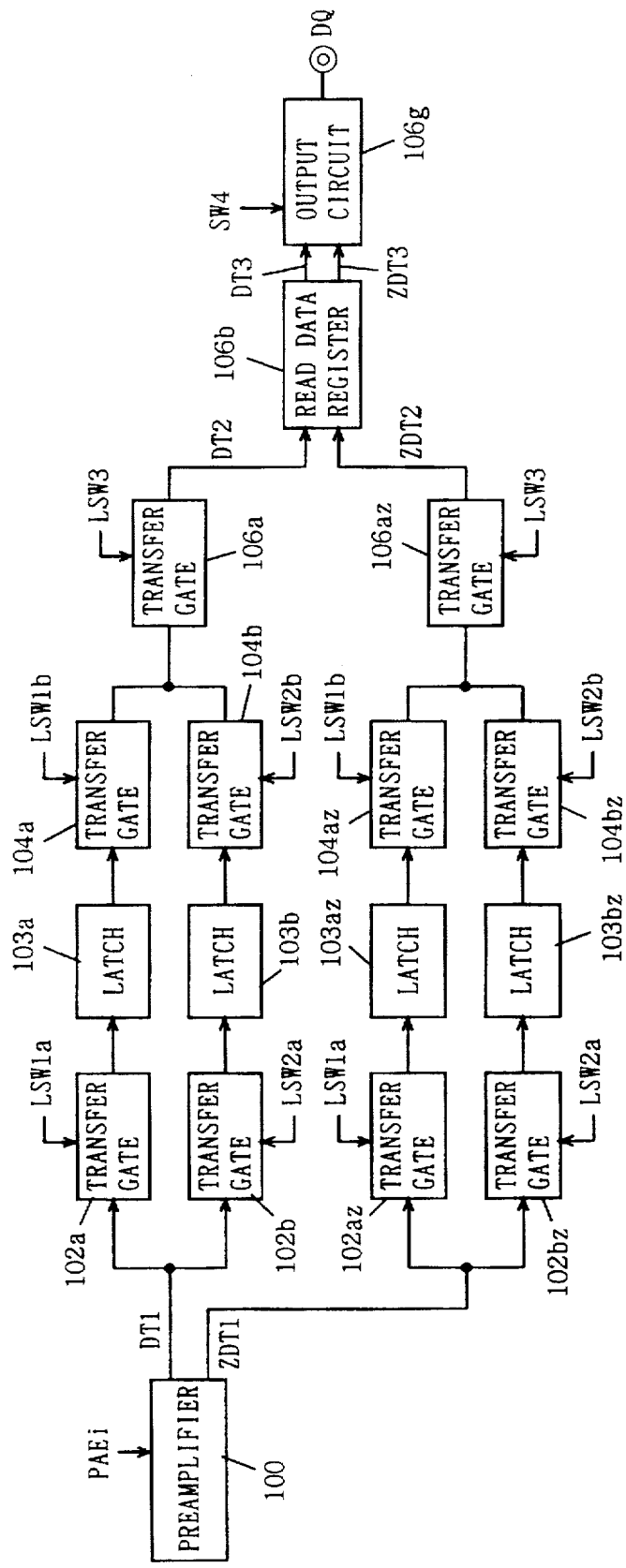
FIG. 33 schematically illustrates the structure of a data transfer part of an SDRAM according to an embodiment 2 of the present invention.

FIG. 33 schematically illustrates the structure of a data read part of an SDRAM according to an embodiment 2 of the present invention. This FIG. 33 shows a data read path with respect to a single memory bank. The structure of a transfer part shown in FIG. 33 is arranged in correspondence to each bank.

Referring to FIG. 33, the data read part of this SDRAM includes a preamplifier 100 which is activated in response to activation of a preamplifier enable signal PAEi for outputting complementary read data DT1 and ZDT1, a data transfer part 104a for alternately transferring amplified data DT1 from the preamplifier 100, and a data transfer part 104b for successively transferring the complementary read data ZDT1 from the preamplifier 100.

The data transfer part 104a includes a transfer gate 102a for passing the data DT1 from the preamplifier 100 in response to activation of a transfer control signal LSW1a, a transfer gate 102b for passing the data DT1 from the preamplifier 100 in response to activation of a transfer control signal LSW2a, a latch 103a for latching the transferred data through the transfer gate 102a, a latch 103b for latching the data transferred from the transfer gate 102b, a transfer gate 104a for transferring the data latched by the latch 103a in response to activation of a transfer control signal LSW1b, a transfer gate 104b for transferring the data latched by the latch 103b in response to activation of a transfer control signal LSW2b, and a transfer gate 106a for transferring data supplied from the transfer gate 104a or 104b in response to activation of a transfer control signal LSW3. The transfer gate 106a outputs transfer data DT2 onto an internal read data bus.

The data transfer part 104b includes a transfer gate 102az for transferring the complemental read data ZDT1 from the preamplifier 100 in response to activation of the transfer control signal LSW1a, a transfer gate 102bz for transferring the read data ZDT1 from the preamplifier 100 in response to activation of the transfer control signal LSW2a, a latch 103az for latching the data transferred from the transfer gate 102az, a latch 103bz for latching the data transferred from the transfer gate 102bz, a transfer gate 104az for transferring the latch data of the latch 103az in response to activation of the transfer control signal LSW1b, a transfer gate 104bz for transferring the data latched by the latch 103bz in response to activation of the transfer control signal LSW2a, and a transfer gate 106az for transferring the data transferred from the transfer gate 104az or 104bz in response to activation of the transfer control signaL LSW3. The transfer gate 106az transfers complemental data ZDT2 onto the internal read data bus.

The complementary data DT2 and ZDT2 from the transfer gates 106a and 106az are supplied to and latched by a read data register 106b. This read data register 106b supplies the latch data to an output circuit 106g. The output circuit 106g transfers the data latched by the read data register 106b and generates output data DQ in accordance with a transfer control signal SW4.

In the structure shown in FIG. 33, the transfer gates and the latches are identical in structure to those described with reference to the embodiment 1. Namely, data transfer circuits identical to those shown in FIG. 1 are arranged in correspondence to the complementary data DT1 and ZDT1 respectively. The read data register 106b latches and outputs complementary data. This read data register 106b corresponds to the read data register 6b in the embodiment 1. The output circuit 106g corresponds to the transfer gate 6c, the latch circuit 6d and the output buffer 6e shown in FIG. 1. A different point is that these paths transmit complementary data pair, and hence the output buffer 6e is supplied also with complemental data ZDT3 and the invertor 6ea shown in FIG. 1 is not provided. In the structure shown in FIG. 33, the transfer control signals LSW1a, LSW1b, LSW2a, LSW2b, LSW3 and LSW4 are control signals similar to those in the embodiment 1. Data can be reliably transferred even when signal amplitudes are small, by transferring the complementary data DT1 and ZDT1. The complementary data are also transferred to the output circuit 106g, whereby output data can be correctly generated even if an influence is exerted by a noise, unless the logic of the complementary data pair is changed.

Further, data can be correctly read even when internal read data has a small amplitude in a low power source voltage operation by supplying complementary data to the output circuit 106a.

[Modification]

Figure 34:
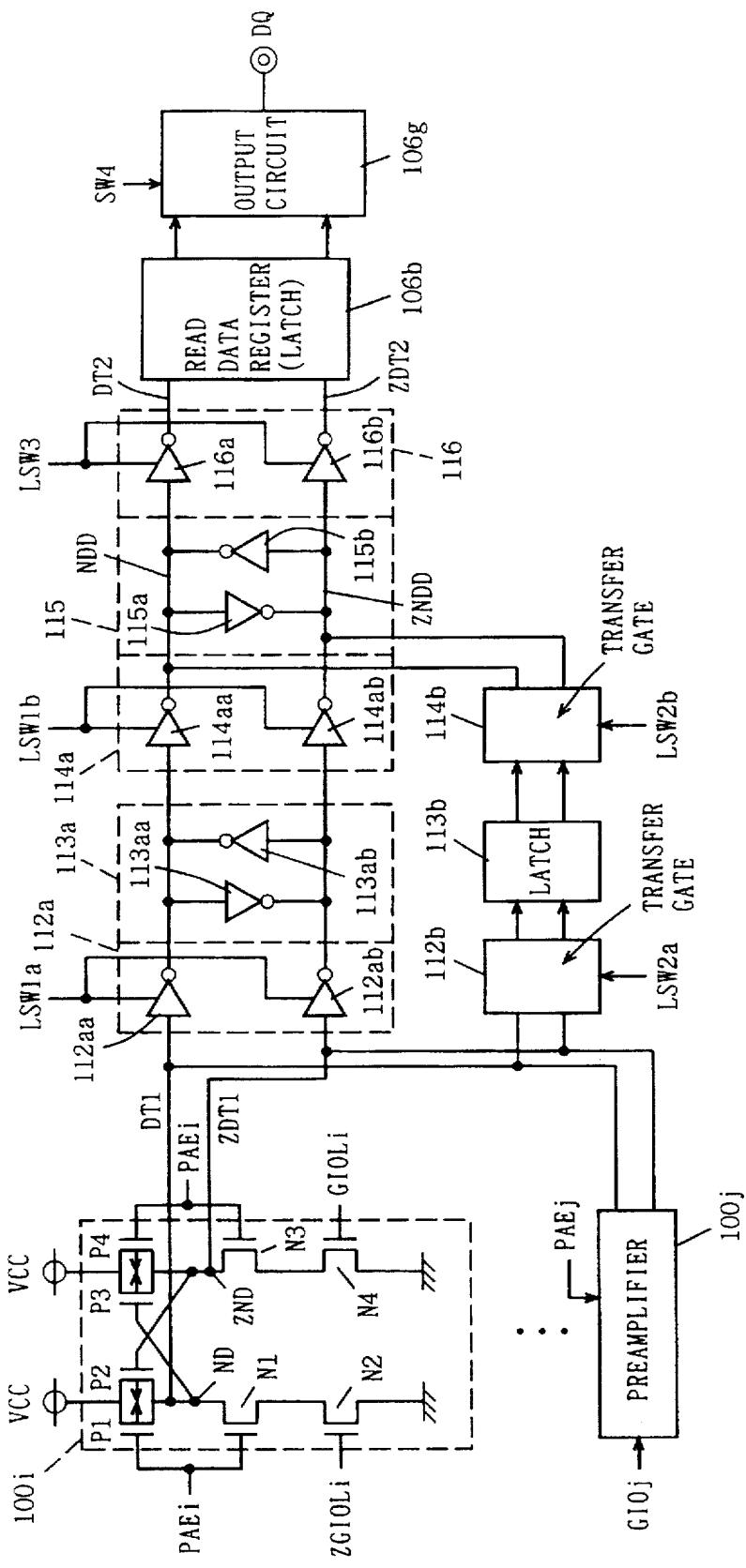
FIG. 34 illustrates an exemplary structure of the data transfer part shown in FIG. 33.

FIG. 34 illustrates the structure of a modification of the embodiment 2 of the present invention. This FIG. 34 also representatively shows a data read path from a single memory bank.

Referring to FIG. 34, a data read part is provided with a preamplifier 100i which is activated in response to activation of a preamplifier enable signal PAEi for differentially amplifying potentials on global I/O lines GIOLi and ZGIOLi and generating complementary data DT1 and ZDT1, and a preamplifier 100j which is activated in response to activation of a preamplifier enable signal PAEj for differentially amplifying a potential on a global I/O bus GIOj. Output nodes of these preamplifiers 100i and 100j are OR-connected with each other. The preamplifiers 100i and 100j are identical in structure to each other, and hence FIG. 34 specifically shows only the structure of the preamplifier 100i.

The data read part further includes a transfer gate 112a for transferring data DT1 and ZDT1 read from an activated preamplifier in response to activation of a transfer control signal LSW1a, a transfer gate 112b which is provided in parallel with the transfer gate 112a and conducts in response to activation of a transfer control signal LSW2a for transferring the data DT1 and ZDT1 from the activated preamplifier, a latch circuit 113a for latching the data transferred from the transfer gate 112a, a latch circuit 113b for latching the data transferred from the transfer gate 112b, a transfer gate 114a which conducts in response to activation of a transfer control signal LSW1b for transferring the latch data of the latch circuit 113a, a transfer gate 114b which is activated in response to activation of a transfer control signal LSW2b for transferring the latch data of the latch circuit 113b, a latch circuit 115 for latching the data transferred from the transfer gates 114a and 114b, and a transfer gate 116 which conducts in response to activation of a transfer control signal LSW3 for transferring the data latched by the latch circuit 115 to a read data register 106b.

The transfer gates 112a and 112b, the latch circuits 113a and 113b, as well as the transfer gates 114a and 114b are identical in structure to each other, and hence FIG. 34 specifically shows only the structures of the transfer gates 112a and 114a and the latch circuit 113a. The latch data of the read data register 106b is incorporated in an output circuit 106e in accordance with a transfer control signal SW4, and outputted as external read data DQ.

The preamplifier 100i includes a p-channel MOS transistor P1 which is connected between a power source node VCC and an output node ND and receives the preamplifier enable signal PAEi at its gate, a p-channel MOS transistor P2 which is connected between the power source node VCC and the output node ND and has a gate connected to an output node ZND, a p-channel MOS transistor P3 which is connected between the power source node VCC and the output node ZND and has a gate connected with the node ND, a p-channel MOS transistor P4 which is connected between the power source node VCC and the output node ZND and receives the preamplifier enable signal PAEi at its gate, n-channel MOS transistors N1 and N2 which are serially connected between the output node ND and a ground node, and n-channel MOS transistors N3 and N4 which are serially connected between the output node ZND and the ground node. The preamplifier enable signal PAEi is supplied to gates of the MOS transistors N1 and N3. A gate of the MOS transistor N2 is connected to the global I/O line ZGIOLi. A gate of the n-channel MOS transistor N4 is connected to the global I/O line GIOLi.

When the preamplifier enable signal PAEi is in an inactive state, the p-channel MOS transistors P1 and P4 are in conducting states and the n-channel MOS transistors N1 and N3 are in non-conducting states in the preamplifier 100i, and the MOS transistors P1 and P4 pull up the output nodes ND and ZND to the power source voltage VCC level. The p-channel MOS transistors P1 and P4 are merely employed as pull-up elements for preventing the output nodes ND and ZND from entering floating states, and current driving capabilities thereof are made sufficiently small.

When the preamplifier enable signal PAEi is brought to a high level of an active state, the p-channel MOS transistors P1 and P4 enter non-conducting states, while the n-channel MOS transistors N1 and N3 conduct. One of the output nodes ND and ZND is changed in potential in response to signal potentials of the global I/O lines GIOLi and ZGIOLi.

When the signal potentials on the global I/O lines GIOLi and ZGIOLi are at high and low levels respectively, the conductance of the MOS transistor N4 exceeds that of the MOS transistor N2, and the potential of the node ZND is lowered as compared with that of the node ND. Following this potential lowering of the node ZND, the p-channel MOS transistor P2 conducts to supply a current to the node ND. Following potential increase of the node ND, the p-channel MOS transistor P3 is driven to a non-conducting state, and the potential of the node ZND is further lowered. The potential of the output node ZND finally reaches a low ("L") level, and the potential level of the node ND goes high. Thus, complementary data are generated as the data DT1 and ZDT1. At this time, p-channel MOS transistors P1 and P4 are in conducting states in the other preamplifier 100j, while current driving capabilities thereof are sufficiently small and hence the data DT1 and ZDT1 are at potential levels responsive to output data of the preamplifier 100i.

The transfer gate 112a includes a clocked inverter 112aa which conducts in response to activation of the transfer control signal LSW1a for amplifying and inverting the data DT1 for outputting, and a clocked inverter 112ab which is activated in response to activation of the transfer control signal LSW1a for amplifying and inverting the complemental data ZDT1. The transfer gate 112b also has a similar structure. Even when potential changes of the complementary data DT1 and ZDT1 are small in activation of the clocked inverters 112aa and 112ab, the small potential differences are sufficiently enlarged by the amplifying operations of the clocked inverters 112aa and 112ab and transmitted to the latch circuit 113a.

The latch circuit 113a includes an inverter 113aa for inverting an output signal of the clocked inverter 112aa for transmission to an output part of the clocked invertor 112ab, and an inverter 113ab for inverting an output signal of the clocked inverter 112ab for transmission to an output part of the clocked inverter 112aa. This latch circuit 113a is the so-called inverter latch. Even if the potential difference between the output signals of the clocked inverters 112aa and 112ab is not sufficiently enlarged, the data are amplified and latched by the inverters 113aa and 113ab. Even when the potential difference between the complementary data DT1 and ZDT1 is small, the complementary data DT1 and ZDT1 are amplified and latched by the clocked inverters 112aa and 112ab and the inverters 113aa and 113b in response to activation of the transfer control signal LSW1a. Thus, the latch data of the latch circuit 113a can be correctly brought into a definite state quickly. The latch circuit 113b is identical in structure to the latch circuit 113a.

The transfer gate 114a includes a clocked inverter 114aa which is activated in response to activation of the transfer control signal LSW1b for inverting, amplifying and transmitting the output signal of the inverter 113ab, and a clocked inverter 114ab which is activated in response to activation of the transfer control signal LSW1b for amplifying, inverting and transmitting the output signal of the inverter 113aa.

The latch circuit 115 includes an inverter 115a for inverting a signal potential on a node NDD for transmission to a node ZNDD, and an inverter 115b for inverting a signal potential on the node ZNDD for transmission to the node NDD. The complementary data DT1 and ZDT1 from the transfer gates 114a and 114b are transmitted to the latch circuit 115. When one of the transfer gates 114a and 114b is activated, the other transfer gate is in an inactive state. Therefore, no data collision is caused in this latch circuit 115. Further, the latching ability of the latch circuit 115 is rendered sufficiently smaller than the driving capability of the clocked inverters 114aa and 114ab included in the transfer gates 114a and 114b.

The transfer gate 116 includes a clocked inverter 116a which is activated in response to activation of the transfer control LSW3 for amplifying and inverting the signal potential on the node NDD for transmission to the read data register 106b, and a clocked inverter 116b which is activated in response to activation of the transfer control signal LSW3 for amplifying and inverting the signal potential on the node ZNDD for transmission to the read data register 106b.

Due to the employment of the clocked inverters 116a and 116b and the latch circuit 115, the potentials of the nodes NDD and ZNDD are ascertained at a high speed by the latch circuit 115 which is formed by the inverters 115a and 115b by supplying complementary data to the latch circuit 15, even when signal amplitudes are small. Thus, the potentials of the nodes NDD and ZNDD can be brought into definite states at the power source and ground voltage levels respectively in a faster timing.

When the structure of transferring complementary data shown in FIG. 34 is employed, latch data can be brought into definite states at a high speed by amplifying small signal amplitudes, resulting in high-speed data transfer. When noises are caused, noises which are in phase with each other are superimposed on the complementary data, whereby relative potential difference between the complementary data remains unchanged and the data can be correctly transferred and latched.

According to the embodiment 2 of the present invention, as hereinabove described, complementary data are successively transmitted from the preamplifier 100, whereby latch data can be brought into definite states quickly by transmitting small amplitude signals at a high speed, and high-speed operations are enabled. When noises or the like are caused, they are in phase with each other for the complementary data, and hence the data can be correctly transferred and latched.

The preamplifiers 100i and 100j may have other structures different from the so-called dynamic latch type preamplifiers. Further, a latch circuit may be provided in common to the output nodes of the preamplifiers 100i and 100j. In this case, the latch circuit is a NAND latch circuit, so that potential levels of latch data remain unchanged when the data DT1 and ZDT1 are in precharge states of high ("H") levels.

[Embodiment 3]

Figure 35:
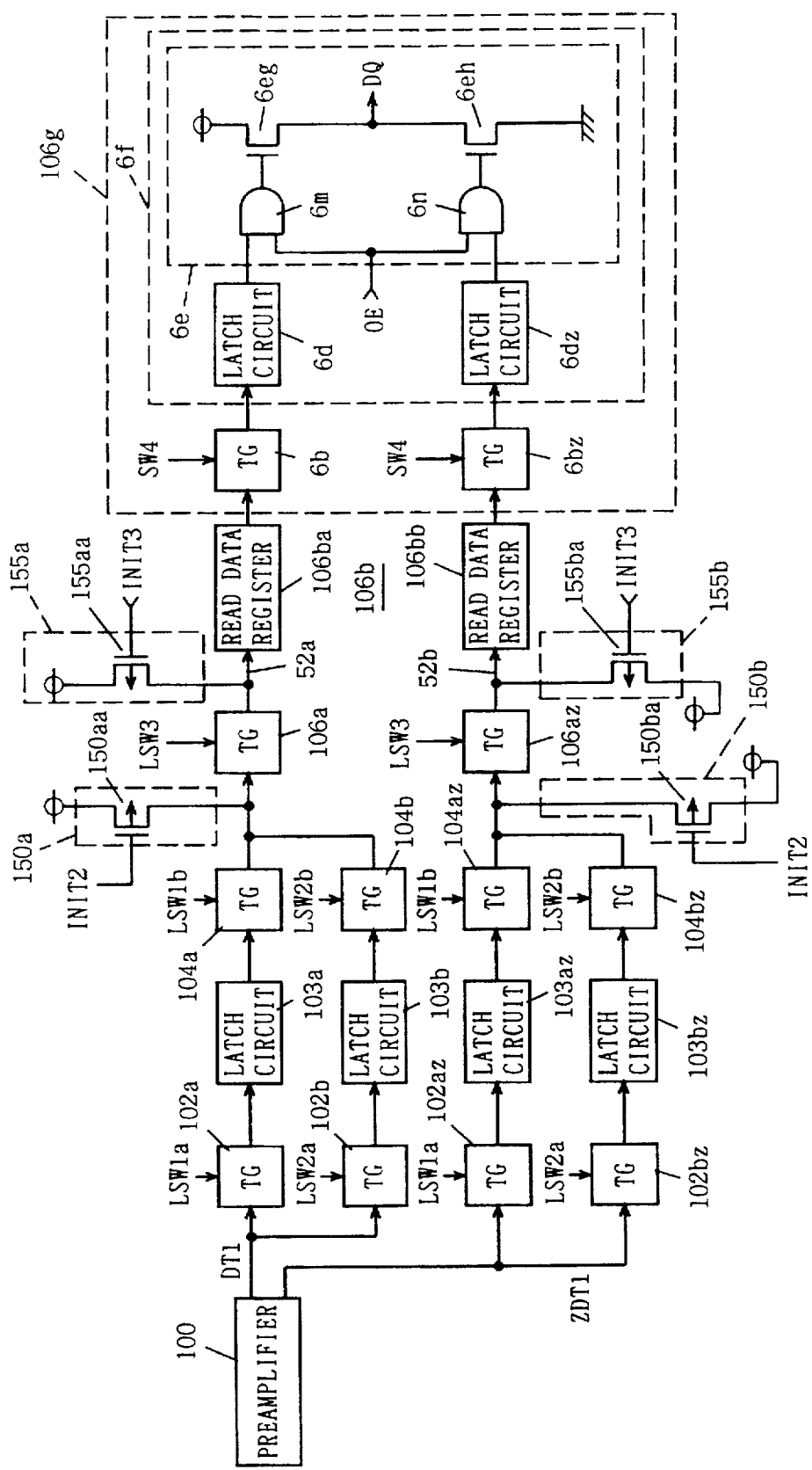
FIG. 35 schematically illustrates the structure of a data transfer part of an SDRAM according to an embodiment 3 of the present invention.

FIG. 35 illustrates the structure of a principal part of an SDRAM according to an embodiment 3 of the present invention. In the structure shown in FIG. 35, parts corresponding to those of the structure shown in FIG. 33 are denoted by the same reference numerals, to omit the description thereof. FIG. 35 schematically illustrates the internal structure of an output circuit 106g. This output circuit 106g includes a transfer gate (TG) 6b for transferring latch data of a read data register 106ba in response to activation of a transfer control signal SW4, a transfer gate (TG) 6bz for transferring latch data of a read data register 106bb in response to activation of the transfer control signal SW4, and an output buffer circuit 6f for latching the data supplied through the transfer gates 6b and 6bz and generating output data DQ in accordance with the latch data in response to activation of an output enable signal OE. The read data registers 106ba and 106bb are included in a read register 106b corresponding to that shown in FIG. 33.

The output buffer circuit 6f includes latch circuits 6d and 6dz for latching the data supplied through the transfer gates 6b and 6bz respectively, and an output buffer 6e for generating the output data DQ in accordance with the data latched by the latch circuits 6d and 6dz in response to activation of the output enable signal OE.

This output buffer 6e includes an AND circuit 6m receiving the latch data of the latch circuit 6d and the output enable signal OE, an AND circuit 6n receiving the latch data of the latch circuit 6dz and the output enable signal OE, an n-channel MOS transistor 6eg for driving an output node to a power source voltage VCC level and outputting the data DQ of a high level when an output signal of the AND circuit 6m is at a high level, and an n-channel MOS transistor 6eh which conducts when an output signal of the AND circuit 6n is at a high level for discharging the output node and generating the output data DQ of a low level.

The SDRAM according to the embodiment 3 shown in FIG. 35 further includes an initialization gate 150a for precharging a signal line (internal data bus line) between transfer gates 104a and 106a to a prescribed potential (power source voltage level) in response to an initialization instruction signal INIT2, an initialization gate 150b which is provided for a signal line between transfer gates 104az and 106az and activated in response to the initialization instruction signal INIT2 for precharging this signal line to a prescribed potential (power source voltage level), an initialization gate 155a for precharging a signal line (internal read data bus line) 52a between the transfer gate 106a and the read data register 106ba to a prescribed potential (power source voltage VCC level) in response to activation of an initialization instruction signal INIT3, and an initialization gate 155b for precharging a signal line 52b between the transfer gate 106az and the read data register 106bb to a prescribed potential (power source voltage level) in response to activation of the initialization instruction signal INIT3.

The initialization gate 150a is formed by a p-channel MOS transistor 150aa the initialization instruction signal INIT2 at its gate. The initialization gate 150b includes a p-channel MOS transistor 150ba receiving the initialization instruction signal INIT2 at its gate. The initialization gate 155a includes a p-channel MOS transistor 155aa receiving the initialization instruction signal INIT3 at its gate. The initialization gate 155b includes a p-channel MOS transistor 155ba receiving the initialization instruction signal INIT3 at its gate. In case of transferring complementary data, the signal potential difference can be enlarged at a high speed in transfer of data by precharging data signal transmission lines for a prescribed period after transfer of the data, whereby high-speed data transfer is enabled.

While the initialization gates are provided for transmitting complementary data in FIG. 35, such initialization gates may be provided in a structure of transmitting not complementary data but only single data.

Figure 36:
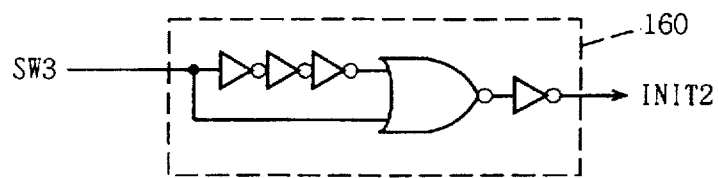
FIG. 36 illustrates an exemplary structure of an initialization instruction signal INIT2 generator part shown in FIG. 35.
Figure 37:
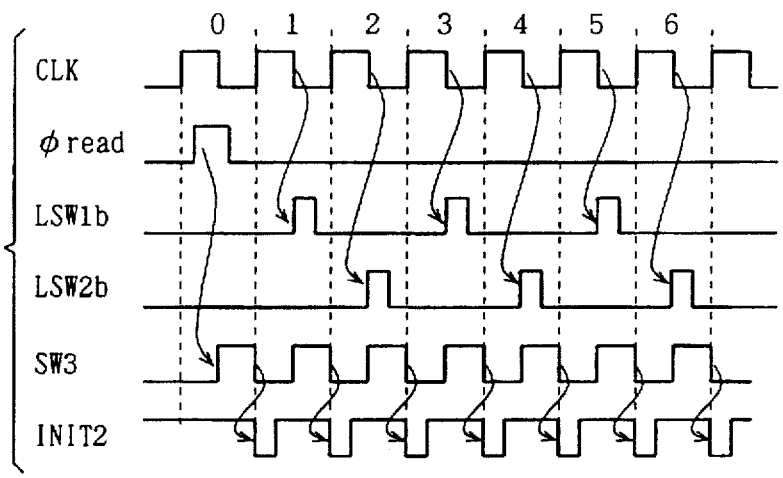
FIG. 37 is a timing chart representing operations of the initialization instruction signal generator part shown in FIG. 35.

FIG. 36 illustrates the structure of a part for generating the initialization instruction signal INIT2. Referring to FIG. 36, an initialization instruction signal INIT2 generator circuit includes a one-shot pulse generator circuit 160 for generating a pulse having a pulse width falling to a low level for a prescribed time in response to fall of a transfer control signal SW3. This one-shot pulse generator circuit 160 includes odd number of stages (three stages in FIG. 36) of invertors for inverting and delaying the transfer control signal SW3, a NOR gate receiving an output of the last stage of the invertor and the transfer control signal SW3, and an invertor for inverting an output signal of the NOR gate. Operations of the one pulse generator circuit 160 shown in FIG. 36 are now described with reference to a timing chart shown in FIG. 37.

In a clock cycle 0, a read command is supplied, and a data read instruction signal φread is brought into an active state of a high level for a prescribed period. In accordance with this read command, the transfer control signal SW3 rises in synchronization with fall of a clock signal CLK from the clock cycle 0. This transfer control signal SW3 is generated from a main control circuit. In synchronization with fall of the transfer control signal SW3, the initialization instruction signal INIT2 enters an active state of a low level for a prescribed period. Thus, the MOS transistors 150aa and 150ba included in the initialization gates 150a and 150b conduct, and output nodes of the transfer gates 104a and 104az are precharged to the power source voltage level.

When the initialization instruction signal INIT2 returns to a high level, a local transfer control signal LSW1b is brought into a high level of an active state in a clock cycle 1. Thereafter the initialization instruction signal INIT2 enters an active state of a low level in synchronization with fall of the transfer control signal SW3 in each clock cycle. After the initialization instruction signal INIT2 returns to an inactive state, the local transfer control signal LSW1b or LSW2b enters a high level of an active state. After completion of data transfer operations by the transfer gates 106a and 106az, therefore, the initialization gates 150a and 150b are activated and the output nodes of the transfer gates 104a and 104az are precharged to the power source voltage level, thereafter the transfer gates 104a and 104az conduct. Thus, signals can be transmitted at a high speed in transmission of complementary signals.

Figure 38:
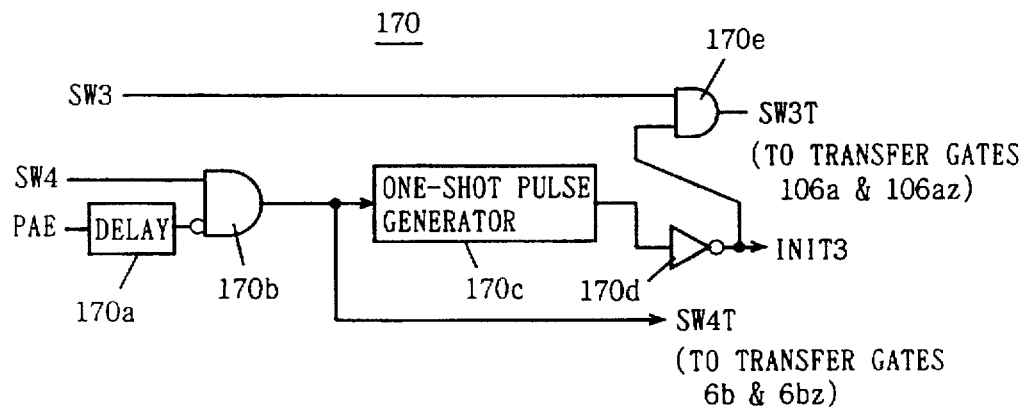
FIG. 38 illustrates an exemplary structure of a part generating an initialization instruction signal INIT3, shown in FIG. 35.

FIG. 38 schematically illustrates the structure of an initialization instruction signal INIT3 generator part 170. Referring to FIG. 38, the initialization instruction signal INIT3 generator part 170 includes a delay circuit 170a for delaying a preamplifier enable signal PAE for a prescribed time, a gate circuit 170b receiving the transfer control signal SW4 and an output signal of the delay circuit 170a, a one-shot pulse generator circuit 170c for generating a one-shot pulse having a pulse width of a prescribed time in response to fall of an output signal of the gate circuit 170b, an inverter circuit 170d for inverting the output signal of the one-shot pulse generator circuit 170c, and an AND circuit 170e receiving an output signal of the inverter 170d and the transfer control signal SW3.

Figure 39:
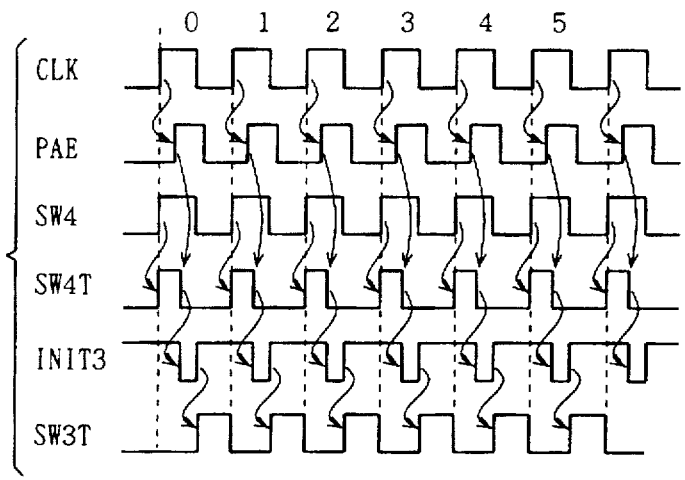
FIG. 39 is a timing chart representing operations of the circuit shown in FIG. 38.

A transfer control signal SW3T from the AND circuit 170e is supplied to a local transfer control signal generator part of each bank in place of the transfer control signal SW3. Namely, this transfer control signal SW3 is replaced by the transfer control signal SWT. The gate circuit 170b outputs a high-level signal when the output signal of the delay circuit 170a is at a low level and the transfer control signal SW4 is at a high level. An output signal SW4T of the gate circuit 170b is supplied to the transfer gates 6b and 6bz of the output circuit 106g in place of the transfer control signal SW4. The structure of this one-shot pulse generator circuit 170c is identical to that of the one-shot pulse generator circuit 160 employed for generating the initialization instruction signal INIT2 shown in FIG. 36. Operations of the initialization instruction signal generator part 170 shown in FIG. 38 are now described with reference to a timing chart shown in FIG. 39.

When a read command is supplied in a clock cycle 0, the preamplifier enable signal PAE is activated for a prescribed time in response to rise of the clock signal CLK in each clock cycle. The delay circuit 170a delays this preamplifier enable signal PAE by a prescribed time. The transfer control signal SW4 is a signal synchronous with the clock signal CLK, which rises in synchronization with rise of the clock signal CLK when the read command is supplied. Thus, the gate circuit 170b outputs a pulse signal which rises in response to the rise of the transfer control signal SW4 and goes high when the delayed signal of the preamplifier enable signal PAE rises.

When this output signal SW4T from the gate circuit 170b falls, the one-shot pulse generator circuit 170c generates a pulse signal having a prescribed time width. Thus, the initialization instruction signal INIT3 from the inverter 170d is brought into an active state of a low level for a prescribed time. When the transfer gates 6b and 6bz are activated to perform transfer operations and thereafter enter non-conducting states, the initialization instruction signal INIT3 is activated to precharge input nodes of the read data registers 106ba and 106bb to a prescribed potential (power source voltage level).

While the initialization instruction signal INIT3 is at a low level, the transfer control signal SW3T remains at a low level. When precharge operations by the initialization gates 155a and 155b are completed, the initialization instruction signal INIT3 returns to a high level. Thus, the transfer control signal SW3T rises to a high level in accordance with the transfer control signal SW3 and the high-level initialization instruction signal INIT3. This operation is repeated in each clock cycle.

When data are incorporated by the transfer gates 6b and 6bz and latched by the latch circuits 6d and 6dz and then the transfer gates 6b and 6bz enter non-conducting states in the output circuit 106g, therefore, the input nodes of the read data registers 106ba and 106bb are initialized. After completion of this initialization, the transfer control signal SW3T is activated, the transfer control signals SW3 and LSW3 are activated in response, and the transfer gates 106a and 106az conduct. Therefore, new data are transmitted to the read data registers 106ba and 106bb through the transfer gates 106a and 106az after completion of the initialization operation. Thus, transfer data are prevented from being destructed by the initialization operation.

As described, data, particularly complementary data, can be correctly transferred by precharging the respective signal lines at the prescribed potential in data transfer. Particularly in case of receiving complementary data and generating output data in the output circuit 106g, a signal of one logic is merely changed from the precharge potential, and the output data can be correctly generated at a high speed.

[Modification]

Figure 40:
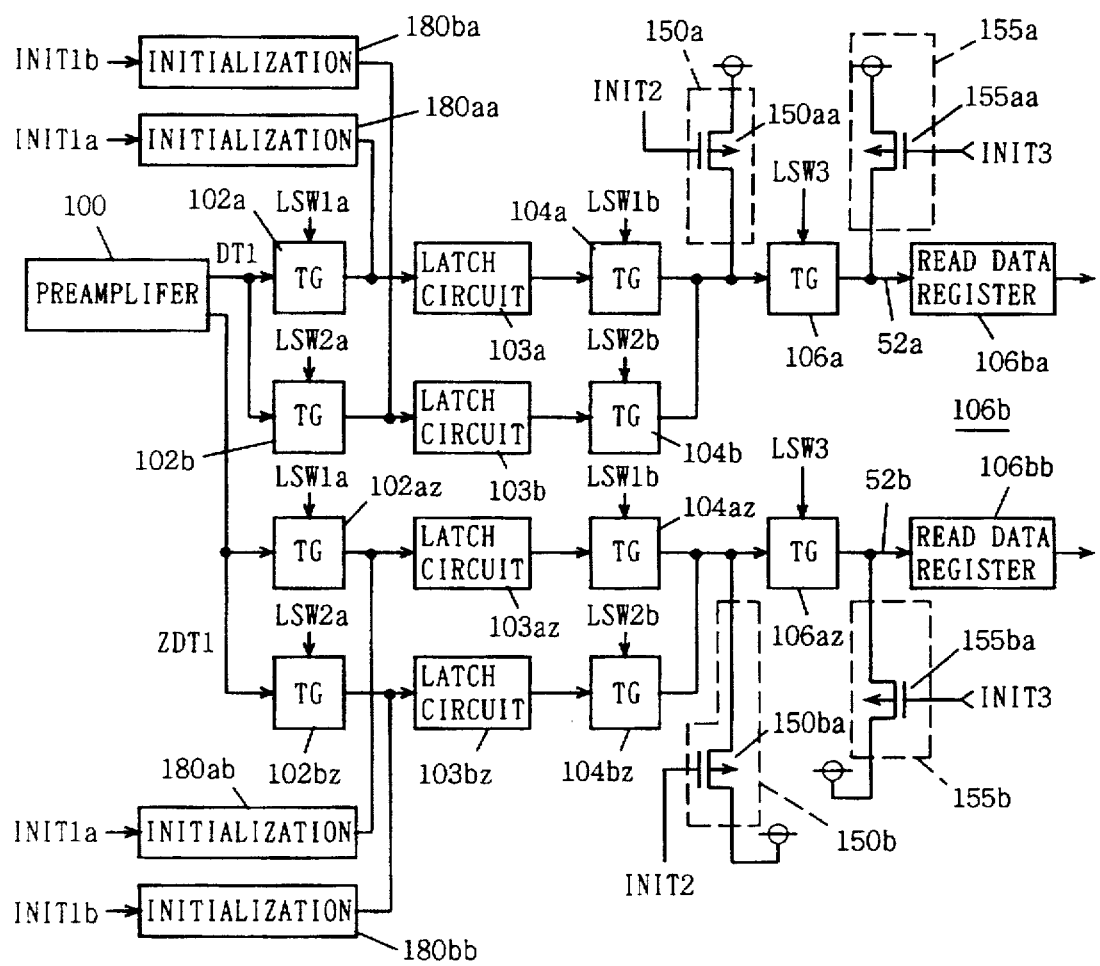
FIG. 40 schematically illustrates the structure of a modification of the embodiment 3 according to the present invention.

FIG. 40 illustrates the structure of a modification of the embodiment 3 according to the present invention. This FIG. 40 shows the structure of a data transfer part of a single memory array. Referring to FIG. 40, the data transfer part includes an initialization gate 180aa for precharging an input node of a latch circuit 103a to a prescribed potential (power source voltage level) in response to activation of an initialization instruction signal INIT1a, an initialization gate 180ba which is activated in response to activation of an initialization instruction signal INIT1b for precharging an input node of a latch circuit 103b to a prescribed potential (power source voltage level), an initialization gate 180ab for precharging an input node of a latch circuit 103az to a prescribed potential in response to activation of the initialization instruction signal INIT1a, and an initialization gate 180bb for precharging an input node of a latch circuit 103bz to a prescribed potential in response to activation of the initialization instruction signal INIT1b.

The remaining structure is identical to that shown in FIG. 35, and parts corresponding to those in FIG. 35 are denoted by the same reference numerals, to omit the description thereof. The initialization gates 180aa, 180ab, 180ba and 180bb, which are identical in structure to the initialization gates 150a, 150b, 155a and 155b, are formed by p-channel MOS transistors, for example.

When data transfer operations by transfer gates 104a and 104az are completed, the initialization gates 180aa and 180ab are activated for a prescribed period in response to fall of a local transfer control signal LSW1b. When data transfer operations by transfer gates 104b and 104bz are completed, the initialization gates 180ba and 180bb are activated for a prescribed period in response to fall (inactivation) of a local transfer control signal LSW2b. Thus, data from a preamplifier 100 can be transferred to latch circuits 103a, 103b, 103az and 103bz through transfer gates 102a, 102b, 102az and 102bz at a high speed, to be latched therein.

Figure 41:
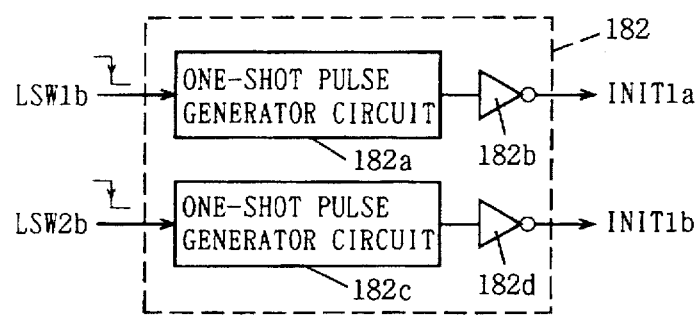
FIG. 41 schematically illustrates the structure of an initialization instruction signal generator part shown in FIG. 40.

FIG. 41 illustrates the structure of a part for generating the initialization instruction signals INIT1a and INIT1b shown in FIG. 40. Referring to FIG. 41, an initialization instruction signal generator part 182 includes a one-shot pulse generator circuit 182a for generating a one-shot pulse in response to fall of the local transfer control signal LSW1b, an inverter 182b for inverting the output signal of the one-shot pulse generator circuit 182a, a one-shot pulse generator circuit 182c for generating a one-shot pulse signal having a prescribed time width in response to fall of the local transfer control signal LSW2b, and an inverter 182d for inverting the output signal of the one-shot pulse generator circuit 182c.

Figure 42:
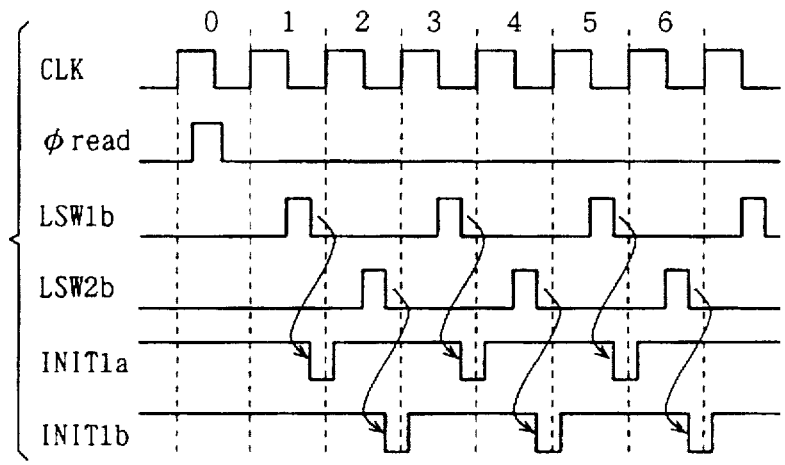
FIG. 42 is a timing chart representing operations of the circuit shown in FIG. 41.

The inverter 182b outputs the initialization instruction signal INIT1a, and the inverter 182d outputs the initialization instruction signal INIT1b. The one-shot pulse generator circuits 182a and 182c are similar in structure to the one-shot pulse generator circuit 160 for generating the initialization instruction signal INIT2 shown in FIG. 36. Operations of the initialization instruction signal generator part 182 are now described with reference to a timing chart shown in FIG. 42.

In a clock cycle 0, a read command is supplied, and a data read operation instruction signal φread is activated for a prescribed time. When this read command is supplied, the local transfer control signals LSW1b and LSW2b are alternately activated in and after a clock cycle 1. In response to fall of the local transfer control signal LSW1b, the one-shot pulse generator circuit 182a generates a pulse signal, and the initialization instruction signal INIT1a is brought into an active state of a low level for a prescribed time in accordance with the output signal of the inverter 182b. In response, the initialization gates 180aa and 180ab are activated, to precharge the input nodes of the latch circuits 103a and 103az at a prescribed potential. When the local transfer control signal LSW2b is in an active state, on the other hand, the one-shot pulse generator circuit 182c and the inverter 182d bring the initialization instruction signal INIT1b into an active state of a low level for a prescribed time in response to fall of the local transfer control signal LSW2b. Thus, the initialization gates 180ba and 180bb shown in FIG. 40 are activated, and the input nodes of the latch circuits 103b and 103bz are precharged to the prescribed potential.

Namely, when the local transfer control signals LSW1b and LSW2b are alternately activated from a clock cycle 1, the initialization instruction signals INIT1a and INIT1b are brought into active states of low levels for prescribed times respectively in response to fall of the local transfer control signals LSW1b and LSW2b. After completion of data transfer by the transfer gates 104a, 104b, 104az and 104bz, the input nodes of the latch circuits 103a, 103b, 103az and 103bz are precharged to the prescribed potential.

When the CAS latency is not 4, initialization is performed only on paths performing data transfer. When the CAS latency is not 4, a single local transfer control signal is activated in each clock cycle. However, each initialization instruction signal is activated while the local transfer control signals LSW1b and LSW2b are in inactive states as clearly understood from the timing chart shown in FIG. 42, and no collision of an initialization operation and a data latch operation is caused also when the CAS latency is not 4.

While complementary data are transferred also in the structure shown in FIG. 40, the structure of precharging each latch input node to a prescribed potential may be employed also in case of transmitting only single data.

Signal potentials of data can be changed at a high speed and latch states can be established at a high speed by precharging each node to the prescribed potential in data transfer.

[Embodiment 4]

Figure 43:
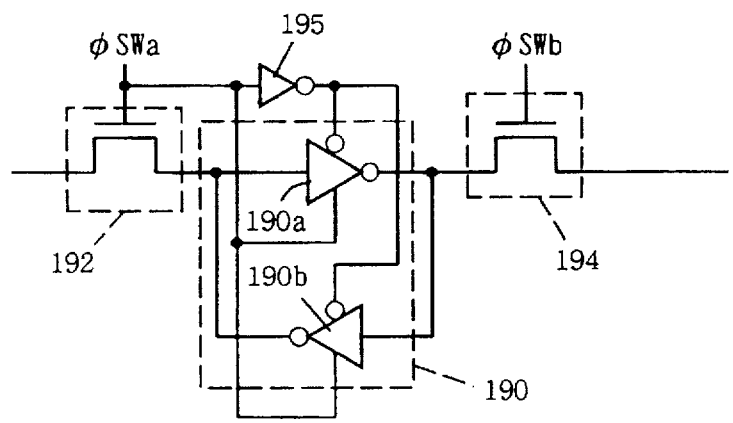
FIG. 43 schematically illustrates the structure of a principal part of an SDRAM according to an embodiment 4 of the present invention.

FIG. 43 illustrates the structure of a principal part of an SDRAM according to an embodiment 4 of the present invention. This FIG. 43 shows the structure of a latch circuit 190 of a data read part. This latch circuit 190 may be any of those provided on the read part. Therefore, transfer control signals are indicated as signals φSWa and φSWb. Referring to FIG. 43, this latch circuit 190 latches data transferred through a transfer gate 192 which conducts in response to the transfer control signal φSWa. The latch data of the latch circuit 190 is transferred through a transfer gate 194 which conducts in response to the transfer control signal φSWb.

The latch circuit 190 includes clocked CMOS inverters 190a and 190b which are activated in response to the transfer control signal φSWa and an inverted transfer control signal supplied from an inverter 195. The clocked CMOS inverter 190a inverts the data supplied through the transfer gate 192 for supply to the transfer gate 194 when activated. The clocked CMOS inverter 190b inverts the output signal of the clocked CMOS inverter 190a for transmission to an input part of the clocked CMOS inverter 190a when activated. These clocked CMOS inverters 192a and 192b are activated when the transfer control signal φSWa is in an active state of a high level. When the transfer control signal φSWa goes to a low level of an inactive state, the clocked CMOS inverters 190a and 190b are brought into output high impedance states.

When data is supplied through the transfer gate 192, therefore, the clocked CMOS inverters 190a and 190b are activated to latch the transferred data. Thus, the latch circuit 190 can reliably latch supplied data at a high speed. When the transfer control signal φSWa is inactivated, the clocked CMOS inverters 190a and 190b enter inactive output high impedance states. The transfer gate 194 is not yet in a conducting state in this state, whereby the latch circuit 190 latches the data with no problem. When a load of a signal line for the data transmitted through the transfer gate 194 is heavy, the data can be reliably transferred at a high speed by forming the transfer gate 194 by a clocked CMOS inverter.

[Modification 1]

Figure 44:
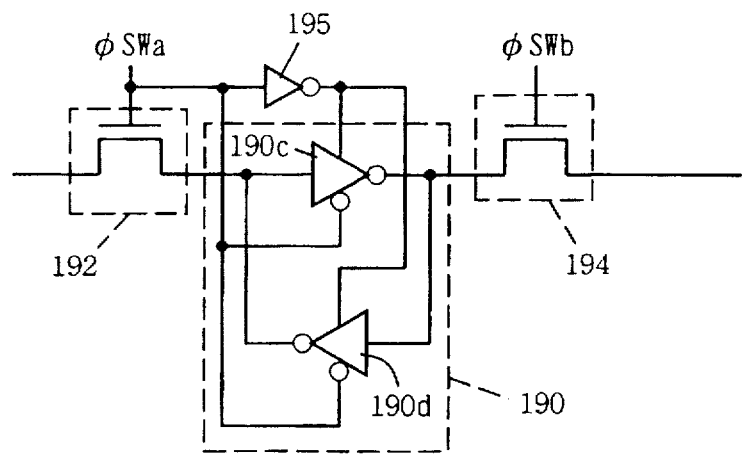
FIG. 44 schematically illustrates the structure of a modification 1 of the embodiment 4 according to the present invention.

FIG. 44 illustrates the structure of a modification 1 of the embodiment 4 according to the present invention. Referring to FIG. 44, a latch circuit 190 includes clocked CMOS inverters 190c and 190d which are set in output high impedance states when a transfer control signal φSWa is in an active state of a high level. The clocked CMOS inverter 190c inverts data transmitted through a transfer gate 192. The clocked CMOS inverter 190d inverts an output signal of the clocked CMOS inverter 190c for transmission to an input part of the clocked CMOS inverter 190c.

In the structure shown in FIG. 44, the clocked CMOS inverters 190c and 190d are in output high impedance states when the transfer gate 192 conducts in response to activation of the transfer control signal φSWa. When the transfer gate 192 is brought into a non-conducting state after the potential of the input part of the clocked CMOS inverter 190c is changed by data supplied from a precedent stage circuit (a latch circuit or a preamplifier), the clocked CMOS inverters 190c and 190d function as latches, for reliably holding supplied data. Therefore, the latch circuit 190 can reliably latch data after completion of data transfer. External read data can be generated and outputted in accordance with stably transmitted memory cell data by applying the structure of continuously latching data after the completion of the data transfer to a latch circuit provided in an output buffer circuit. In transfer of data latched by the latch circuit to a subsequent stage, further, the latch data can be transferred to the subsequent stage circuit at a high speed by the driving capability of the inverters.

[Modification 2]

Figure 45:
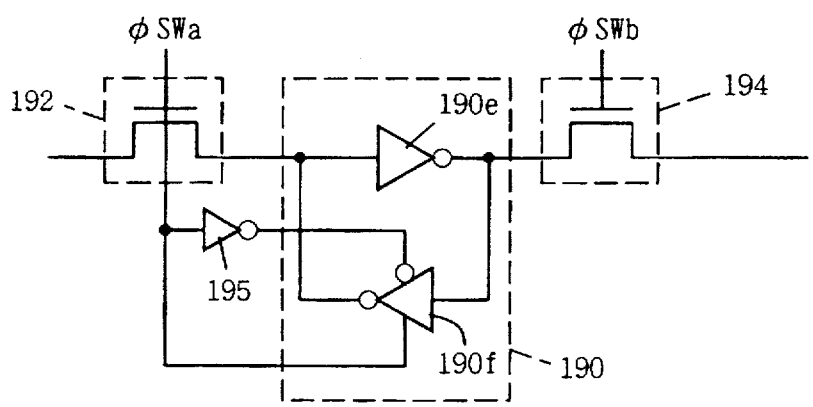
FIG. 45 schematically illustrates the structure of a modification 2 of the embodiment 4 according to the present invention.

FIG. 45 illustrates the structure of a modification 2 of the embodiment 4 according to the present invention. In the structure shown in FIG. 45, a latch circuit 190 includes a CMOS inverter 190e for inverting data transmitted through a transfer gate 192, and a clocked CMOS inverter 190f which is activated in activation of a transfer control signal φSWa for inverting an output signal of the inverter 190e for transmission to an input part of the inverter 190e.

In the structure shown in FIG. 45, the clocked CMOS inverter 190f is activated only when data is transmitted through the transfer gate 192, and brought into an output high impedance state when the data transfer operation through the transfer gate 192 is completed. When the data transfer is completed, the inverter 190e holds the data of the latch circuit 190 (a transfer gate 194 is in a non-conducting state). Therefore, data transmitted through the transfer gate 192 can be latched at a high speed and the latch data of the latch circuit 190 can be brought into a definite state quickly by making the latch circuit 190 perform a latch operation only when the data is transmitted through the transfer gate 192. When the clocked CMOS inverter 190f is brought into an output high impedance state, the transfer gate 194 is still in a non-conducting state, and the inverter 190e correctly holds the latch data.

In each of the structures shown in FIGS. 43 to 45, the transfer gate 194 is provided on the stage subsequent to the latch circuit 190. When this latch circuit 190 is employed as a final stage read data register in an output buffer circuit, the transfer gate 194 is not provided, as a matter of course.

In the structure shown in FIG. 45, the clocked CMOS inverter 190f may be activated in inactivation of the transfer control signal φSWa. In this structure, data is amplified and transmitted by the inverter 190e, and the clocked CMOS inverter 190f is activated and the data is latched after data transfer through the transfer gate 192 is completed. Also in this structure, data transmitted through the transfer gate 192 is amplified and latched by the inverter 190e at a high speed, the latch data is brought into a definite state quickly, and reliably latched up to transfer to the subsequent stage.

Figure 46A:
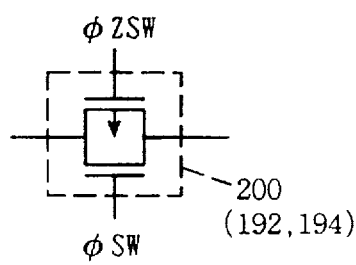
FIGS. 46A and 46B illustrate the structures of transfer gates employed in the present invention.
Figure 46B:
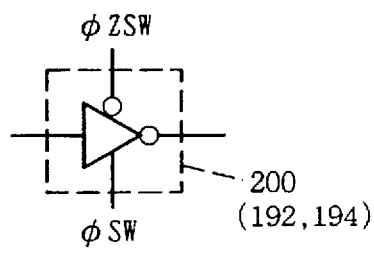
Figure 47:
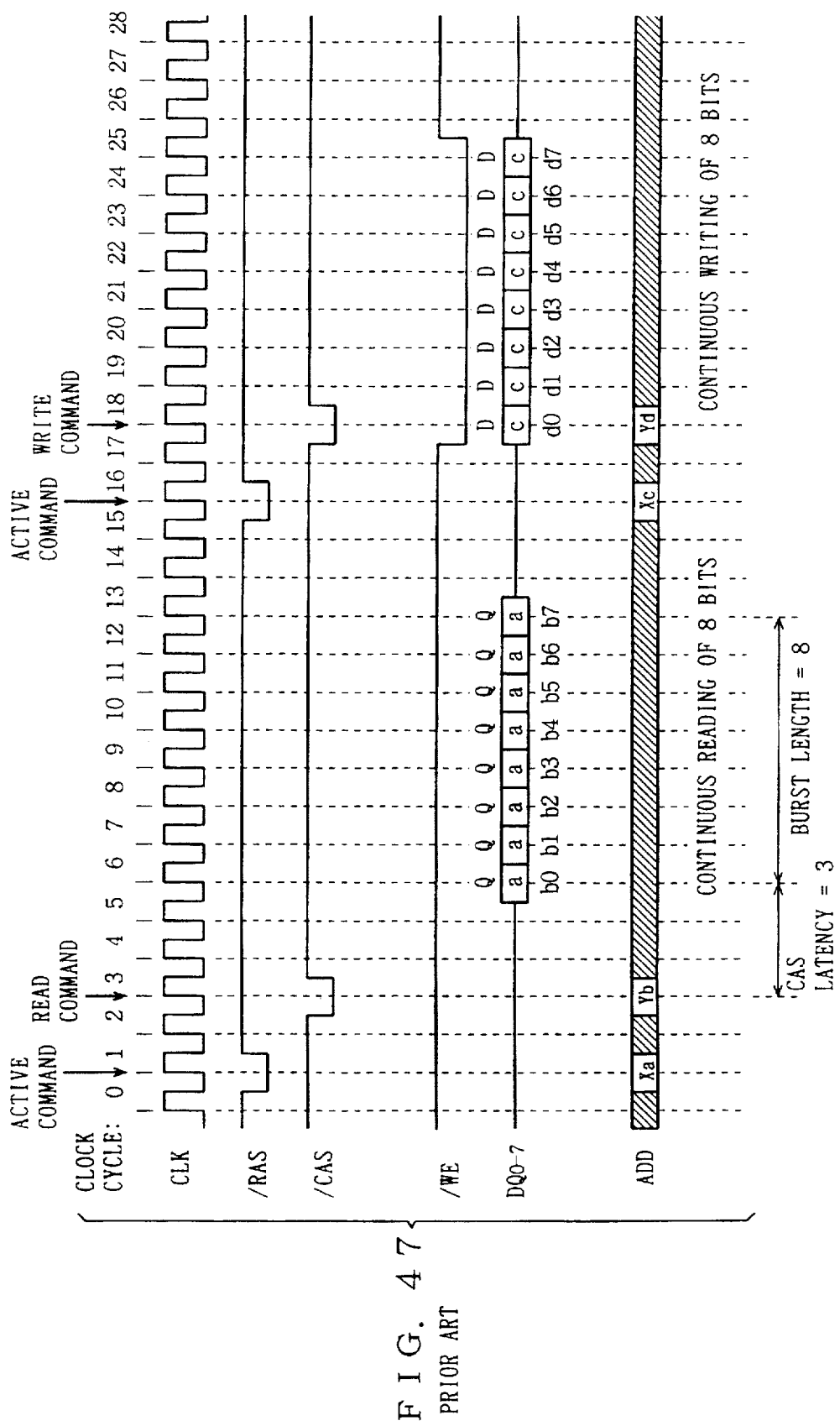
FIG. 47 is a timing chart representing a data read/write operation of a conventional SDRAM.
Figure 48:
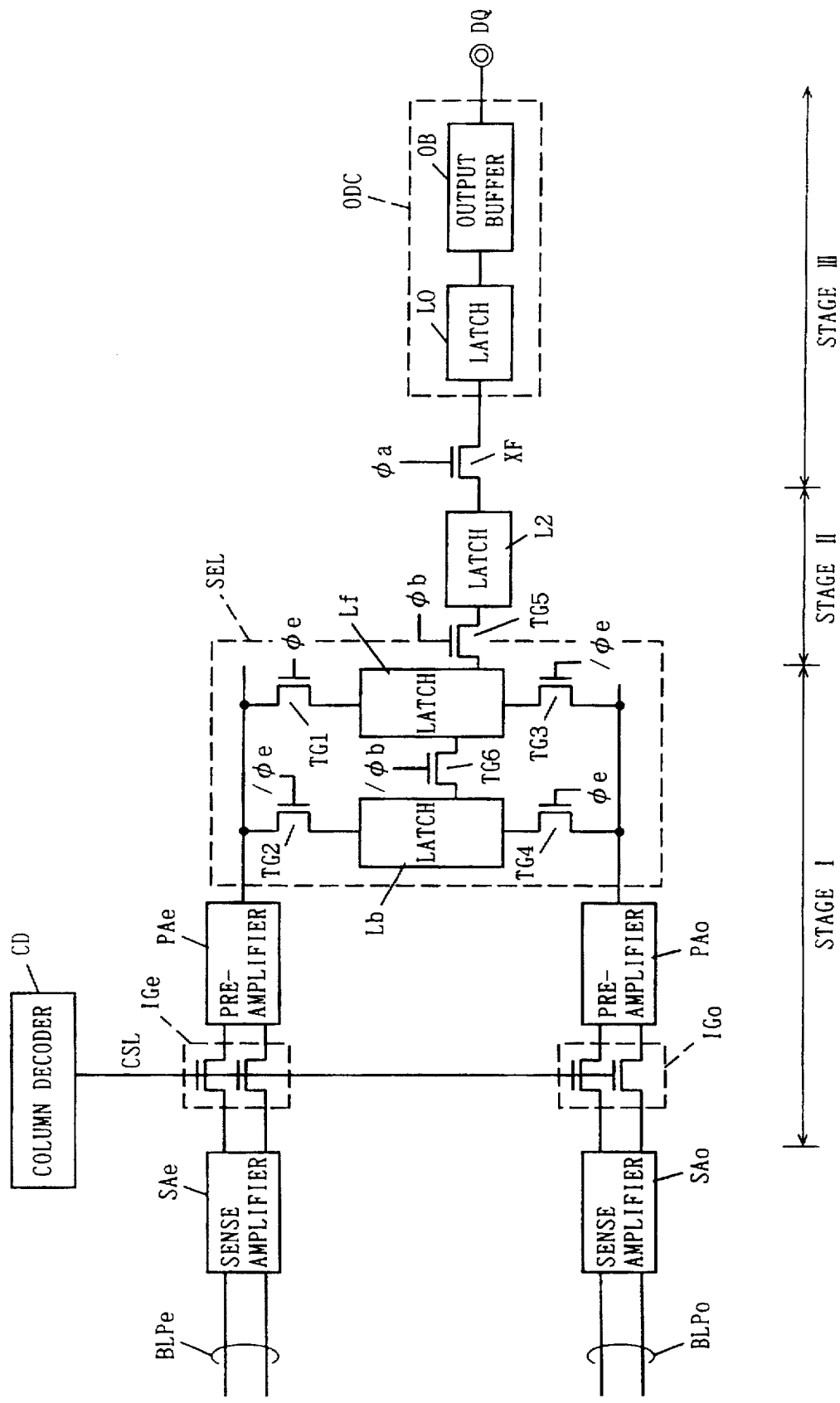
FIG. 48 schematically illustrates the structure of a data read part of the conventional SDRAM.
Figure 49:
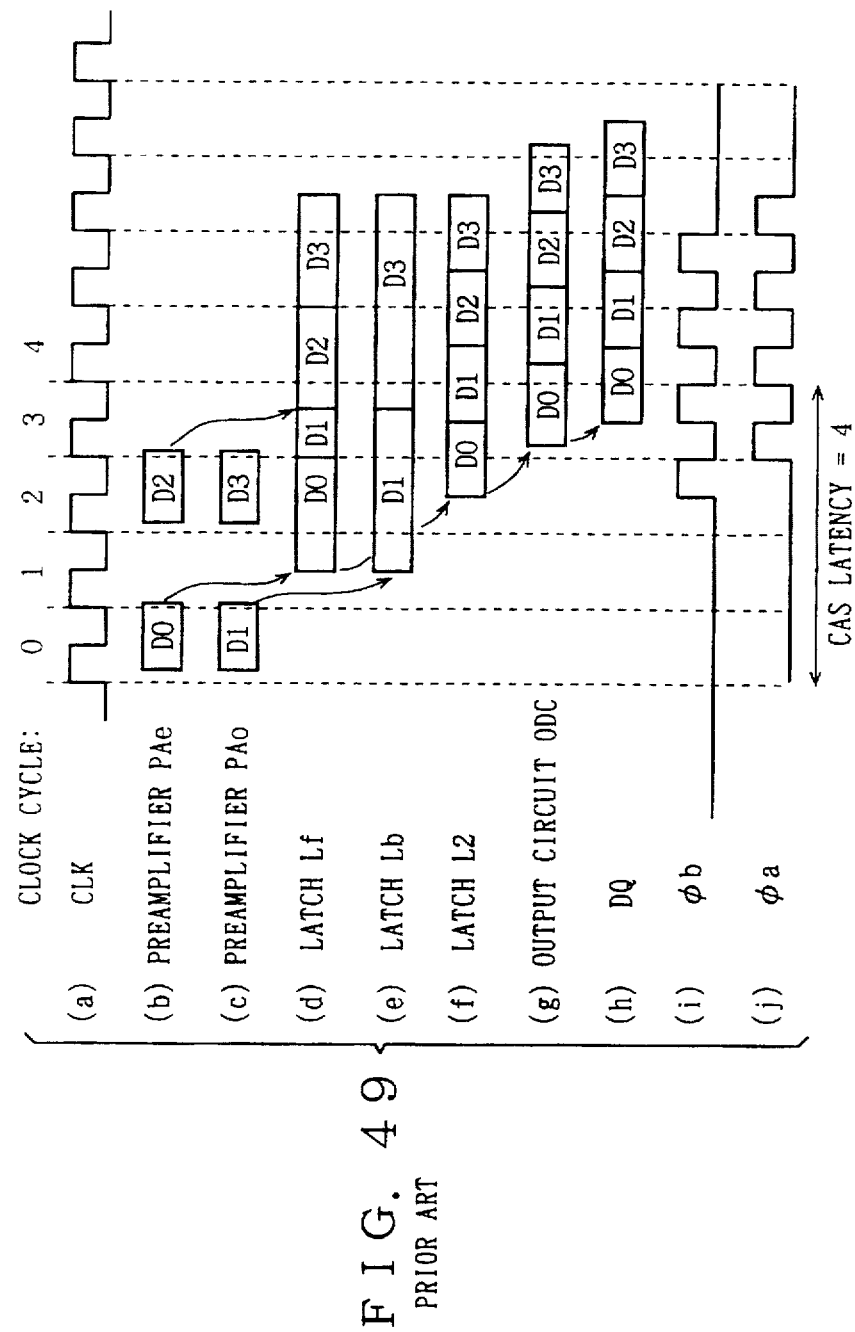
FIG. 49 is a timing chart showing a data read operation of the SDRAM shown in FIG. 48.
Figure 50:
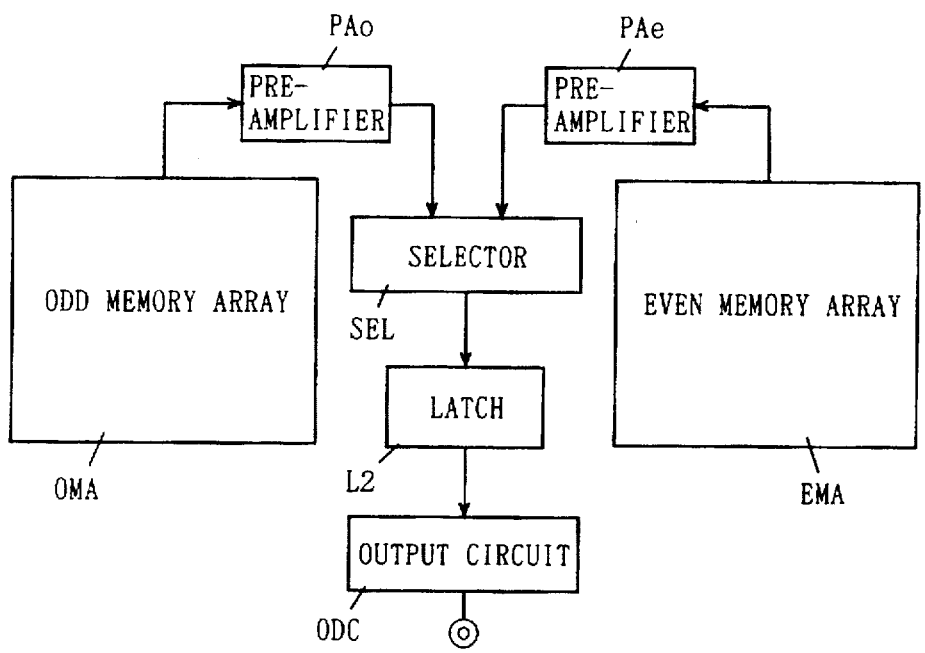
FIG. 50 schematically illustrates the arrangement of memory arrays of the conventional SDRAM.
Figure 51:
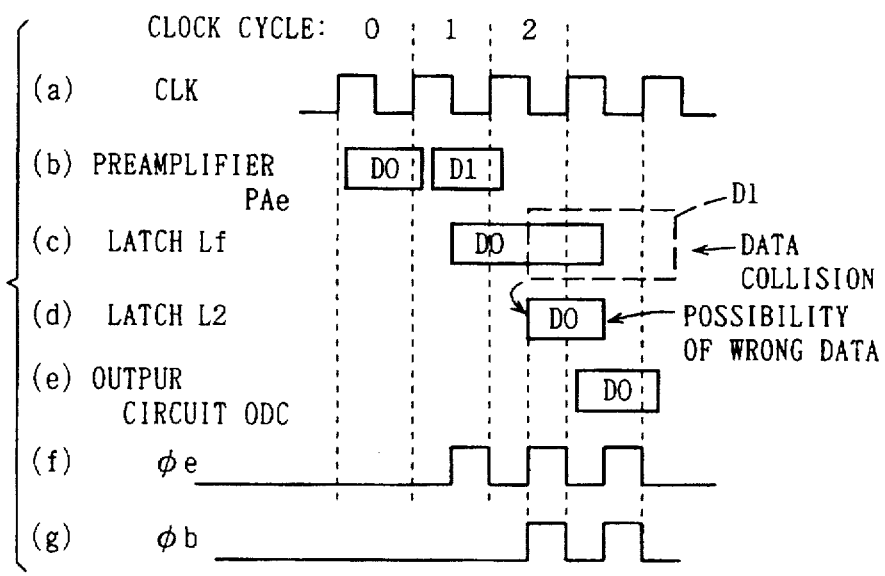
FIG. 51 illustrates a problem of the arrangement shown in FIG. 50.
Figure 52:
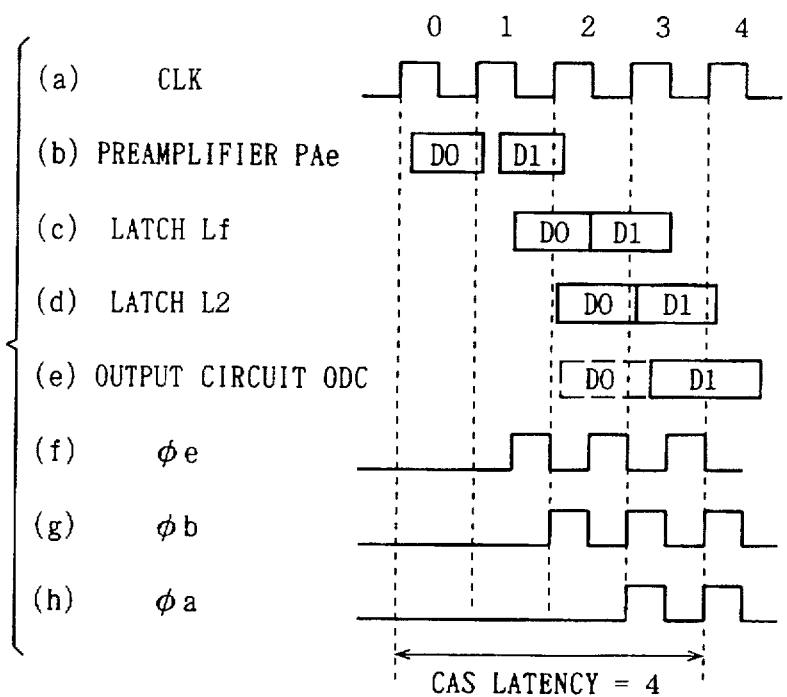
FIG. 52 illustrates another problem of the arrangement shown in FIG. 50.

FIGS. 46A and 46B illustrate the structures of modifications of the transfer gates 192 and 194. As shown in FIG. 46A, a transfer gate 200 (192 or 194) is formed by a CMOS transmission gate which conducts in response to a transfer control signal φSW and an inverted signal φZSW thereof. Data can be transmitted with no signal transmission loss by employing this CMOS transmission gate as the transfer gate 200.

In the structure shown in FIG. 46B, a transfer gate 200 (192 or 194) includes a clocked CMOS inverter which is activated in activation of a transfer control signal φSW and an inverted signal φZSW thereof. As shown in FIG. 46B, an output load of the transfer gate 200 can be driven at a high speed and data can be transmitted at a high speed by utilizing the clocked CMOS inverter as the transfer gate The structures shown in FIGS. 43 to 46B are appropriately combined with each other in accordance with positions of transfer gates and latch circuits.

The above description has been made with reference to a clock synchronous semiconductor memory device for incorporating external control signals and address signals in synchronization with rise of a clock signal and inputting/outputting data also in synchronization with the clock signal. However, the present invention is also applicable to another type of memory in which internal data is read and transferred in synchronization with a clock signal.

According to the present invention, as herein above described, data read from a preamplifier are successively transferred by alternately activating two data transfer paths, whereby the data can be transferred every clock cycle, and high-speed data transfer is enabled.

When the present invention is applied to a clock synchronous semiconductor memory device, data can be transferred with no data collision in each clock cycle also when the CAS latency is 4, whereby high-speed data transfer is enabled. Further, data can be reliably outputted at a high speed in accordance with the CAS latency even if the number of banks is increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of banks each including a plurality of memory cells and being driven to active and inactive states independently of each other;
   a plurality of preamplifier means provided in correspondence to said plurality of banks respectively, each for amplifying data of a selected memory cell of a corresponding bank when activated;
   a plurality of read register means provided in correspondence to said plurality of preamplifier means respectively for holding data of corresponding preamplifier means, each of said plurality of read register means including a plurality of parallel latch means provided in parallel for sequentially latching output data of the corresponding preamplifier means in response to activation of said corresponding preamplifier means;

a plurality of transfer means provided in correspondence to said plurality of read register means respectively for successively selecting and transferring data being latched by corresponding read register means in response to activation of said corresponding preamplifier means respectively; and output means for selecting data transferred by a transfer means specified by a bank specifying signal, among said plurality of transfer means and externally outputting said data in response to said bank specifying signal.

2. The semiconductor memory device in accordance with claim 1, wherein said output means comprises:

a data latch provided in common to said plurality of banks for selecting, incorporating and latching output data of the transfer means provided in correspondence to the bank specified in accordance with said bank specifying signal among said plurality of banks, and an output buffer circuit for latching the data from said data latch for external outputting.

3. The semiconductor memory device in accordance with claim 1, wherein said output means outputs selected memory cell data in synchronization with a clock signal repetitively supplied from an exterior of the semiconductor memory device, and each of said plurality of transfer means includes:
means for transferring data stored in corresponding read register means in a delay by one clock cycle of said clock signal in response to activation of corresponding preamplifier means.

4. The semiconductor memory device in accordance with claim 2, wherein said output means outputs selected memory cell data externally in synchronization with a clock signal, and said output buffer circuit includes:
means for incorporating, latching and outputting data supplied from said data latch after one clock cycle of said clock signal after a data latch operation of said data latch.

5. The semiconductor memory device in accordance with claim 1, wherein each of said plurality of read register means comprises first and second transfer latches provided in parallel with each other with respect to a corresponding preamplifier means for alternately incorporating and latching supplied data in response to activation of said corresponding preamplifier means.

6. The semiconductor memory device in accordance with claim 5, wherein each of said plurality of transfer means includes first and second transfer circuits provided in parallel with each other in correspondence to said first and second transfer latches for transferring latch data of said first and second transfer latches in a sequence reverse to that in data incorporating operations of said first and second transfer latches.

7. The semiconductor memory device in accordance with claim 1, wherein said semiconductor memory device externally outputs data in synchronization with a clock signal repetitively supplied externally, and further comprises means for setting one of said plurality of parallel latch means included in said read register means provided in a read register means out of said plurality of read register means provided in correspondence to activated preamplifier means in a through state for passing supplied data as is while stopping data incorporation and latch operations of remaining latch means in accordance with CAS latency data indicating the cycle number of said clock signal from supply of a data read instruction signal to output of valid data to an exterior of said semiconductor memory device.

8. The semiconductor memory device in accordance with claim 7, further comprising means for deciding activation timing for said plurality of transfer means and said output means in accordance with said CAS latency data.

9. The semiconductor memory device in accordance with claim 1, wherein each of said plurality of preamplifier means includes means for generating data complementary to each other and transferring the same to corresponding read register means when activated.

10. The semiconductor memory device in accordance with claim 1, wherein each said latch means of each of said plurality of read register means includes a clocked inverter selectively entering an output high impedance state in response to activation of a corresponding preamplifier means.

11. The semiconductor memory device in accordance with claim 1, wherein each said transfer means includes means for transmitting data complementary to each other.

12. The semiconductor memory device in accordance with claim 1, further comprising means provided on an output node of each said transfer means for initializing said output node at a prescribed potential in response to completion of data transfer of corresponding transfer means.

13. The semiconductor memory device in accordance with claim 2, further comprising means for initializing an input node of said data latch in said output means at a prescribed potential in response to completion of data transfer from said data latch to said output buffer circuit.

14. The semiconductor memory device in accordance with claim 1, further comprising means for initializing an input node of each of the parallel latch means to a predetermined potential in response to completion of data transfer by corresponding transfer means.

15. The semiconductor memory device in accordance with claim 1, further comprising:

a plurality of decoders provided on said plurality of banks respectively for selecting addressed memory cells of corresponding memory banks in accordance with address signals supplied when activated, means provided in common to said plurality of banks for generating a decoder enable signal in response to an access instruction signal, and a plurality of decoder enable means provided in correspondence to said plurality of decoders respectively for activating corresponding decoders in response to said decoder enable signal and said bank specifying signal.

16. The semiconductor memory device in accordance with claim 15, wherein each of said plurality of banks includes a plurality of internal data buses, and each of said plurality of preamplifier means includes a plurality of preamplifiers provided for each of said plurality of internal data buses of a corresponding one of the banks and activated in accordance with a bus selection signal supplied from a corresponding one of the decoders.

17. The semiconductor memory device in accordance with claim 9, wherein said transfer means includes means for transmitting data complementary to each other.

* * * * *